United States Patent
King et al.

(10) Patent No.: US 9,790,770 B2
(45) Date of Patent: Oct. 17, 2017

(54) DETERMINING PERFORMANCE DATA FOR HYDROCARBON RESERVOIRS USING DIFFUSIVE TIME OF FLIGHT AS THE SPATIAL COORDINATE

(71) Applicant: THE TEXAS A&M UNIVERSITY SYSTEM, College Station, TX (US)

(72) Inventors: Michael J. King, Bryan, TX (US); Akhil Datta-Gupta, College Station, TX (US); Yanbin Zhang, Houston, TX (US)

(73) Assignee: THE TEXAS A&M UNIVERSITY SYSTEM, College Station, TX (US)

( * ) Notice: Subject to any disclaimer, the term of this patent is extended or adjusted under 35 U.S.C. 154(b) by 530 days.

(21) Appl. No.: 14/325,491

(22) Filed: Jul. 8, 2014

(65) Prior Publication Data

US 2015/0120255 A1    Apr. 30, 2015

Related U.S. Application Data

(60) Provisional application No. 61/897,589, filed on Oct. 30, 2013.

(51) Int. Cl.
*G06F 17/50* (2006.01)
*E21B 43/00* (2006.01)

(52) U.S. Cl.
CPC .......... *E21B 43/00* (2013.01); *G06F 17/5009* (2013.01)

(58) Field of Classification Search
USPC ................................ 703/2, 10, 12; 382/107
See application file for complete search history.

(56) References Cited

U.S. PATENT DOCUMENTS

| | | | |
|---|---|---|---|
| 7,565,243 B2 | 7/2009 | Kim et al. | |
| 7,584,086 B2 | 9/2009 | Frankel | |
| 8,131,526 B2 | 3/2012 | Neville | |
| 8,504,300 B2 | 8/2013 | Dorn et al. | |
| 8,619,499 B2 | 12/2013 | Maucec et al. | |
| 8,630,831 B2 | 1/2014 | Bratvedt et al. | |

(Continued)

OTHER PUBLICATIONS

Agarwal, R. G. "Direct Method of Estimating Average Reservoir Pressure for Flowing Oil and Gas Wells" (2010), SPE Annual Technical Conference and Exhibition, Society of Petroleum ENgineers, Florence, Italy, doi:10.2118/135804-MS.

(Continued)

*Primary Examiner* — Thai Phan
(74) *Attorney, Agent, or Firm* — Edwin S. Flores; Daniel J. Chalker; Chalker Flores, LLP

(57) ABSTRACT

The present disclosure provides a technique for determining performance data for hydrocarbon reservoirs using data storage, an output device and one or more processors. A heterogeneous multi-dimensional model of at least a portion of the hydrocarbon reservoir divided into cells is obtained. Each cell has a volume and one or more other attributes. A diffusive time of flight is calculated based upon the heterogeneous multi-dimensional model. The heterogeneous multi-dimensional model is transformed to an equivalent homogeneous one-dimensional model by defining the diffusive time of flight as a spatial variable. The performance data for the hydrocarbon reservoir is determined based on the equivalent homogeneous one-dimensional model, and the performance data is provided to the output device.

77 Claims, 53 Drawing Sheets

History matching workflow with GA

(56) References Cited

U.S. PATENT DOCUMENTS

| | | | |
|---|---|---|---|
| 2011/0115787 A1* | 5/2011 | Kadlec | G01V 1/345 345/419 |
| 2012/0158389 A1 | 6/2012 | Wu et al. | |
| 2012/0215513 A1 | 8/2012 | Branets et al. | |

OTHER PUBLICATIONS

Akkutlu, et al. "Multiscale Gas Transport in Shales with Local Kerogen Heterogeneities" (2012), SPE Journal, 17(4), pp. 1002-1011, doi:10.2118/146422-PA.

Alton, et al. "Fast Marching Methods for Stationary Hamilton-Jacobi Equations with Axis-Aligned Anistropy" (published electronically Nov. 26, 2008), SIAM Journal on Numerical Analysis, 47(1), 363-385, doi:10.1137/070680357.

Bourdet, et al. "Use of Pressure Derivative in Well Test Interpretation" (Jun. 1989), SPE Formation Evaluation, 4(2), 293-302, doi:10.2118/12777-PA.

Bravo, M. C. "Effect of transition from slip to free molecular flow on gas transport in porous media" (2007), Journal of Applied Physics, 102(7), 074905, doi:10. 1063/1.2786613.

Cipolla, et al. "Reservoir Modeling in Shale-Gas Reservoirs" (2009), SPE Eastern Regional Meeting, Society of Petroleum Engineers, Charleston, West Virginia, USA, Sep. 23-25, 2009, doi:10.2118/125530-MS.

Cipolla, et al. "New Algorithms and Integrated Workflow for Tight Gas and Shale Completions" (2011), SPE Annual Technical Conference and Exhibition, Society of Petroleum Engineers, Denver, Colorado, USA, doi:10.2118/146872-MS.

Cipolla, et al. "Integrating Microseismic Mapping and Complex Fracture Modeling to Characterize Fracture Complexity" (2011), SPE Hydraulic Fracturing Technology Conference, Society of Petroleum Engineers, The Woodlands, Texas, USA, Jan. 24-26, 2011. doi:10.2118/140185-MS.

Cipolla, et al. "Engineering Guide to the Application of Microseismic Interpretations" (2012), SPE Hydraulic Fracturing Technology Conference, Society of Petroleum Engineers, The Woodlands, Texas, USA, Feb. 6-8, 2012, doi:10.2118/152165-MS.

Clarkson, et al. "Production Analysis of Tight-Gas and Shale-Gas Reservoirs Using the Dynamic-Slippage Concept" (Mar. 2012), SPE Journal, 17(1), pp. 230-242, doi:10.2118/144317-PA.

Darlow, et al. "Mixed Finite Element Method for Miscible Displacement Problems in Porous Media" (Aug. 1984), SPE Journal, 24(4), 391-398, doi:10.2118/10501-PA.

Datta-Gupta, et al. "Radius of Investigation and its Generalization to Unconventional Reservoirs" (Jul. 2011), JPT, 63(7), pp. 52-55.

Dijkstra, E. W. "A Note on Two Problems in Connection with Graphs" (1959), Numerische Mathematik, 1:269-271.

Fan, et al. "Understanding Gas Production Mechanism and Effectiveness of Well Stimulation in the Haynesville Shale Through Reservoir Simulation" (2010), Canadian Unconventional Resources and International Petroleum Conference, Society of Petroleum Engineers, Calgary, Alberta, Canada, doi:10.2118/136696-MS.

Fathi, et al. "Lattice Boltzmann Method for Simulation of Shale Gas Transport in Kerogen" (Feb. 2013), SPE Journal, 18(1), pp. 27-37, doi:10.2118/146821-PA.

Fetkovich, M. "Decline Curve Analysis Using Type Curves" (Jun. 1980), Journal of Petroleum Technology, 32(6), 1065-1077, doi:10.2118/4629-PA.

Freeman, et al. "A Numerical Study of Transport and Storage Effects for Tight and Shale Gas Reservoir Systems" (2010), International Oil and Gas Conference and Exhibition in China, Society of Petroleum Engineers, Beijing, China, Jun. 8-10, 2010, doi:10.2118/131583-MS.

Gupta, N. "A Novel Approach for Rapid Estimation of Drainage Volume, Pressure and Well Rates" (Dec. 2012), Master's Thesis, Texas A&M University.

Ilk, et al. "Production Analysis and Well Performance Forecasting of Tight Gas and Shale Gas Wells" (2010), SPE Eastern Regional Meeting, Society of Petroleum Engineers, Morgantown, West Virginia, USA, Oct. 12-14, 2010, doi:10.2118/139118-MS.

Javadpour, et al. "Nanoscale Gas Flow in Shale Gas Sediments" (Oct. 2007), Journal of Canadian Petroleum Technology, 46(10), doi:10.2118/07-10-06.

Javadpour, F. "Nanopores and Apparent Permeability of Gas Flow in Mudrocks (Shales and Siltstone)" (2009), Journal of Canadian Petroleum Technology, 48(8), 16-21, doi:10.2118/09-08-16-DA.

Kim, et al. "Calibration of High-Resolution Reservoir Models Using Transient Pressure Data" (2009), SPE Annual Technical Conference and Exhibition, Society of Petroleum Engineers, New Orleans, Louisiana, usa, Oct. 4-7, 2009, doi:10.2118/124834-MS.

Kim, et al. "Gas Flow Tightly Coupled to Elastoplastic Geomechanics for Tight and Shale Gas Reservoirs: Material Failure and Enhanced Permeability" (2012), SPE Americas Unconventional Resources Conference, Society of Petroleum Engineers, Pittsburgh, Pennsylvania USA, Jun. 5-7, 2012, doi:10.2118/155640-MS.

King, et al. "Reservoir Modeling: From RESCUE to RESQML" (Apr. 2012), SPE Reservoir Evaluation & Engineering, 15(2), 127-138, doi:10.2118/135280-PA.

Klinkenberg, L. J. "The Permeability of Porous Media to Liquids and Gases" (1941), in Drilling and Production Practice, pp. 200-213, American Petroleum Institute.

Konukoglu, et al. "A Recursive Anisotropic Fast Marching Approach to Reaction Diffusion Equation: Application to Tumor Growth Modeling" (2007), Proceedings of the 20th international conference on Information processing in medical imaging, IPMI'07, pp. 687-699, Springer-Verlag, Berlin, Heidelberg.

Langmuir, I. "The Constitution and Fundamental Properties of Solids and Liquids. Part I. Solids." (Sep. 15, 1916), Journal of the American Chemical Society, 38(11), 2221-2295, doi:10.1021/ja02268a002.

Nordbotten, et al. "Analytical solutions for leakage rates through abandoned wells" (published Apr. 6, 2004), Water Resour. Res., 40(4), W04, 204.

Qian, et al. "A Fast Sweeping Method for Static Convex Hamilton-Jacobi Equations" (May 2007), Journal of Scientific Computing, 31, 237-271, 10.1007/s10915-006-9124-6.

Sethian, J. A. "A fast marching level set method for monotonically advancing fronts", (Feb. 1996), Proceedings of the National Academy of Sciences, 93(4), 1591-1595.

Sethian, J. A. "Fast Marching Methods*" (1999), SIAM Review, 41(2), 199-235.

Sethian, et al. "Fast methods for the Eikonal and related Hamilton-Jacobi equations on unstructured meshes" (May 23, 2000), Proceedings of the National Academy of Sciences, 97(11), 5699-5703, doi:10.1073/pnas.090060097.

Shabro, et al. "Numerical Simulation of Shale-Gas Production: from Pore-Scale Modeling of Slip-Flow, Knudsen Diffusion, and Langmuir Desorption to Reservoir Modeling of Compressible Fluid" (2011), North American Unconventional Gas Conference and Exhibition, Society of Petroleum Engineers, The Woodlands, Texas, USA, Jun. 14-16, 2011, doi:10.2118/144355-MS.

Shabro, et al. "Forecasting Gas Production in Organic Shale with the Combined Numerical Simulation of Gas Diffusion in Kerogen, Langmuir Desorption from Kerogen Surfaces, and Advection in Nanopores" (2012), in SPE Annual Technical Conference and Exhibition, Society of Petroleum Engineers, San Antonio, Texas, USA, Oct. 8-10, 2012, doi:10.2118/159250-MS.

Song, et al. "Rate-Normalized Pressure Analysis for Determination of Shale Gas Well Performance" (2011), in North American Unconventional Gas Conference and Exhibition, Society of Petroleum Engineers, The Woodlands, Texas, USA, Jun. 14-16, 2011, doi:10.2118/144031-MS.

Swami, et al. "A Pore Scale Gas Flow Model for Shale Gas Reservoir" (2012), in SPE Americas Unconventional Resources Conference, Society of Petroleum Engineers, Pittsburgh, Pennsylvania USA, Jun. 5-7, 2012, doi:10.2118/155756-MS.

Valko, et al. "A Better Way to Forecast Production From Unconventional Gas Wells" (2010), in SPE Annual Technical Conference and Exhibition, Society of Petroleum Engineers, Florence, Italy, Sep. 19-22, 2010, doi:10.2118/134231-MS.

(56) References Cited

OTHER PUBLICATIONS

Vasco, et al. "Estimation of reservoir properties using transient pressure data: An asymptotic approach" (Dec. 2000), Water Resour. Res., 36(12), 3447-3465.
Virieux, et al. "Asymptotic theory for diffusive electromagnetic imaging" Geophysical Journal International, (1994),119(3), 857-868, doi: 10.1111/j.1365-246X.1994.tb04022.x.
Kulkarni, et al. "A Streamline Approach for Integrating Transient Pressure Data into High Resolution Reservoir models," in SPE European Petroleum Conference, Society of Petroleum Engineers Inc., Paris, France, doi:10.2118/65120-MS.
Sethian, et al. "Ordered upwind methods for static hamilton-jacobi equations", Proceedings of the National Academy of Sciences, (Sep. 25, 2001), 98(20), 11,069-11,074, doi:10.1073/pnas.201222998.

\* cited by examiner

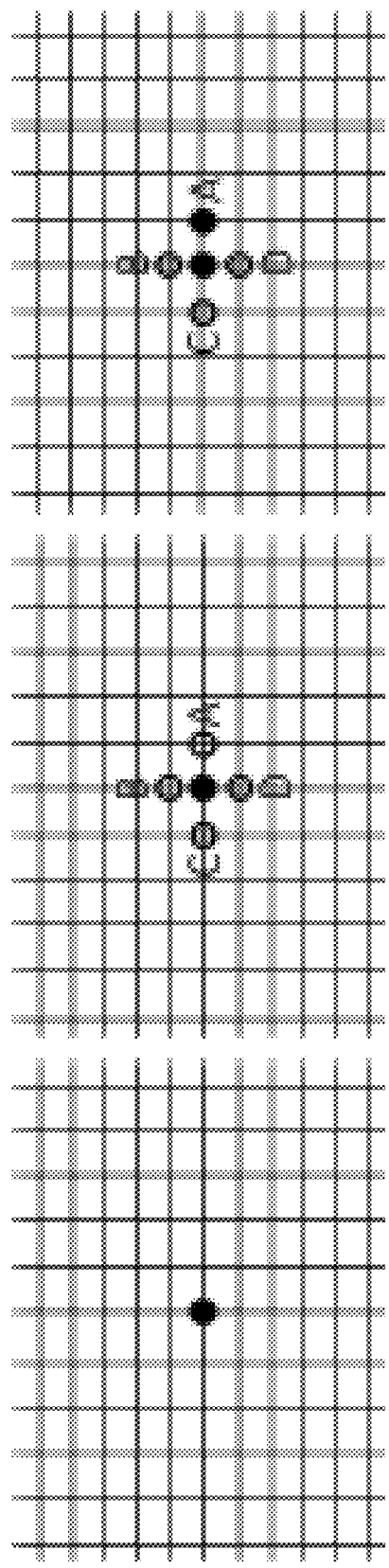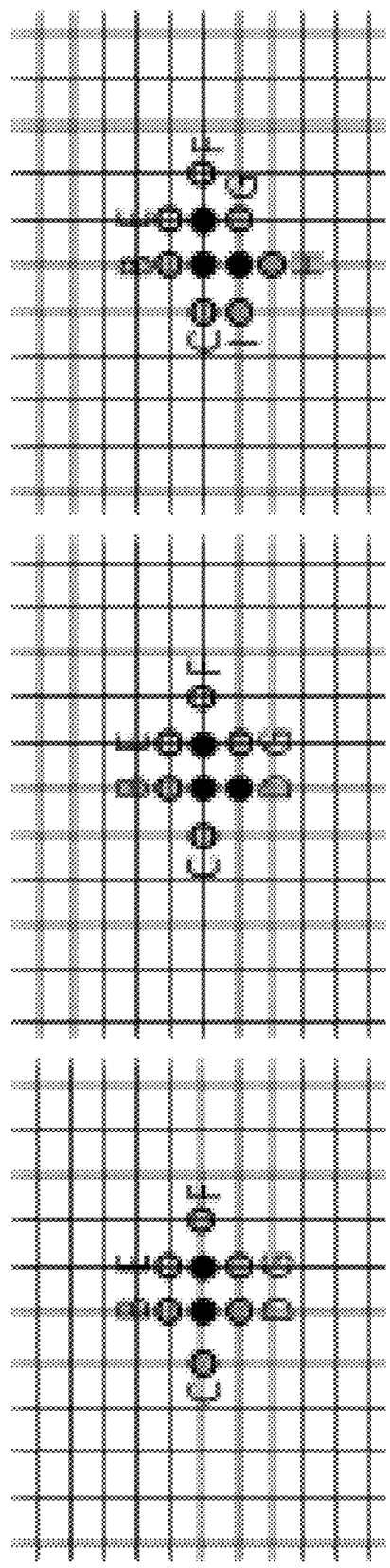
FIG. 3A  FIG. 3B  FIG. 3C  FIG. 3D  FIG. 3E  FIG. 3F

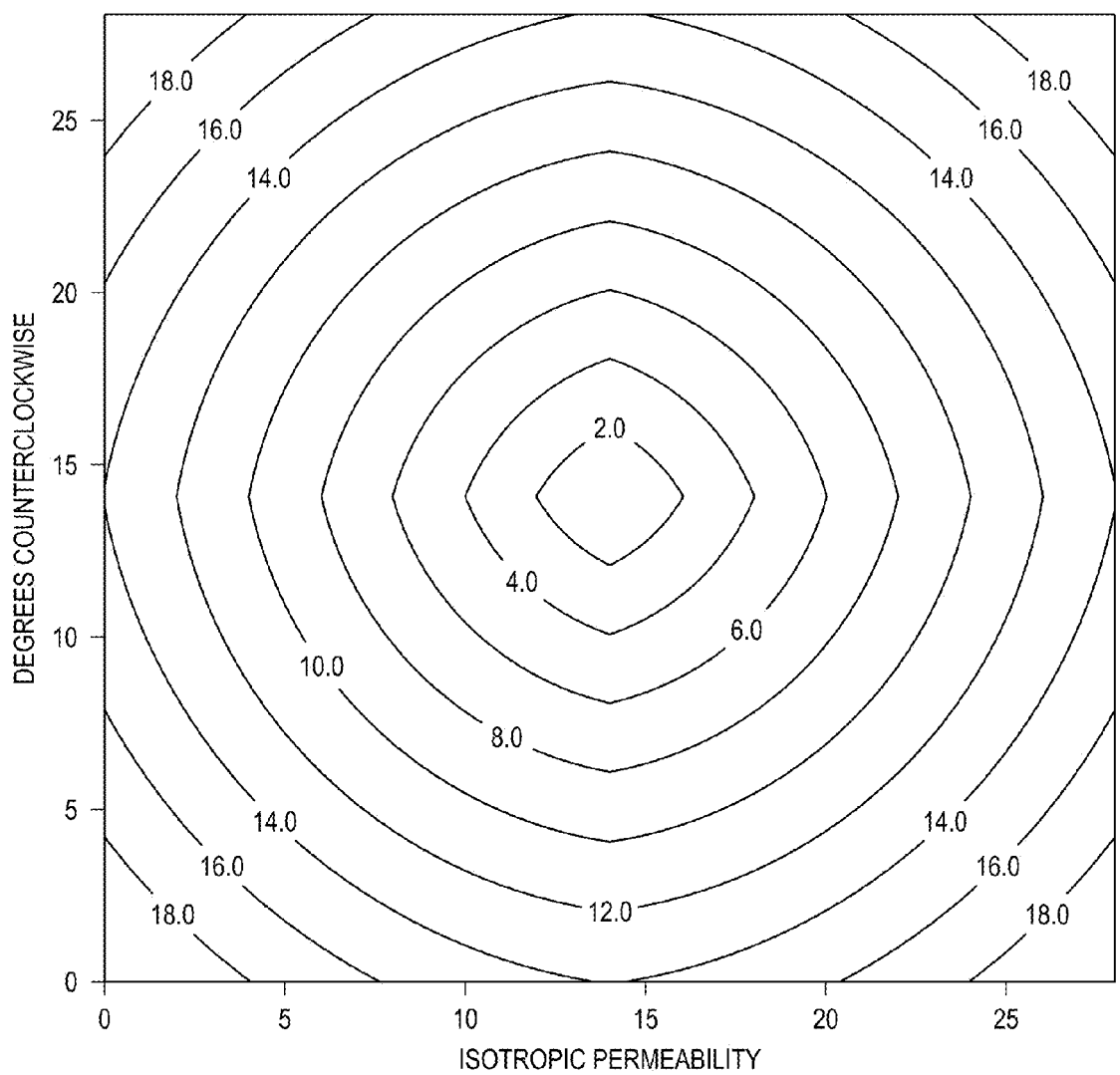

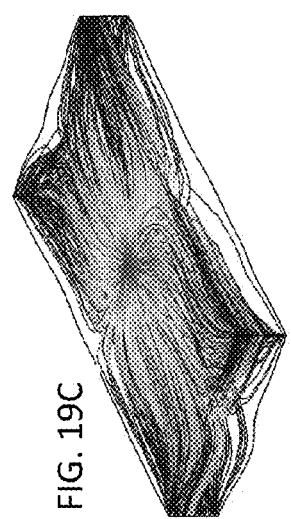
FIG. 19C
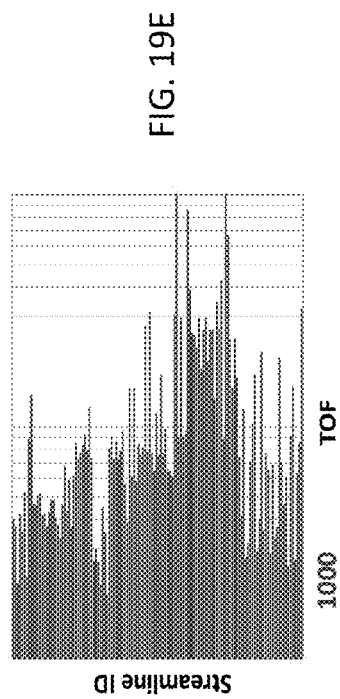
FIG. 19E
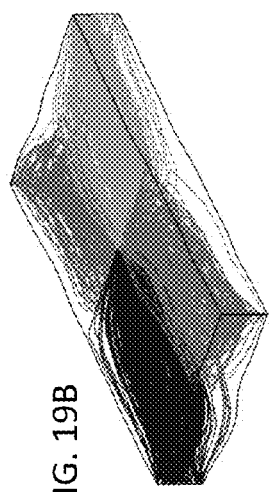
FIG. 19B
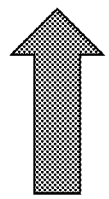
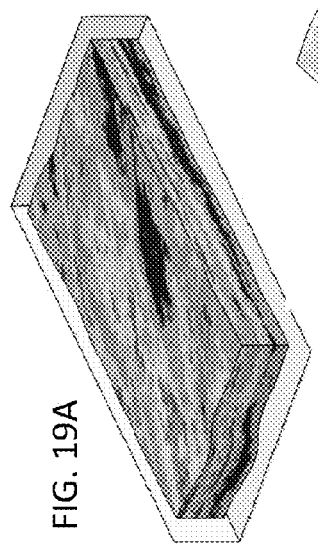
FIG. 19A
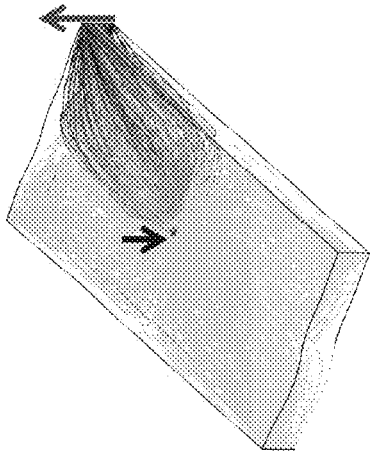
FIG. 19D 2-D Areal: Homogeneous Case $$\tau = \frac{r}{\sqrt{\alpha}}$$

$$\frac{1}{r}\frac{\partial}{\partial r}\left(r\frac{\partial P}{\partial r}\right) = \frac{\phi \mu c_t}{k}\frac{\partial P}{\partial t}$$

$r \rightarrow \tau$

2D Areal: Heterogeneous Case $$\frac{\partial}{\partial \tau}\left(w(\tau)\frac{\partial P}{\partial \tau}\right) = w(\tau)\frac{\partial P}{\partial t}$$

$\tau$ CONTOUR: HOMOGENEOUS $\quad \tau = \dfrac{r}{\sqrt{\alpha}}$

Relative permeability

DFN Network

Fracture Permeability kx ky kz

Fracture Porosity

Permeability field (mD) in log scale $k_m \in [10^{-4}, 10^{-2}]$ mD

Histogram of log10(k)

Log10 Perm (mD)

time = 100 days time = 1,500 days

Onset of Drainage Volume Interference time = 10 days time = 1,000 day

FIG. 51A

Late Linear Flow time = 2,000 days

FIG. 51B

Finite Width time = 4,500 days

FIG. 51C time = 10,000 days

FIG. 51D time = 14,428.5 days

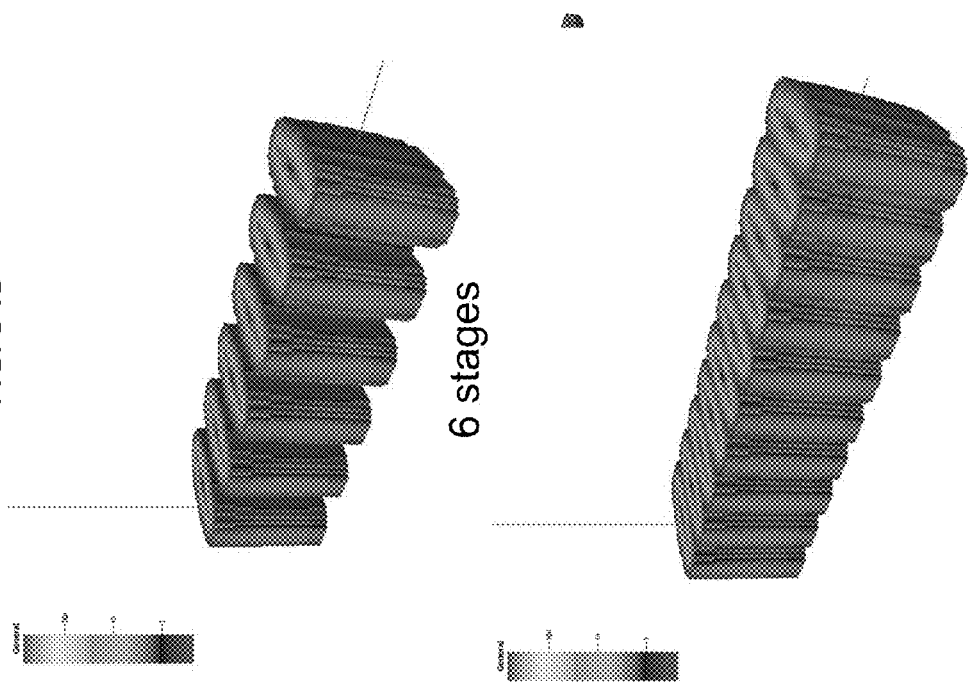
FIG. 54A — 4 stages
FIG. 54B — 6 stages
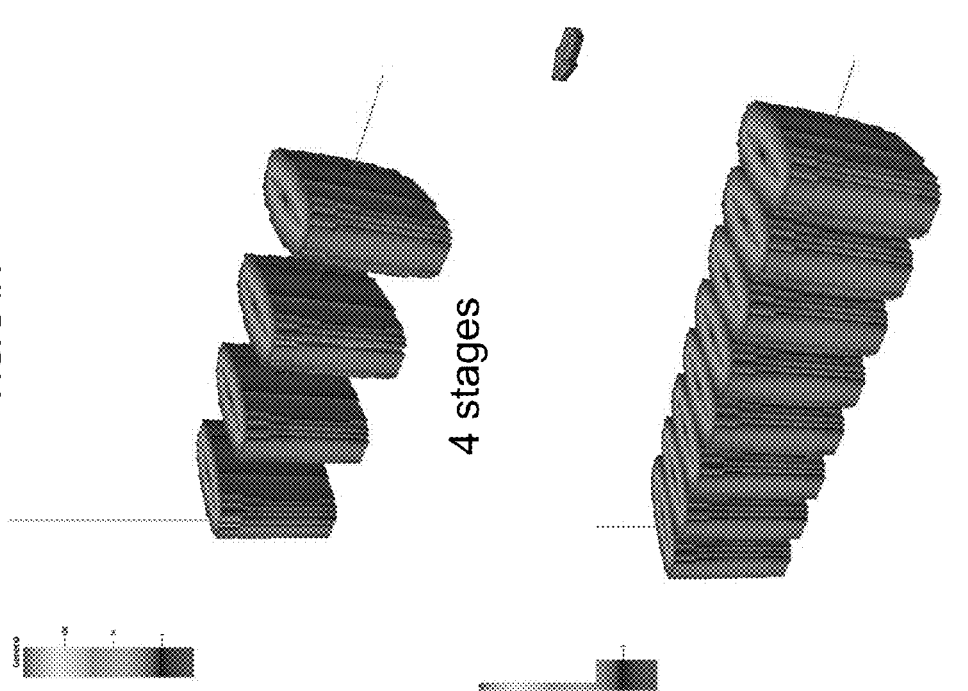
FIG. 54C — 8 stages
FIG. 54D — 10 stages

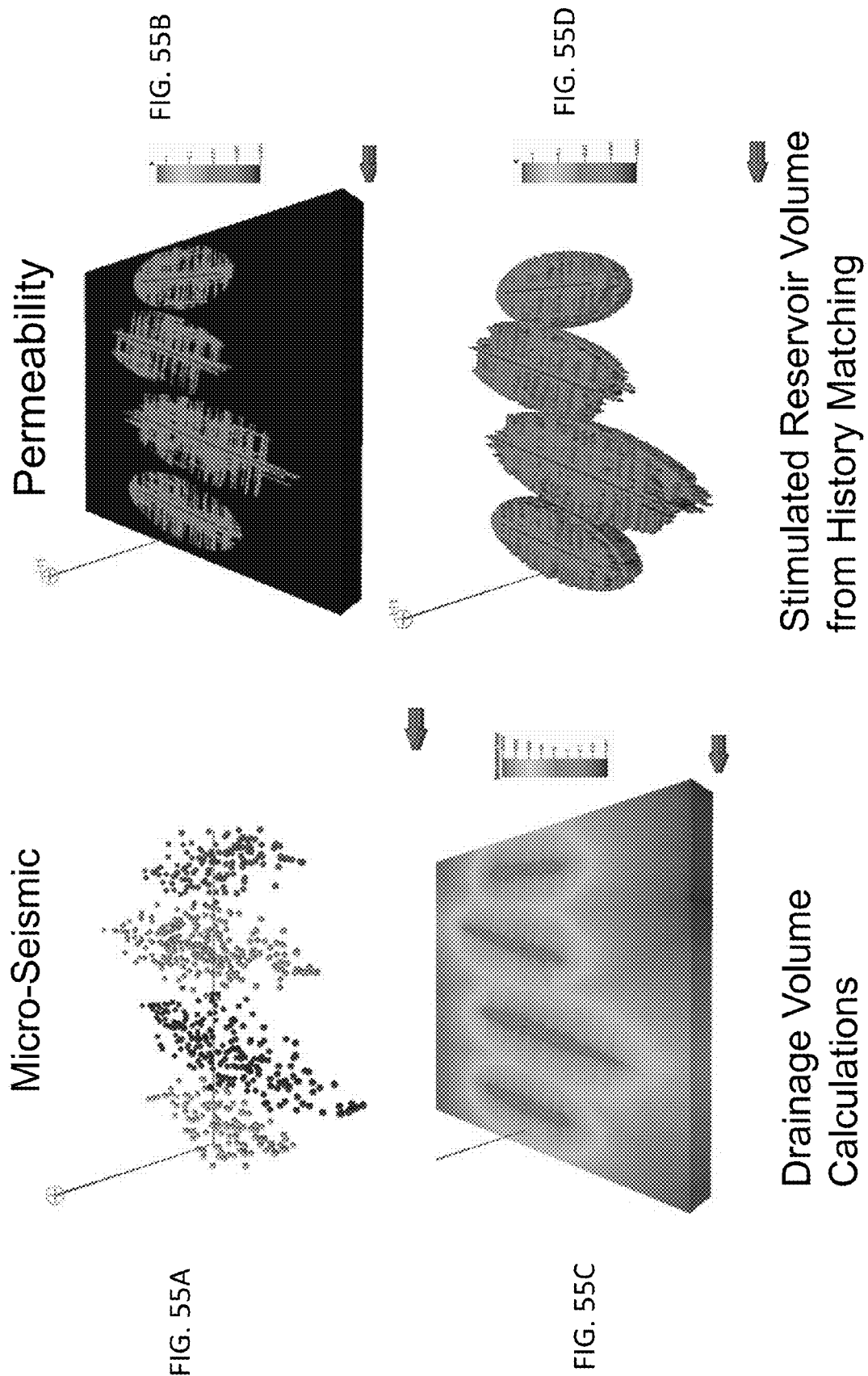
FIG. 55A Micro-Seismic
FIG. 55B Permeability
FIG. 55C Drainage Volume Calculations
FIG. 55D Stimulated Reservoir Volume from History Matching

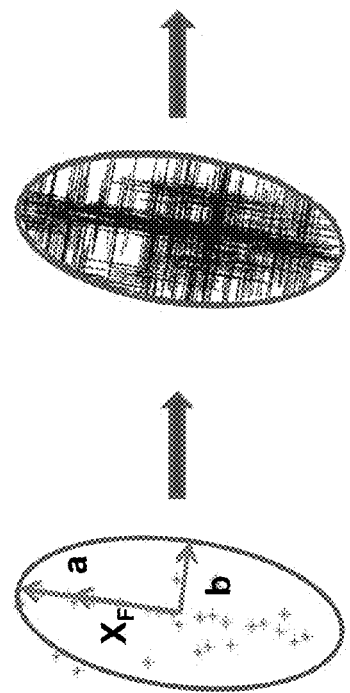
Micro-seismic events
FIG. 56A
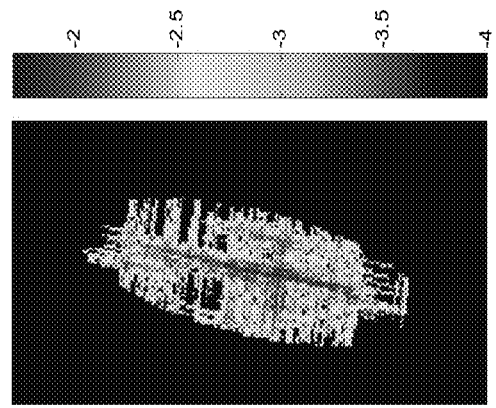
Natural fracture network
FIG. 56B
Heterogeneous permeability
FIG. 56C
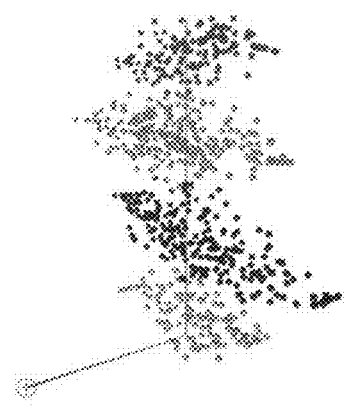
FIG. 57A
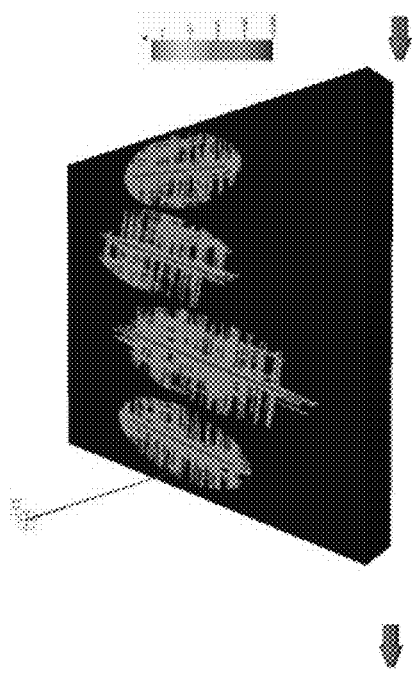
FIG. 57B History matching workflow with GA

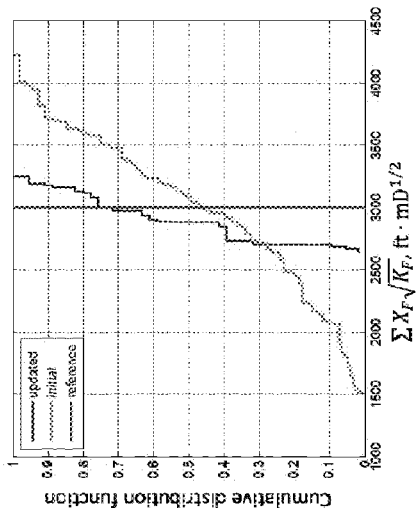
FIG. 62B
FIG. 62A
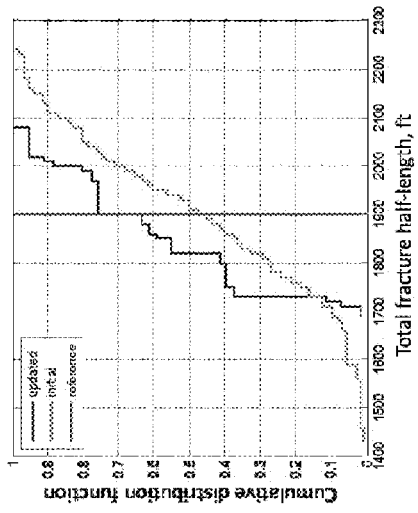
The SRV comparison, the reference versus four updated models
FIG. 64
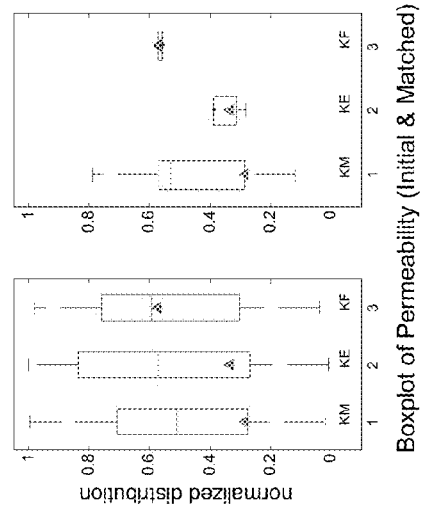
FIG. 61
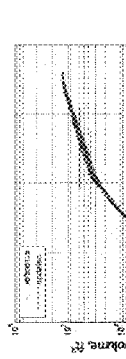
FIG. 63A
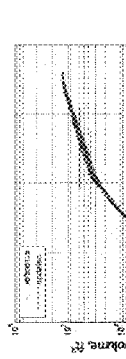
FIG. 63B

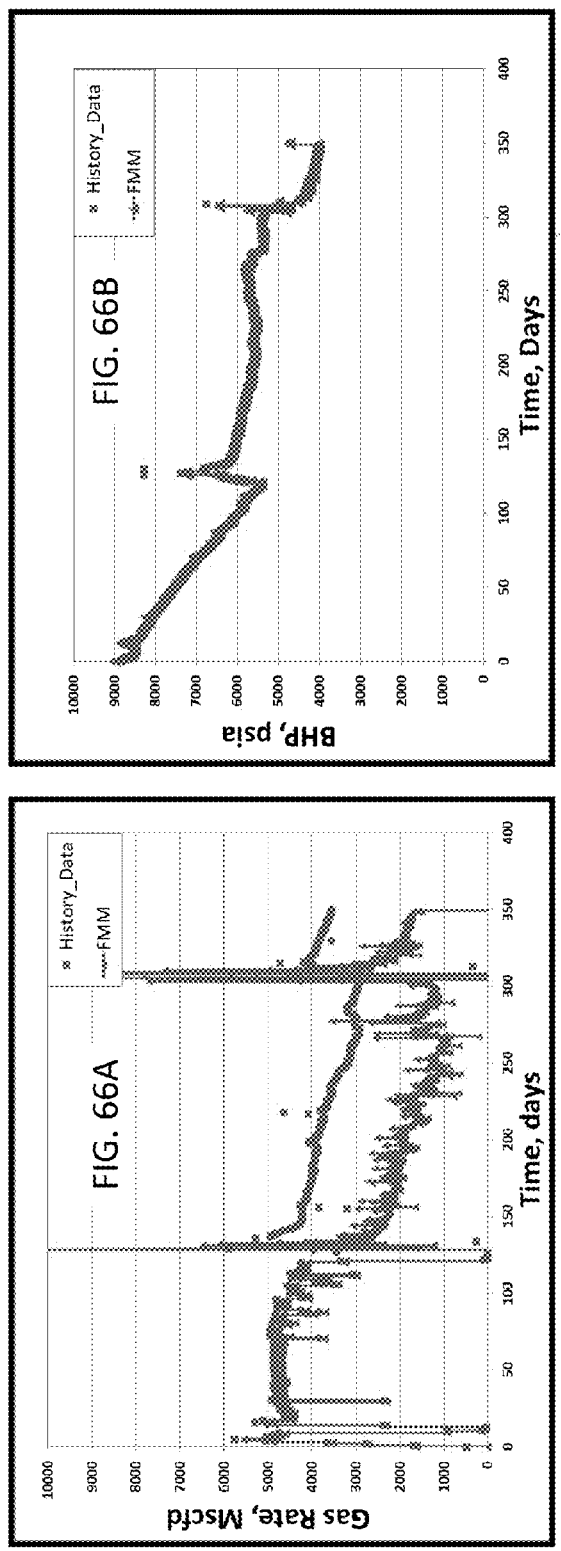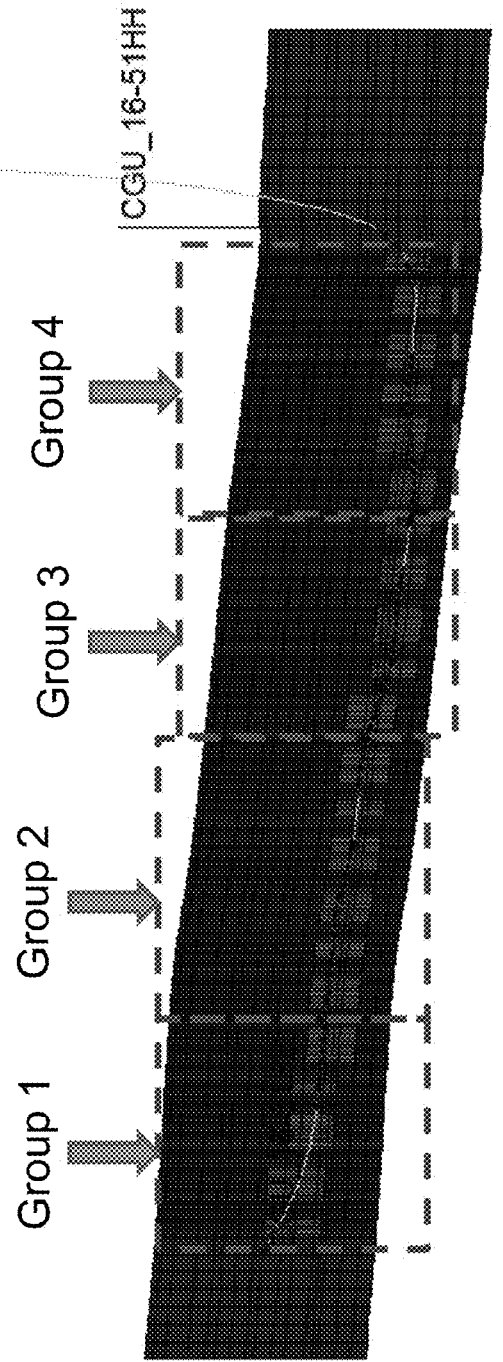
FIG. 66A
FIG. 66B
FIG. 67

FIG. 69

Parameter uncertainties for sensitivity and history matching

| Uncertainty | Base | Low | High |
|---|---|---|---|
| SRV fracture porosity (PORO1, PORO2, PORO3, PORO4), fraction | 1.00E-02 | 1.00E-03 | 5.00E-02 |
| SRV matrix permeability multiplier in x direction (KXM1, KXM2, KXM3, KXM4) | 1 | 1E-02 | 1.3 |
| SRV fracture permeability in x direction (KXF1, KXF2, KXF3, KXF4), md | 3.16E-02 | 3.16E-04 | 4.11E-02 |
| SRV hydraulic fracture permeability in x direction (KXFF1, KXFF2, KXFF3, KXFF4), md | 6.50E-01 | 6.50E-03 | 6.50E+00 |
| SRV matrix permeability multiplier in z direction (KZM1, KZM2, KZM3, KZM4) | 1 | 1E-02 | 1.3 |
| SRV fracture permeability in z direction (KZF1, KZF2, KZF3, KZF4), md | 3.16E-02 | 3.16E-04 | 4.11E-02 |
| SRV hydraulic fracture permeability in z direction (KZFF1, KZFF2, KZFF3, KZFF4), md | 6.50E-01 | 6.50E-03 | 6.50E+00 |
| SRV fracture water saturation (MULTSWE1, MULTSWE2, MULTSWE3, MULTSWE4), fraction | 2.00E-01 | 2.00E-03 | 2.40E-01 |
| SRV hydraulic fracture water saturation (MULTSWF1, MULTSWF2, MULTSWF3, MULTSWF4), fraction | 7.00E-01 | 7.00E-03 | 8.40E-01 |
| Fracture compaction table multiplier (CE2) | 1 | 0.6 | 1.5 |
| Hydraulic fracture compaction table multiplier (CE3) | 1 | 0.6 | 1.5 |
| Fracture half long axis (NF1, NF2, NF3, NF4), ft | 150 | 50 | 250 |
| Fracture height long axis (NE1, NZ2, NZ3, NZ4), ft | 60 | 30 | 90 |
| SRV half long axis (NE1, NE2, NE3, NE4), ft | 350 | 250 | 650 |

DETERMINING PERFORMANCE DATA FOR HYDROCARBON RESERVOIRS USING DIFFUSIVE TIME OF FLIGHT AS THE SPATIAL COORDINATE

CROSS-REFERENCES TO RELATED APPLICATIONS

This application claims priority to U.S. Provisional Patent Application Ser. No. 61/897,589, filed Oct. 30, 2013, the contents of which are hereby incorporated by reference in their entirety.

STATEMENT REGARDING FEDERALLY SPONSORED RESEARCH OR DEVELOPMENT

Not Applicable.

NAMES OF THE PARTIES TO A JOINT RESEARCH AGREEMENT

Not Applicable.

INCORPORATION-BY-REFERENCE OF MATERIAL SUBMITTED ON A COMPACT DISC OR AS A TEXT FILE VIA THE OFFICE ELECTRONIC FILING SYSTEM (EFS-WEB)

Not Applicable.

FIELD OF THE INVENTION

The present disclosure relates in general to the field of modeling geological structures, and more specifically to determining performance data for hydrocarbon reservoirs using diffusive time of flight as the spatial coordinate.

BACKGROUND ART

Without limiting the scope of the disclosure, its background is described in connection with oil and gas reservoirs. Current field analysis indicates that approximately 30% of multi-stage fracture clusters in tight and unconventional reservoirs are not effective, while 80% of practitioners report that they do not have an adequate understanding of reservoir drainage volume. Field data also shows that the total drilling time is consistently being reduced, which leaves the time spent in improved completions, especially multi-stage fracture design, as increasingly important for optimization.

Three-dimensional earth models play an increasingly central role in the petroleum industry. They are routinely used to plan new wells, calculate hydrocarbon reserves and forecast production. Usually due to sparse well coverage, earth models are often poorly constrained away from the well locations. This is where dynamic reservoir characterization could play an important role. Calibration of a dynamic reservoir characterization is essentially solving an inverse problem, i.e. finding the "best" model(s) under historical production data constraints, which produces (by forward simulation) the closest calculated results compared to the observed dynamic data, e.g. production rate, gas oil ratio, and wellbore pressure. If the dynamic reservoir characterization is performed successfully, it is able to constrain the models, reduce uncertainties, and provide better predictions. The forward modeling technique to be used with the dynamic reservoir characterization should be selected according to specific problems. It is very important to strike a balance between accuracy and efficiency. The model has to be "accurate" enough in order to capture the principal physics. Efficiency is a big concern because the solution of the inverse problem usually involves not just one forward simulation but many. The traditional 3D finite difference (FD) reservoir simulation may not be the best fit for all dynamic reservoir characterization applications, particularly for high resolution geo-models consisting of multimillion cells.

BRIEF SUMMARY OF THE INVENTION

The disclosure reduces the three-dimensional computation of pressure and rates in a heterogeneous reservoir to that of an equivalent homogeneous one-dimensional problem in transformed coordinates based upon the diffusive time of flight as a spatial variable. The development of an equivalent one-dimensional formulation allows a rapid approach to the analysis of reservoir performance and predictions. Because the one-dimensional equation is solved numerically, all relevant process physics can be included (e.g., slightly compressible flow (oil case), compressible flow (gas case), gas adsorption, geomechanical/compaction effects, dual porosity/permeability, multi-phase flow, adsorption/Knudsen diffusion, non-Darcy effects, compositional flows/anomalous phase behavior, etc.). Performance predictions can be used to assess, calibrate and optimize multi-stage fracture design in tight and unconventional reservoirs and to optimize well placement (spacing and timing) in tight and conventional reservoirs. For unconventional reservoirs, the approach provides for the prediction and interpretation of bottom hole flowing pressures for wells with rate measurements and more importantly the prediction and interpretation of well rates as a function of the bottom hole pressure during routine production. The disclosed approach has the same ease of analysis as the analytic models, without the need to neglect reservoir and fracture spatial heterogeneity, and their interaction.

The diffusive time of flight can be calculated solving an Eikonal equation using a shortest path algorithm (e.g., Dijkstra's algorithm, etc.), a streamline method, a Fast Marching Method (FMM), or a hybrid method that combines two or more of the foregoing methods. The Eikonal equation is obtained from the asymptotic (high frequency) solution to the pressure diffusivity equation and may be used to calculate the drainage volume as a function of the diffusive time of flight. This drainage volume function provides a complete characterization of the reservoir heterogeneity. It is used to transform the pressure diffusivity equation into its equivalent one-dimensional form. The equations for the prediction of well pressures and rates follow the same transformation.

More specifically, the present disclosure provides a computerized method for determining performance data for a hydrocarbon reservoir by providing a data storage, an output device and one or more processors communicably coupled to the data storage and the output device. A heterogeneous multi-dimensional model of at least a portion of the hydrocarbon reservoir divided into cells is obtained. Each cell has a volume and one or more other attributes. A diffusive time of flight based upon the heterogeneous multi-dimensional model is calculated using the processor. The heterogeneous multi-dimensional model is transformed to an equivalent homogeneous one-dimensional model by defining the diffusive time of flight as a spatial variable using the processor.

The performance data for the hydrocarbon reservoir is determined based on the equivalent homogeneous one-dimensional model using the processor, and the performance data is provided to the output device using the processor.

In addition, the present disclosure provides a non-transitory computer readable medium encoded with a computer program for determining performance data for a hydrocarbon reservoir that, when executed by one or more processors perform the following steps: obtaining a heterogeneous multi-dimensional model of at least a portion of the hydrocarbon reservoir divided into cells, each cell having a volume and one or more other attributes; calculating a diffusive time of flight based upon the heterogeneous multi-dimensional model; transforming the heterogeneous multi-dimensional model to an equivalent homogeneous one-dimensional model by defining the diffusive time of flight as a spatial variable; determining the performance data for the hydrocarbon reservoir based on the equivalent homogeneous one-dimensional model; and providing the performance data to the output device.

Moreover, the present disclosure provides an apparatus for determining performance data for a hydrocarbon reservoir. The apparatus includes data storage, an output device, and one or more processors communicably coupled to the data storage and the output device. The one or more processors: (1) obtain a heterogeneous multi-dimensional model of at least a portion of the hydrocarbon reservoir divided into cells, each cell having a volume and one or more other attributes, (2) calculate a diffusive time of flight based upon the heterogeneous multi-dimensional model, (3) transform the heterogeneous multi-dimensional model to an equivalent homogeneous one-dimensional model by defining the diffusive time of flight as a spatial variable, (4) determine the performance data for the hydrocarbon reservoir based on the equivalent homogeneous one-dimensional model, and (5) provide the performance data to the output device.

BRIEF DESCRIPTION OF THE SEVERAL VIEWS OF THE DRAWING(S)

For a more complete understanding of the features and advantages of the present disclosure, reference is now made to the detailed description of the disclosure along with the accompanying figures and in which:

FIGS. 3A-3F depict an illustration of Fast Marching Method in 5-stencil Cartesian grid;

FIGS. 6A-6C depict results for a monotonically outward propagating front from a point source: (a) Isotropic permeability case using isotropic Fast Marching Method, (b) Anisotropic permeability case using isotropic Fast Marching Method, and (c) Anisotropic permeability case using recursive Fast Marching Method;

FIGS. 19A-19E illustrate that the 3D to 1D conversion in accordance with the present disclosure is analogous to streamline models;

Figure 46:
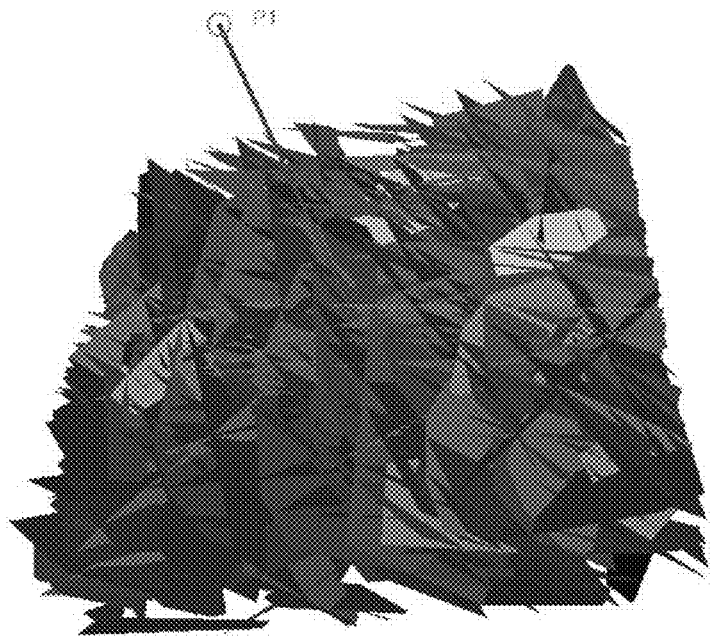
Figure 47A:
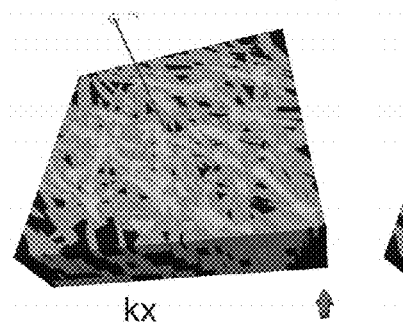
Figure 47B:
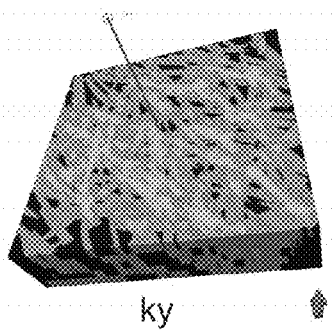
Figure 47C:
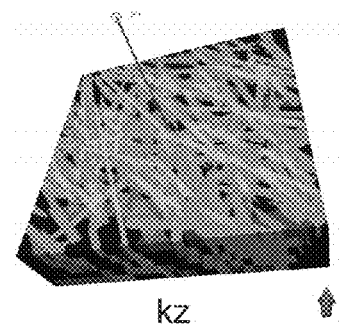
Figure 47D:
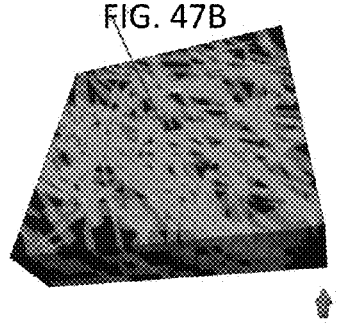
Figure 48:
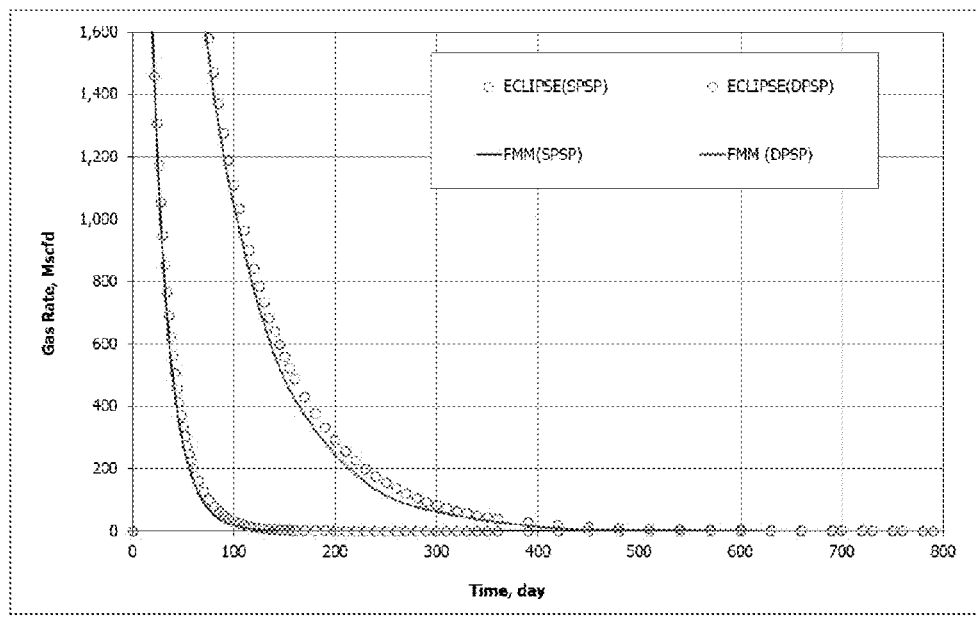
Figure 49A:
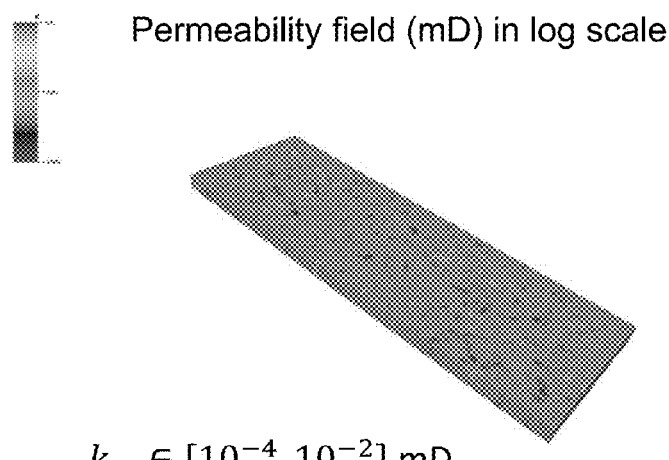
Figure 49B:
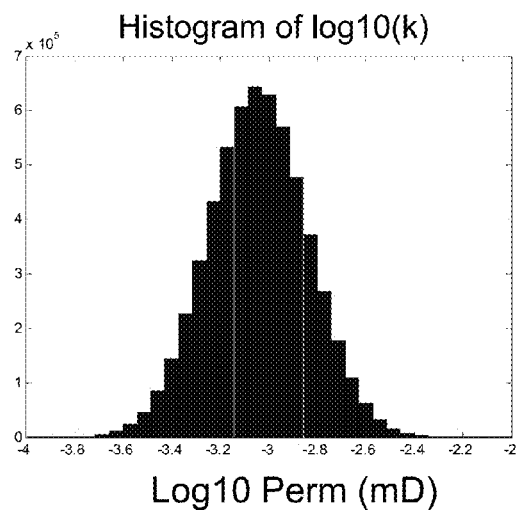
Figure 50B:
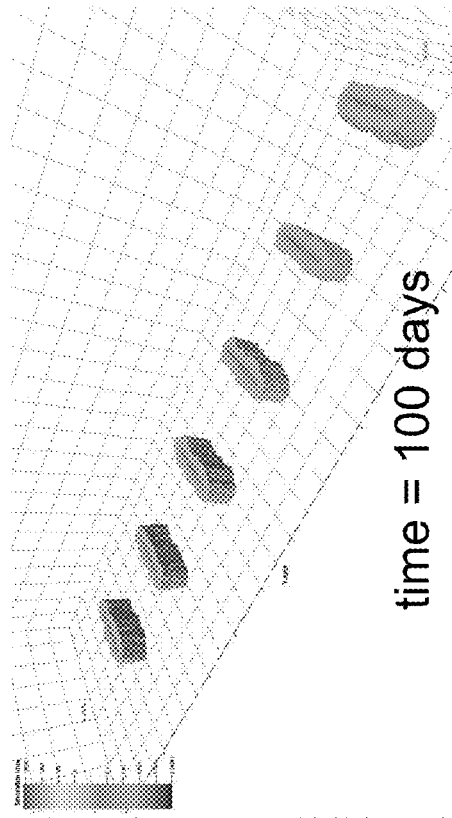
Figure 50D:
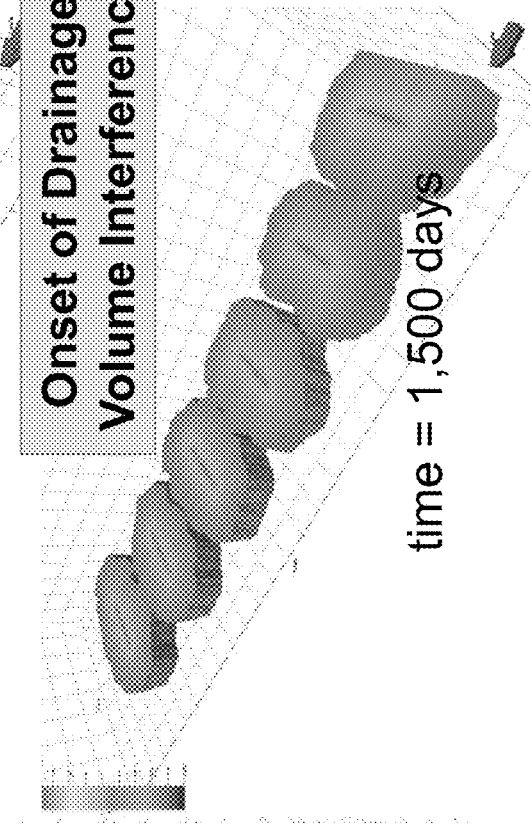
Figure 50A:
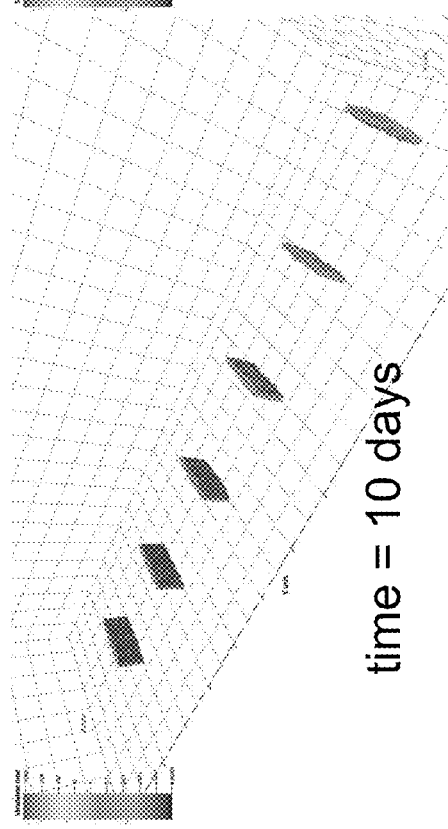
Figure 50C:
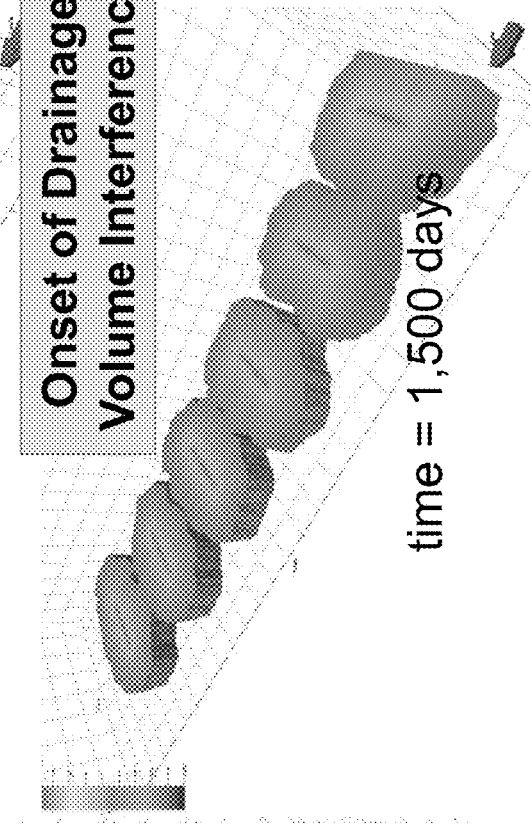
Figure 52:
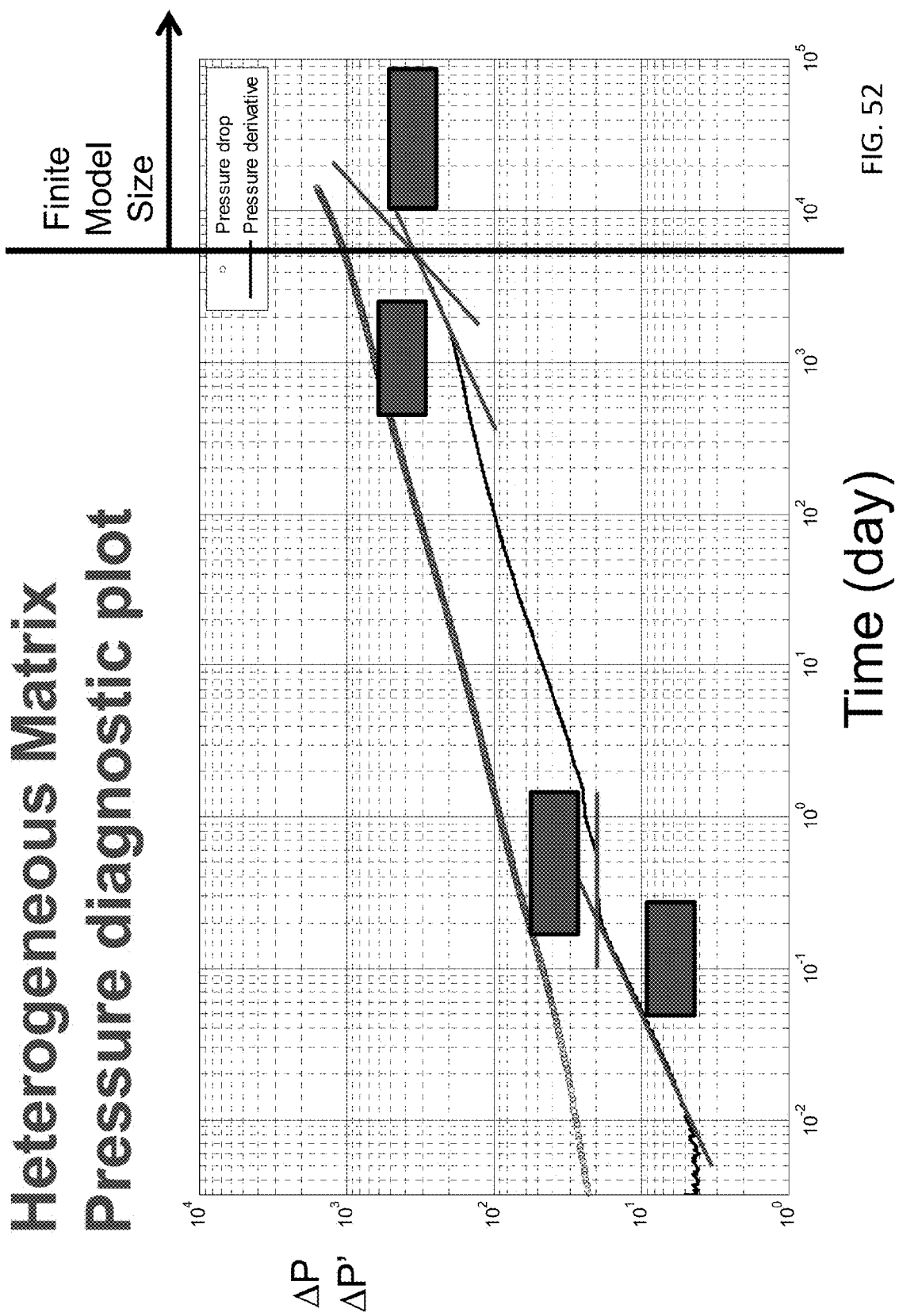
Figure 53B:
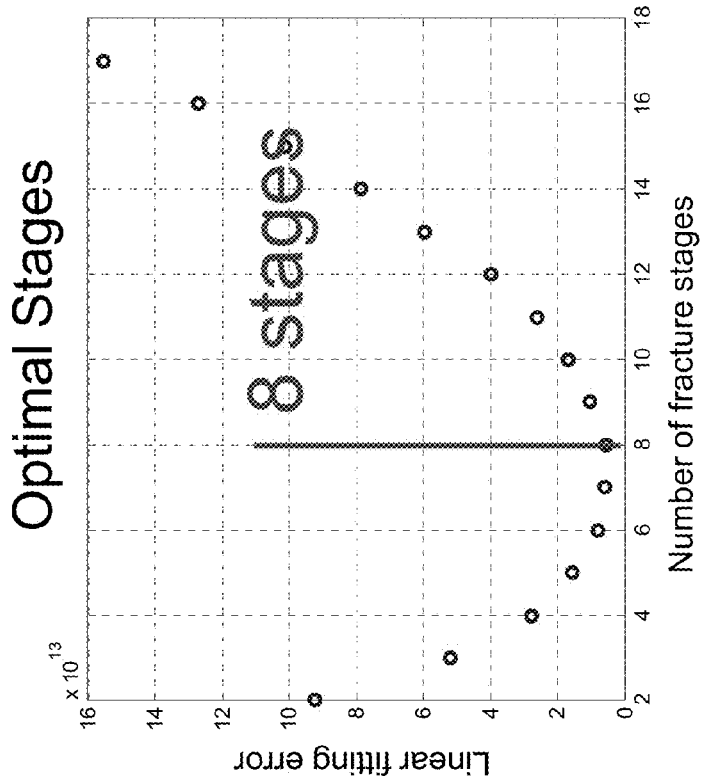
Figure 53A:
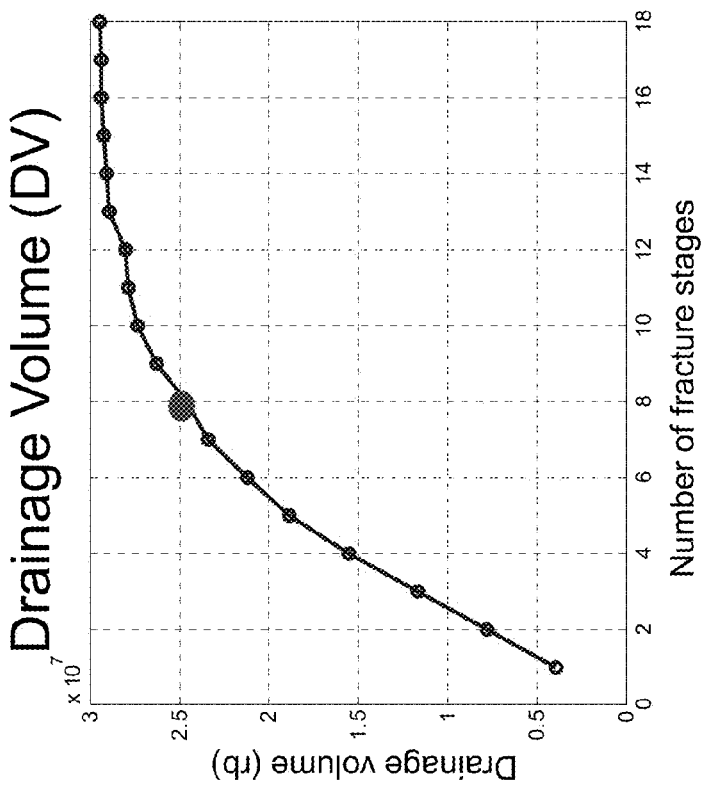
Figure 58:
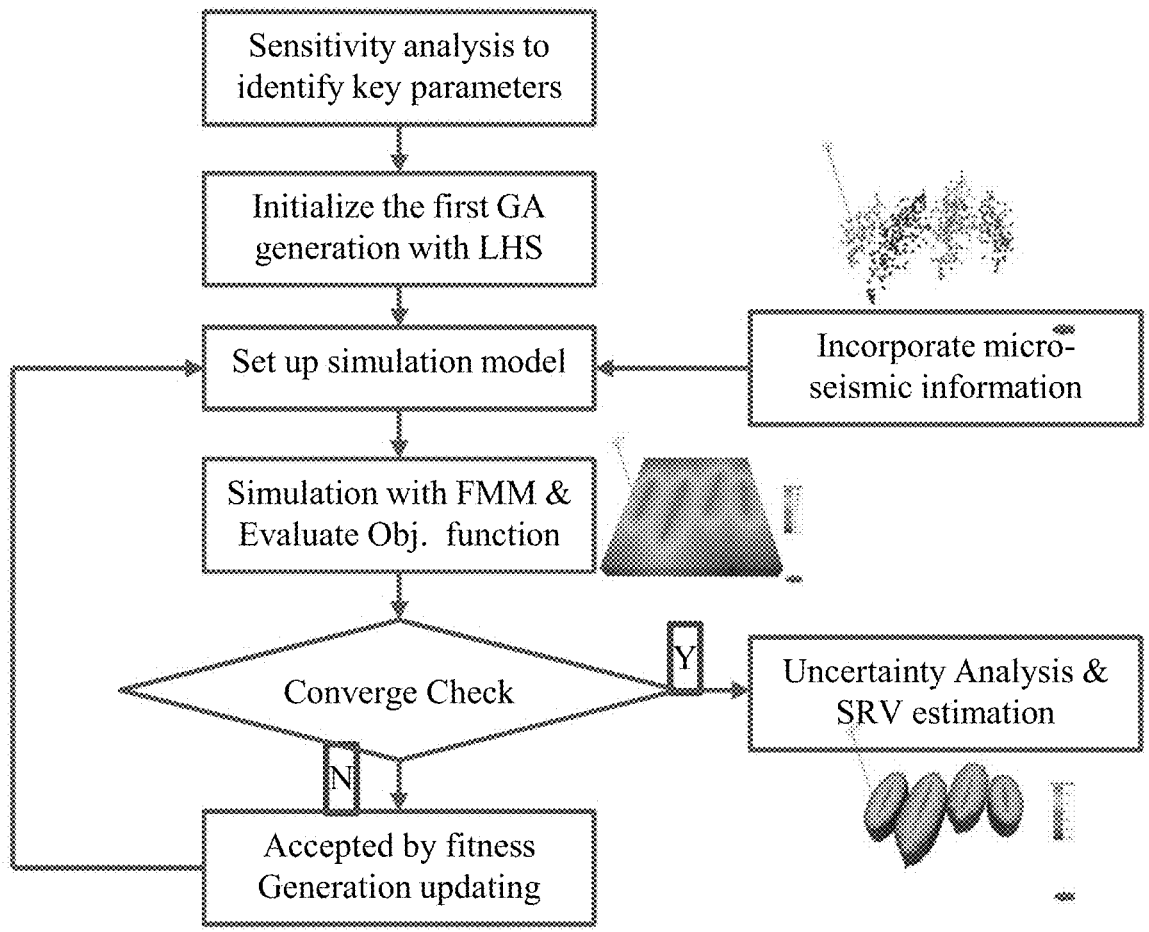

Ratio for pressure ana pore size in the shale gas case;

FIG. 46 illustrates an example of a naturally fractured system using a dual porosity, single permeability (DPSP) model;

FIGS. 47A-47D illustrate the fracture properties (permeability and porosity) of a naturally fractured system using a dual porosity, single permeability (DPSP) model;

FIG. 48 compares the single porosity, single permeability (SPSP) models to the DPSP models using Eclipse® and FMM;

FIGS. 49A-49B (Heterogeneous Matrix Permeability Field), FIGS. 50A-50D (Heterogeneous Matrix Depth of Investigation), FIGS. 51A-51D (Heterogeneous Matrix Depth of Investigation), FIG. 52 (Heterogeneous Matrix Pressure Diagnostic Plot), FIGS. 53A-53B (Optimal Number of Fractures) and FIGS. 54A-54D (Depth of Investigation at 2 years) illustrate the use of the present disclosure to analyze the Cotton Valley tight gas reservoir;

FIGS. 55A-55D and 56A-56C illustrate an example of integrating micro-seismic and production data to understand stimulated reservoir volume (SRV) using the present disclosure;

FIGS. 57A-57B illustrate another example of analyzing a shale gas reservoir using the present disclosure;

FIG. 58 is a flow chart illustrating a method for history matching using a genetic algorithm;

FIGS. 59, 60, 61, 62A-62B, 63A-63B and 64 illustrate an example of history matching in accordance with the present disclosure; and FIGS. 65A-65C, 66A-66B, 67, 68, 69, 70, 71 and 72 illustrate an example of fast history matching and performance predictions of a shale gas reservoir in accordance with the present disclosure.

DETAILED DESCRIPTION OF THE INVENTION

While the making and using of various embodiments of the present disclosure are discussed in detail below, it should be appreciated that the present disclosure provides many applicable inventive concepts that can be embodied in a wide variety of specific contexts. The specific embodiments discussed herein are merely illustrative of specific ways to make and use the disclosure and do not delimit the scope of the disclosure.

To facilitate the understanding of this disclosure, a number of terms are defined below. Terms defined herein have meanings as commonly understood by a person of ordinary skill in the areas relevant to the present disclosure. Terms such as "a", "an" and "the" are not intended to refer to only a singular entity, but include the general class of which a specific example may be used for illustration. The terminology herein is used to describe specific embodiments of the disclosure, but their usage does not delimit the disclosure, except as outlined in the claims.

The present disclosure may be used to develop commercial software or provide consultant services to predict reservoir pressures and rates, especially to optimize multi-stage fracture design in tight and unconventional reservoirs, to optimize well spacing and timing in conventional or unconventional reservoirs, and to rank and/or calibrate reservoir models against field performance data. The use of the diffusive time of flight as a spatial coordinate is completely novel, as is the development of an effective one-dimensional equation from the 3-D diffusivity equation.

Figure 1:
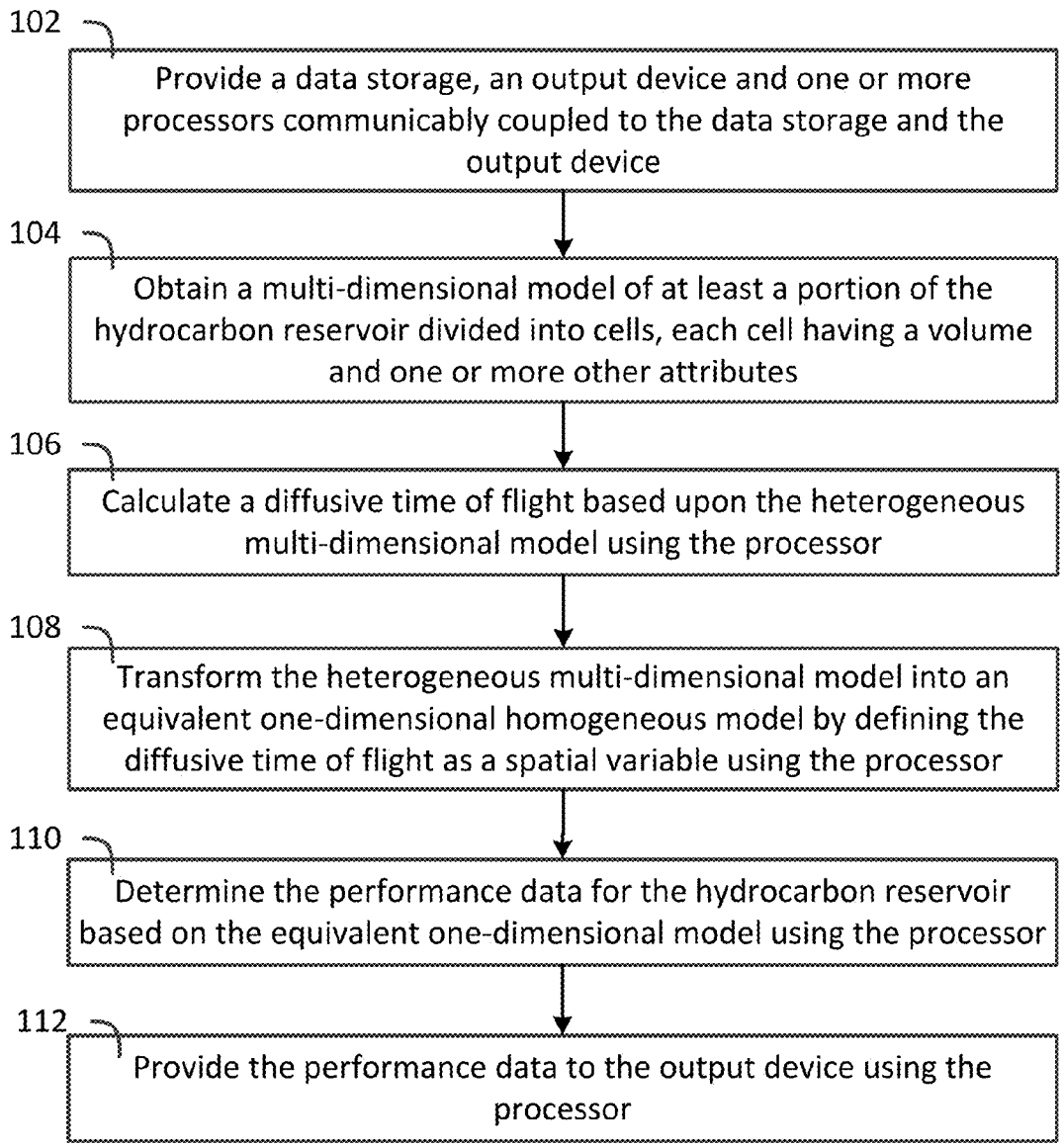
FIG. 1 depicts a flow chart of a computerized method for determining performance data for a hydrocarbon reservoir.

Now referring to FIG. 1, the present disclosure provides a computerized method 100 for determining performance data for a hydrocarbon reservoir. A data storage, an output device and one or more processors communicably coupled to the data storage and the output device are provided in block 102. A multi-dimensional model (e.g., 2D model, 2.5D model or 3D model) of at least a portion of the hydrocarbon reservoir divided into cells is obtained in block 104. Each cell (e.g., a triangle, a quadrilateral, or a polygon having five or more sides) has a volume and one or more other attributes. A diffusive time of flight based upon the heterogeneous multi-dimensional model is calculated using the processor in block 106. The heterogeneous multi-dimensional model is transformed to an equivalent one-dimensional homogeneous model by defining the diffusive time of flight as a spatial variable using the processor in block 108. The performance data is determined for the hydrocarbon reservoir based on the equivalent one-dimensional model using the processor in block 110, and the performance data is provided to the output device using the processor in block 112. The performance data may include a reservoir drainage volume, a reservoir pressure, a reservoir flow rate, a well pressure, a well flow rate, a bottom hole flowing pressure for each well in the hydrocarbon reservoir during a draw-down, and a well rate as a function of the bottom hole flowing pressure during a routine production, or a combination thereof. Note that the method can be modified to perform any of the steps and functions described herein. Some examples will now be described.

The hydrocarbon reservoir can be assumed to have Darcy flow. The heterogeneous multi-dimensional model can be a 2D model, a 2.5D model or a 3D model, and each cell can be a triangle, a quadrilateral, or a polygon having five or more sides. If each cell includes a polygon having five or more sides, the method may include the step of refining each polygon into a triangle or a quadrilateral using a sub-cell refinement method (e.g., a local conservation method, a closure constraint method, a higher-order quadrilateral refinement method, a lower-order quadrilateral refinement method or a triangular refinement method). The heterogeneous multi-dimensional model can be a dual porosity model with either single permeability or dual permeability. The homogeneous one-dimensional model may include one or more additional physics relating to the hydrocarbon reservoir, such as a slightly compressible flow, a compressible flow, a gas adsorption, a geomechanical or compaction effect, a dual porosity or permeability, a multi-phase flow, an adsorption/Knudsen diffusion, a non-Darcy effect, a compositional flows/anomalous phase behavior, or a combination thereof.

The performance data can be used to characterize a carbonate reservoir. The performance data may include one or more geomechanical effects, a reservoir drainage volume, a reservoir pressure, a reservoir fluid flow rate, a well pressure, a well flow rate, a bottom hole flowing pressure for each well in the hydrocarbon reservoir during a draw-down, a well rate as a function of the bottom hole flowing pressure during a routine production, or a combination thereof.

The step of calculating the diffusive time of flight based upon the heterogeneous multi-dimensional model using the processor can be performed by several different methods:
(1) calculating the diffusive time of flight based upon the heterogeneous multi-dimensional model by solving an Eikonal equation; or
(2) interpolating a velocity field throughout the heterogeneous multi-dimensional model, constructing one or more streamline trajectories within the heterogeneous multi-dimensional model based on the velocity field, and calculating the diffusive time of flight along each streamline trajectory; or
(3) calculating the diffusive time of flight based upon the heterogeneous multi-dimensional model using a shortest path algorithm (e.g., Dijkstra's algorithm, etc.); or
(4) calculating the diffusive time of flight based upon the heterogeneous multi-dimensional model using a Fast Marching Method; or
(5) the heterogeneous multi-dimensional model includes a first heterogeneous multi-dimensional model for a first medium within the hydrocarbon reservoir and one or more additional heterogeneous multi-dimensional models for one or more additional mediums within the hydrocarbon reservoir, and calculating a first diffusive time of flight based upon the first heterogeneous multi-dimensional model by using a Fast Marching Method, calculating one or more additional diffusive time of flight(s) based upon the one or more additional heterogeneous multi-dimensional model(s) by using the Fast Marching Method, and coupling the first diffusive time of flight with the one or more additional diffusive time of flight(s) using a Dijkstra's algorithm.

The step of calculating the diffusive time of flight based upon the heterogeneous multi-dimensional model using the processor may include a corner point grid geometry effect(s) and a permeability anisotropy effect(s).

The step of transforming the multi-dimensional model to the equivalent one-dimensional model by defining the diffusive time of flight as the spatial variable may include the steps of defining an Eikonal equation obtained from an asymptotic solution to a pressure diffusivity equation, solving the defined Eikonal equation, and transforming the pressure diffusivity equation into an equivalent one-dimensional form based on the diffusive time of flight as the spatial variable. The defined one-dimensional diffusivity equation is:

$$\frac{\partial}{\partial \tau}\left(w(\tau)\frac{\partial P}{\partial \tau}\right) = w(\tau)\frac{\partial P}{\partial t}$$

where:

$$w(\tau) = \int\int \phi J(\tau, \psi, \chi) d\psi d\chi = \frac{dV_p(\tau)}{d\tau}$$

$\tau$ is the diffusive time of flight,
P is a pressure,
t is a time,
$\phi$ is a porosity of the hydrocarbon reservoir,
J is a Jacobian of a coordinate transformation,
$\psi$ and $\chi$ are defined on the contour surfaces of $\tau$ and are orthogonal to each other and to $\tau$, and
$V_p(\tau)$ Drainage pore volume obtained from the Eikonal solution.

If the hydrocarbon reservoir is slightly compressible, $$w(\tau) = \frac{dV_p(\tau)}{d\tau}$$

with a wellbore flow rate boundary condition of $$\left(w(\tau)\frac{\partial P}{\partial \tau}\right)_{\tau=\tau_w} = \frac{q_w}{c_t},$$

an outer flow rate boundary condition of $$\left(w(\tau)\frac{\partial P}{\partial \tau}\right)_{\tau=\tau_e} = \frac{q_e}{c_t},$$

a wellbore pressure boundary condition of $P|_{\tau=\tau_w}=P_{wf}$ and an outer pressure boundary condition of $P|_{\tau=\tau_e}=P_e$ where $\tau_w$ is a lower bound corresponding with a wellbore radius, $\tau_e$ is an upper bound corresponding with a boundary of the hydrocarbon reservoir, q is a down-hole flow rate, and $c_t$ is a total compressibility.

If the hydrocarbon reservoir is compressible, the defined one-dimensional diffusivity equation is:

$$\frac{\partial}{\partial \tau}\left(w(\tau)\frac{P}{\tilde{\mu}(P)Z(P)}\frac{\partial P}{\partial \tau}\right) = w(\tau)\tilde{c}_t(P)\frac{P}{Z(P)}\frac{\partial P}{\partial t}$$

where:

$$w(\tau) = \int \int \phi J(\tau, \psi, \chi) d\psi d\chi = \frac{dV_p(\tau)}{d\tau}$$

τ is the diffusive time of flight,
P is a pressure, $$\tilde{\mu}(P) = \frac{\mu(P)}{\mu_i},$$

μ is a fluid viscosity, $$\tilde{c}(P) = \frac{c_t(P)}{c_{ti}},$$

c is a fluid compressibility,
Z is a compressibility factor,
t is a time,
φ is a porosity of the hydrocarbon reservoir,
J is a Jacobian of a coordinate transformation,
ψ and χ are defined on the contour surfaces of τ and are orthogonal to each other and to τ, and
$V_p(\tau)$ Drainage pore volume obtained from the Eikonal solution.

In addition, the disclosed method may also include the steps of assessing, calibrating or optimizing a multi-stage fracture design of the hydrocarbon reservoir based the performance data using the processor, and providing the assessed, calibrated or optimized multi-stage fracture design to the output device. The disclosed method may also include the steps of optimizing a spacing and a timing of two or more wells within the hydrocarbon reservoir based on the performance data using the processor, and providing the optimized spacing and the optimized timing of the two or more wells within the reservoir to the output device. Moreover, the disclosed method may include the steps of ranking or calibrating the model of the hydrocarbon reservoir against a field performance data of the hydrocarbon reservoir based the performance data using the processor, and providing the ranked or calibrated model of the hydrocarbon reservoir to the output device.

The present disclosure may also include a non-transitory computer readable medium encoded with a computer program for determining a performance data for a hydrocarbon reservoir that when executed by one or more processors perform the steps of: obtaining a heterogeneous multi-dimensional model of at least a portion of the hydrocarbon reservoir divided into cells, each cell having a volume and one or more other attributes; calculating a diffusive time of flight based upon the heterogeneous multi-dimensional model; transforming the heterogeneous multi-dimensional model to an equivalent homogeneous one-dimensional model by defining the diffusive time of flight as a spatial variable; determining the performance data for the hydrocarbon reservoir based on the equivalent homogeneous one-dimensional model; and providing the performance data to the output device. Note that the computer program can be modified to preform any of the methods, steps and functions described herein.

Figure 2:
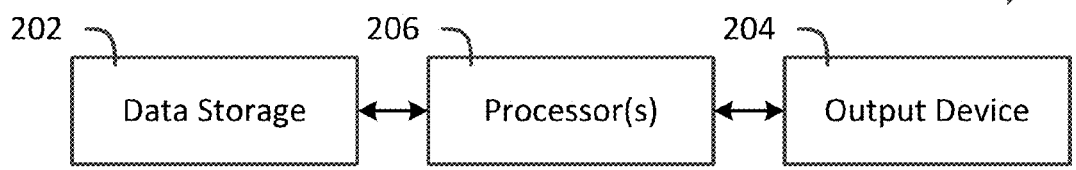
FIG. 2 depicts a block diagram of an apparatus for determining performance data for a hydrocarbon reservoir.

As shown in FIG. 2, the present disclosure may include an apparatus 200 for determining a performance data for a hydrocarbon reservoir. The apparatus 200 includes data storage 202, an output device 204, and one or more processors 206 communicably coupled to the data storage 202 and the output device 204. The data storage 202 may include a memory, a fixed data storage device, a removable storage device, or a combination thereof. The output device 204 may include a display, a printer, a communications interface, the data storage, a removable data storage device, or a combination thereof. The one or more processors 206 obtain: (1) a heterogeneous multi-dimensional model of at least a portion of the hydrocarbon reservoir divided into cells, each cell having a volume and one or more other attributes, (2) calculate a diffusive time of flight based upon the heterogeneous multi-dimensional model, (3) transform the heterogeneous multi-dimensional model to an equivalent homogeneous one-dimensional model by defining the diffusive time of flight as a spatial variable, (4) determine the performance data for the hydrocarbon reservoir based on the equivalent homogeneous one-dimensional model, and (5) provide the performance data to the output device 204. Note that the apparatus 200 can be modified to preform any of the methods, steps and functions described herein.

The following analysis describes the mathematical derivation of the present disclosure and demonstrates that all of the effects of reservoir heterogeneity can be integrated into the drainage volume and diffusive time of flight.

In the area of dynamic reservoir characterization, the application of streamline method has already been very successful and quite mature [13]. In recent years, due to the emerging next generation reservoir simulators as well as the new data exchange standard for reservoir characterization and modeling [27], unstructured grids become more and more popular. The present disclosure addresses the fundamental problem of extending these methods from convective processes to diffusive, whilst retaining the flexibility of unstructured grids.

Although the theory of Fast Marching Method (FMM) and its applications in many other areas have been quite mature [38], the FMM has only become important in reservoir engineering recently, in the context of the shale gas developments [14]. There are still many fundamental challenges to overcome in order to turn it into a useful and robust tool for dynamic reservoir characterization. Previous work [50, 51] has demonstrated the use of the FMM for drainage volume visualization and production forecasts in tight gas and shale gas reservoirs. These applications are based on regular square grid and isotropic permeabilities. The following discussion extends these applications to more complex grids and anisotropic permeabilities. The discussion will be primarily concentrated on the corner point grid (CPG) due to its wide adoption in reservoir modeling.

The FMM is conceptually very closely related to the streamline method. The present disclosure provides a major advancement: a completely novel way of formulating the pressure equation using the diffusive time of flight, τ, as a spatial coordinate calculated by the FMM. This is in close analogy with using the time of flight along streamlines as a spatial variable for solving fluid transport. This new τ-coordinate formulation is able to reduce the pressure equation from three-dimensions to only one-dimension in space. Compared with the previously proposed geometric approximation [50, 51], the new formulation has several advantages. First, it is theoretically more general without the pseudo-steady state (PSS) assumption. Second, it is much easier to deal with complex well control. Third, it is much easier to be extended by incorporating additional physics, which might be important for shale gas reservoir production.

Asymptotic methods are often used to capture important characteristics of a complex problem and thus provide insight into the problem that may be otherwise obscured by its full complexity. The asymptotic solution of the diffusivity equation [48, 49] enables the capture of the pressure "front" propagation in analogy to a wave front propagation. Here the diffusivity equation for slightly compressible fluid which describes the transient pressure response in a heterogeneous reservoir is:

$$\nabla \cdot \left( \frac{k(x)}{\mu} \nabla P(x, t) \right) = \phi(x) c_t \frac{\partial P(x, t)}{\partial t} \quad (1)$$

The extension of this derivation to a full tensor permeability tensor will be discussed below. Applying a Fourier transform to this equation will lead to the following equation in the frequency domain $$\nabla^2 \tilde{P}(x, \omega) + \frac{\nabla k(x)}{k(x)} \cdot \nabla \tilde{P}(x, \omega) + \frac{\phi(x) \mu c_t}{k(x)} (i\omega) \tilde{P}(x, \omega) = 0 \quad (2)$$

Here a trial solution of the form [49] is chosen $$\tilde{P}(x, \omega) = e^{-\sqrt{-i\omega}\,\tau(x)} \sum_{j=0}^{\infty} \frac{A_j(x)}{\left(\sqrt{-i\omega}\right)^k} \quad (3)$$

Substituting this attempted solution into Equation 2 produces an expression with an infinite number of terms. By collecting terms of a given order in $\sqrt{-i\omega}$, a series of equations is obtained:

$$\left(\sqrt{-i\omega}\right)^2: \nabla \tau(x) \cdot \nabla \tau(x) = \frac{\phi(x) \mu c_t}{k(x)} \quad (4)$$

$$\sqrt{-i\omega}: A_0 \nabla^2 \tau + 2 \nabla A_0 \cdot \nabla \tau = 0 \quad (5)$$

$$\left(\sqrt{-i\omega}\right)^2: \nabla^2 A_{k-1} - A_k \nabla^2 \tau + 2 \nabla A_k \nabla \tau = 0 \; k \geq 1 \quad (6)$$

Equation 4, which is associated with the highest order $(\sqrt{-i\omega})^2$ terms, is called the Eikonal equation that describes the propagation of the pressure front.

The physical meaning of the Eikonal equation can be obtained if the zeroth-order term in Equation 3 is considered as the solution, i.e., in the high frequency limit, $$\tilde{P}_{h.f.}(x, \omega) = A_0(x) e^{-\sqrt{-i\omega}\,\tau(x)} \quad (7)$$

If this solution is converted back into the time domain by an inverse Fourier transformation, it can be shown that $\tau(x)$ is related to the time when the pressure disturbance is a maximum at point x (for an impulse point source at the origin). In the three-dimensional domain for example, $6t=\tau^2(x)$. For this reason, $\tau(x)$ is called the pseudo-phase [49] or the diffusive time of flight [14]. The Eikonal equation is a statement that the diffusive time of flight is a function of $\phi\mu c_t/k$, or the inverse of the medium diffusivity. If the medium diffusivity is thought of as the "velocity" of the propagating pressure front, then the Eikonal equation is analogous to the streamline calculations. However, there is a critical difference between the two: the diffusive time of flight can be calculated by the FMM efficiently without explicit tracing of trajectories, while the streamline time of flight calculation requires the prior solution of a pressure equation and usually utilizes explicit streamline trajectory tracing.

It is noted that the derivation of the Eikonal equation does not require the medium to be homogeneous. Therefore, the diffusive time of flight can also be defined by Equation 4 for heterogeneous and even non-smoothly varying media. However, the physical meaning of $\tau(x)$ is only clear when the zeroth-order asymptotic solution is a valid approximation. This usually is only true if the background medium is homogeneous, nearly homogeneous or slightly heterogeneous with smoothly varying properties. It is observed that the Eikonal equation only depends on the inverse of diffusivity $\phi(x) \mu c_t / k(x)$, which appears in the third term of Equation 2. The second term of this equation contains the permeability gradient $\nabla k(x)$ and this term will become very important if the permeability changes drastically over short distances, e.g. at the boundaries in a channelized reservoir. Therefore, in highly heterogeneous and high-contrast media, there are important and more complex physical characteristics of the pressure solution which cannot be captured by the Eikonal equation. For example, reflection and multiple arrival phenomena will become very important near the sharp boundaries between high and low diffusivity medium [20]. These physics could only be captured by including higher order terms, which reduces the utility of the asymptotic solution for problem reduction and simplification.

Depth of investigation is an important concept in traditional pressure transient analysis. Lee [32] proposed the definition to be the propagation distance of the maximum pressure draw-down for an impulse source. In 2D radial flow, the depth of investigation in field units is calculated by:

$$r = \sqrt{\frac{kt}{948 \phi \mu c_t}} \quad (8)$$

This equation was originally derived from the line-source analytical pressure transient solution in homogeneous reservoirs. More generally, for homogeneous flow patterns, the distance and time of the pressure front propagation can be written as:

$$r = \sqrt{\beta \alpha t} \quad (9)$$

where $\alpha$ is the hydraulic diffusivity defined as $\alpha = k/(\phi \mu c_t)$, and $\beta$ is a geometric factor related to the flow patterns. For linear, radial, and spherical flow, $\beta$ is 2, 4, and 6 respectively [26].

Drainage volume is a widely used concept in reservoir engineering to characterize the general connectivity of certain reservoir volume with a particular well or completion. It is a very practical term and often defined according to specific applications. For example, streamlines and time of flight might be useful to define the drainage volume in a water flooding application, while pressure depletion and depth of investigation might be more appropriate for a primary depletion application. The drainage volume is defined using the diffusive time of flight calculated by solving the Eikonal equation. This can be achieved efficiently using the FMM. The drainage volume defined as such is basically an extension of the depth of investigation concept to heterogeneous reservoirs. This will be fully addressed later on.

Shale formations are traditionally well-known as possible hydrocarbon source rock. In recently years, technologies such as horizontal well drilling and multistage hydraulic fracturing have made it possible to economically produce oil and gas from some of these shale formations at very large scale, changing the entire landscape of the energy industry in the US. Because of the importance of shale gas and shale oil, research on the topic has become very popular recently. On one hand, traditional theories and models for fluid flow in porous medium which were developed for conventional reservoirs have been applied to shale gas reservoirs with mixed results. On the other hand, people begin to look into the fundamental physical processes that are important in and might be unique to shale reservoirs. Although the process of gas release and production from shale gas sediments have not been very well understood, there are several physical processes which are commonly believed to play important roles in shale gas reservoirs, including reservoir compaction, gas adsorption, gas slippage, and gas diffusion. Similarly, for shale oil, it is important to include compositional and multiphase flow effects. Therefore, it is important to be able to incorporate additional physical processes in shale reservoirs into the new τ-coordinate formulation.

Due to production from wells, the effective stress increases with the decrease in pore pressure. Increase in the effective stress compacts the reservoir rock and usually reduces reservoir porosity and/or the conductivity of natural fractures. This leads to a decrease in reservoir permeability. However, it is also possible that the increase in the effective stress results in shear failure of the reservoir rock and introduce secondary fractures [25]. In this case, these secondary fractures will increase the permeability significantly. Shale reservoirs are generally believed to be sensitive to these geomechanical effects. Either coupled or decoupled models can be used to incorporate geomechanical effects into flow simulation. The coupled model solves the geomechanical processes and the fluid flow simultaneously and thus are considered to be more accurate but with a higher computational cost. The decoupled model uses pressure dependent reservoir constitutive properties, e.g. permeability and porosity, for the flow simulation, while the relationships between these reservoir constitutive properties and the pore pressure are obtained by geomechanical analysis, modeling, or even empirical experiences.

In shale gas reservoirs, the gas adsorption effect can be quite significant due to the high surface to volume ratio of the pore system in shales. The gas adsorption is usually modeled by the Langmuir isotherm [31]:

$$V_{ads}(P) = \frac{V_L P}{P_L + P} \tag{10}$$

where $V_{ads}$ is the amount of adsorbed gas at pressure P per unit volume (or mass) of shale. Parameters $V_L$ and $P_L$ are called the Langmuir volume and the Langmuir pressure respectively. The unit of $V_{ads}$ is the same as the unit of the Langmuir volume $V_L$. In field units, $V_L$ can be expressed in Mscf/ft³, or thousand standard cubic feet of gas per cubic feet of shale. In equilibrium, when pressure drops, usually the amount of adsorbed gas as described by Equation 10 also drops, which indicates that some adsorbed gas is released from the pore surface to become free gas in the pore.

In extremely low permeability reservoirs such as shale gas reservoirs, the gas molecules may slip along the pore surfaces and cause additional flux in addition to the viscous flow expressed by Darcy's law [5, 27, 23, 28, 42, 46]. This effect is usually modelled by an apparent permeability $k_{app}$ which can be much larger than the Darcy permeability for nano-scale pore sizes.

$$k_{app} = k_D(D+F) \tag{11}$$

where: (Ideal) Darcy permeability:

$$k_D = \frac{r_n^2}{8}$$

Knudsen diffusion coefficient:

$$D = \frac{16 c_g \mu_g}{3 r_n} \sqrt{\frac{8ZRT}{\pi M}}$$

Slippage factor:

$$F = 1 + \sqrt{\frac{8ZRT}{\pi M}} \left(\frac{\mu_g}{p r_n}\right)\left(\frac{2}{\alpha} - 1\right)$$

Pore radius (m²): $r_n$

In addition to the adsorbed gas on the pore wall surface, some researchers have also studied the contribution of the diffused gas inside the kerogen in organic rich shale [2, 23, 24, 43]. The diffusion of gas from the kerogen provides an additional source to the gas production and may help maintain long term production. The gas diffusion is considered to be a relatively slow process compared to the advective flow in pores and fractures. Usually this process is formulated as dual/multi porosity models with specific transfer functions related to the intrinsic shale properties. Due to lack of experimental data, many critical model parameters in these studies are taken from either coal bed methane data, or theoretical numbers, or speculations.

Unstructured grids are an important topic in reservoir simulation and 3D geologic modeling due to their flexibility especially for representing highly complex geologic structures and fluid flow near multilateral and fractured wellbore trajectories. In recent years, this research topic has received even more attention in the context of the emerging next generation reservoir simulators as well as the new data exchange standard for reservoir characterization, earth and reservoir models [27].

Unconventional reservoirs are characterized by sufficiently low permeabilities so that the pressure depletion from a producing well may not propagate far from the well during the life of a development. This is in contrast to conventional plays where the pressure transients may probe the entire reservoir in weeks to months. The concept of depth of investigation and its application to unconventional reservoirs provide the understanding necessary to describe and optimize the interaction between complex multi-stage fractured wells, reservoir heterogeneity, drainage volumes, pressure depletion, well rates, and the estimated ultimate recovery.

Previous studies have performed unconventional reservoir analysis using more conventional reservoir simulation techniques. High resolution local PEBI grids and global corner point grids have been used to represent complex fracture geometry and conductivity and estimate subsequent well performance. However, these techniques do not provide the more geometric understanding provided by the depth of investigation and drainage volumes. The application of the depth of investigation to heterogeneous reservoirs can be obtained from an asymptotic expansion of the diffusivity equation leading to the Eikonal equation which describes the propagation of the pressure front. This equation is solved using a Fast Marching Method to calculate a diffusive time of flight at every location within the domain. The diffusive time of flight is directly related to pressure front propagation. Unlike in a reservoir simulator, this frontal propagation is determined in a single non-iterative calculation, which is extremely fast.

The Fast Marching Method is extended for solution of the Eikonal equation to complex simulation grids including corner point and unstructured grids. This allows the rapid approximation of reservoir simulation results without the need for flow simulation, and also provides the well drainage volume for visualization. Understanding the drainage volume alone is useful for well spacing and multi-stage fracture spacing optimization. Additional potential applications include well trajectory and hydraulic fracture location optimization, reservoir model screening and ranking, matrix/fracture parameter estimation, uncertainty analysis and production data integration.

Unconventional resources such as shale gas have taken a significant share in the energy supply in the US and the world energy market [21]. The advent and growth of the development of these resources have been driven largely by the advances in technologies such as horizontal well drilling and multistage hydraulic fracturing. However, engineers today still face great challenges in understanding the fundamental mechanisms involved in the production of unconventional reservoirs, from the pore scale to the field scale. Further technology advancement in this area will enable the industry to optimize the unconventional reservoir development by bringing down costs, minimizing risks, and increasing production.

Several recent studies have performed unconventional reservoir analysis using more conventional reservoir simulation techniques [6-9, 16, 19]. The advantage of using traditional numerical simulation is that it can rigorously account for complex fracture geometry, reservoir heterogeneity, rock compaction, pressure dependence of reservoir fluid properties, gas absorption effects, and many other physical processes. The disadvantage is that such numerical simulations can be very time consuming, particularly when high levels of grid refinement are used to accurately model complex fracture geometry, flow in the vicinity of the hydraulic fractures, and interaction with natural fracture networks. Because of uncertainties usually encountered in the development of unconventional reservoirs, building and calibrating such detailed numerical models can be difficult and time consuming.

Another approach more frequently applied in practice is the use of various analytical techniques, including decline curve analysis [17, 47] and pressure/rate transient analysis [10, 22, 44]. Decline curve analysis is often used for production forecasts and reserves estimation. Their predictive power relies heavily on the quantity and quality of completion and production data in a particular field as well as the experience gathered during the field development. There is no physical model associated with the decline curve analysis. The pressure/rate transient analysis incorporates simplified completion and reservoir models, such as homogeneous reservoirs with fully-penetrated, equally-spaced, symmetric rectangular and planar hydraulic fractures. A small number of model parameters, e.g. fracture permeability and fracture half length, can easily be calibrated from the observed flow regimes and then well production can be predicted based on the calibrated model. These techniques are very useful especially when there is limited subsurface information. However, the analytical models become inadequate when one has a better understanding of the reservoir heterogeneity and the complex hydraulic fracture geometry through integration of geological, geophysical, and engineering data.

A novel approach based on the Fast Marching Methods (FMM) for unconventional reservoir analysis [13, 37, 50, 51] is proposed herein. The proposed approach stands midway between the two approaches discussed above, i.e. conventional numerical simulation and simplified analytical models. As the development of a particular field progresses, more and more data is acquired and the reservoir analysis needs to evolve from purely analytical in the early stages to full-field numerical simulation in a mature stage. The FMM approach may serve as a bridge for this transition and a screening tool to select models for the more expensive traditional reservoir simulation. There are two characteristics of the FMM approach that make it well suited for such a purpose. First, the FMM approach is extremely fast. A million-cell model can be simulated in minutes. Second, it is a numerical model capable of handling the same degree of geometrical complexity and reservoir heterogeneity as in traditional reservoir simulation. Previous studies [14, 50, 51] have demonstrated the speed of the FMM approach and how it can provide the understanding necessary to describe and optimize the interaction between complex multi-stage fractured wells, reservoir heterogeneity, drainage volumes, pressure depletion, well rates, and the estimated ultimate recovery. However, these applications are restricted to regular square grid and isotropic permeabilities. The scope of this portion of the description is to extend the FMM approach to complex grids and anisotropic permeabilities.

Unconventional reservoirs are characterized by sufficiently low permeabilities such that the pressure depletion from a producing well may not propagate far from the well during the life of the development. This is in contrast to conventional plays, where the pressure transients may probe the entire reservoir in weeks to months. As a result, the concept of depth of investigation, and its application to heterogeneous reservoirs [14], is now not just important for traditional well test analysis. Instead, it becomes an important means to characterize the production of unconventional wells, since the boundary effects may never be seen during the lifetime of a well and all production may be obtained during the transient flow regime. The traditional depth of investigation for homogeneous reservoirs has already been discussed above. In the presence of reservoir heterogeneity, previous studies [30, 48] derived the Eikonal equation for the pressure front propagation and introduced the concept of the diffusive time of flight using the asymptotic ray theory from geometric optics and seismology. Similar concepts were developed earlier in the context of diffusive electromagnetic imaging [49]. By applying asymptotic expansion to the diffusivity equation, it can be shown that in the high frequency limit the pressure front propagation in an isotropic medium can be described by the Eikonal equation:

$$\sqrt{\alpha}\|\nabla\tau(\vec{x})\|=1 \quad (12)$$

In this equation, the unknown $\tau(x)$ is called the diffusive time of flight. Along a ray path, $\tau$ can be calculated from the following integral $$\tau(r) = \int_0^\tau \frac{1}{\sqrt{\alpha}} dr' \qquad (13)$$

The ray path should satisfy Fermat's principle, which means that it is the one which minimizes the line integral of τ [45]. For the purpose of characterizing the pressure front propagation, τ is conceptually a measure of distance rather than time and is analogous to r in Equation 9. In fact, the contours of τ have been related to the propagation time τ of the pressure front through the following equation [26,48]:

$$\tau = \sqrt{\beta t} \qquad (14)$$

The reservoir heterogeneity is embedded in the variable τ. This relationship will be extended below, in the context of an analytic approximation to the diffusivity equation, but in general, the linearity of τ with √t is no longer satisfied in the presence of heterogeneity.

The Fast Marching Method can be used to efficiently solve Equation 12 to compute the pressure front propagation. It is a single-pass method which utilizes the fact that the value of $\tau(\vec{x})$ for the first-order PDE depends only on the value of τ along the characteristic(s) passing through the point $\vec{x}$ [37]. Thus, the solution of τ can be constructed in an ordered one-pass fashion from smaller values of τ to larger values. The basic framework of the Fast Marching Method comprises the following steps [39]:

1. Label all grid nodes as unknown;
2. Assign τ values (usually zero) to the nodes corresponding to the initial position of the propagating front and label them as accepted;
3. For each node that is accepted, locate its immediate neighboring nodes that are unknown and label them as considered;
4. For each node labeled considered, update its τ value based on its accepted neighbors using the minimum of local solutions of Equation 12 discussed later;
5. Once all nodes labeled considered have been locally updated, the node is picked which has the minimum τ value among them and label it as accepted; and
6. Go to step 3 until all nodes are accepted.

In a 5-stencil Cartesian grid, these steps can be illustrated in FIGS. 3A-3F [50]. One point is put as the initial position of the propagating front and label it as accepted (solid) as shown in (a). Then its immediate neighbors A, B, C, and D are marked as considered (circle) as shown in (b). After the τ values of A, B, C and D have been updated, the smallest one (suppose it is A) is picked and marked as accepted as shown in (c). Then its neighbors E, G and F are added into the considered as shown in (d). These steps will repeat for the next accepted point (suppose it is D) as shown in (e) and (f). Local update of the τ value using Equation 12 for the 5-stencil Cartesian grid can be written with the standard finite difference notation as [37]:

$$\max(D_{ij}^{-x}\tau, D_{ij}^{+x}\tau, 0)^2 + \max(D_{ij}^{-y}\tau, -D_{ij}^{+y}\tau, 0)^2 = \frac{1}{\alpha} \qquad (15)$$

Here the standard finite difference operator D for ±x directions can be written as $D_{ij}^{-x} = (\tau_{i,j} - \tau_{i-1,j})/\Delta x$ and $D_{ij}^{+x} = (\tau_{i+1,j} - \tau_{i,j})/\Delta x$. Similar equations hold for the ±y and the ±z directions. In Equation 15, τ values at unknown points are regarded as infinite and the "max" function is used to guarantee the "upwind" criteria. Equation 15 leads to a quadratic equation and its maximum positive root gives the τ value at point (i,j). Alternatively, one can calculate τ values from each of the four quadrants (bottom-left, bottom-right, top-left, and top-right) by ordinary finite difference formulation and then take the minimum τ value obtained.

Equation 12 describes an isotropic case, in which the speed of the front propagation only depends on the location with isotropic permeability distribution. For more general frontal propagation problems, the front propagation speed will also depend on the direction in which the front is travelling. For anisotropic permeability, the Eikonal equation can be written using the permeability tensor $\bar{k}$ as [13]:

$$\vec{\nabla}\tau(\vec{\tau})\cdot\bar{k}\cdot\vec{\nabla}\tau(\vec{x}) = \phi\mu c_t \qquad (16)$$

The solution of Equation 16 in corner point grids will now be discussed.

Corner point grids are widely used in reservoir simulation due to their flexibility in conforming to geologic structures and horizons [35]. The equations which describe the corner point cell geometry and associated tangent and normal vectors will now be described. Following [35], the geometry of a corner point cell is defined by the tri-linear isoparametric mapping from the unit cube (α, β, γ) to physical space (x, y, z).

The tri-linear mapping from the unit cube point x=(α, β, γ) to physical point x=(x, y, z) as follows:

$$x = x_{000}(1-\alpha)(1-\beta)(1-\gamma) + x_{100}\alpha(1-\beta)(1-\gamma) + \qquad (17)$$

$$x_{010}(1-\alpha)\beta(1-\gamma) + x_{110}\alpha\beta(1-\gamma) + x_{001}(1-\alpha)(1-\beta)\gamma + x_{101}\alpha(1-\beta)\gamma + x_{111}\alpha\beta\gamma$$

where the points $x_{ijk}$ are the eight cell corners. From this mapping three tangent vectors are defined $$\vec{t}_i = \frac{\partial x}{\partial \hat{x}_i} \quad i = 1, 2, 3 \qquad (18)$$

where $\hat{x} = (\alpha, \beta, \gamma)$, and three normal vectors $$\vec{n}_i = \vec{t}_j \times \vec{t}_k \quad i,j,k=1, 2, 3 \text{ cyclic} \qquad (19)$$

The following relationships are provided $$\vec{t}_i \cdot \vec{n}_j = \delta_{ij} \qquad (20)$$

where $\delta_{ij}$ is the Kronecker delta and J is the Jacobian, and $$\nabla = \sum_{i=1}^{3} \nabla \hat{x}_i \frac{\partial}{\partial \hat{x}_i} = \sum_{i=1}^{3} \frac{1}{j} \vec{n}_i \frac{\partial}{\partial \hat{x}_i} \qquad (21)$$

Equation 26, below, will now be derived based on the isoparametric mapping for corner point cells. Assume that the principle directions of the permeability tensor are along the cell tangent vectors. The principle directions of the permeability tensor are dyads constructed from the unit vectors associated with the tangents: $\vec{t}_i/t_i$ (i=1, 2, 3). In the reference space (unit cube), the permeability can be written as a diagonal tensor diag($k_i$). The transformation matrix T is obtained by putting together the unit vectors associated the principle directions as column vectors, i.e. $T = [\vec{t}_1/t_1, \vec{t}_2/t_2, \vec{t}_3/t_3]$. Thus the permeability tensor in the physical space is written as $\bar{k} = T\text{diag}(k_i)T'$, which reduces to $$\vec{\bar{k}} = \sum_{i=1}^{3} \frac{k_i}{t_i^2} \vec{t_i} \vec{t_i} \quad (22)$$

where $k_i$ is the principle permeability in the I, J, or K direction. Substituting Equations 21 and 22 into the left hand side of Equation 26, $$\vec{\nabla}\tau(\vec{x}) \cdot \vec{\bar{k}} \cdot \vec{\nabla}\tau(\vec{x}) = \sum_{i=1}^{3}\sum_{j=1}^{3}\sum_{k=1}^{3} \frac{1}{J}\vec{n_i} \frac{\partial \tau}{\partial x_i} \cdot \frac{k_j}{t_j^2} \vec{t_j}\vec{t_j} \cdot \frac{1}{J}\vec{n_k} \frac{\partial \tau}{\partial \hat{x}_k} \quad (23)$$

Applying Equation 20, $$\vec{\nabla}\tau(\vec{x}) \cdot \vec{\bar{k}} \cdot \vec{\nabla}\tau(\vec{x}) = \sum_{i=1}^{3}\sum_{j=1}^{3}\sum_{k=1}^{3} \frac{\partial \tau}{\partial x_i} \cdot \frac{k_j}{t_j^2} \frac{\partial \tau}{\partial \hat{x}_k} \delta_{ij}\delta_{jk} \quad (24)$$

This reduces to $$\vec{\nabla}\tau(\vec{x}) \cdot \vec{\bar{k}} \cdot \vec{\nabla}\tau(\vec{x}) = \sum_{i=1}^{3} \frac{k_i}{t_i^2} \left(\frac{\partial \tau}{\partial \hat{x}_i}\right)^2 \quad (25)$$

This leads to Equation 26.

In analogy to the derivation of flow equations in corner point cells, the isoparametric mapping is performed as discussed above. If one assumes that the principle directions of the permeability tensor are aligned with the cell edges (tangent vectors), following the derivation above, Equation 16 can be written in the following form $$\sum_{i=1}^{3} \frac{k_i}{t_i^2}\left(\frac{\partial \tau}{\partial x_i}\right)^2 = \phi\mu c_t \quad (26)$$

Here $k_i$ and $t_i$ are the permeabilities and length of tangent vectors in I, J, and K directions. The gradient of $\tau$ in Equation 26 is now taken in the unit cube under the reference coordinate variables $\hat{x}_i$.

Figure 4:
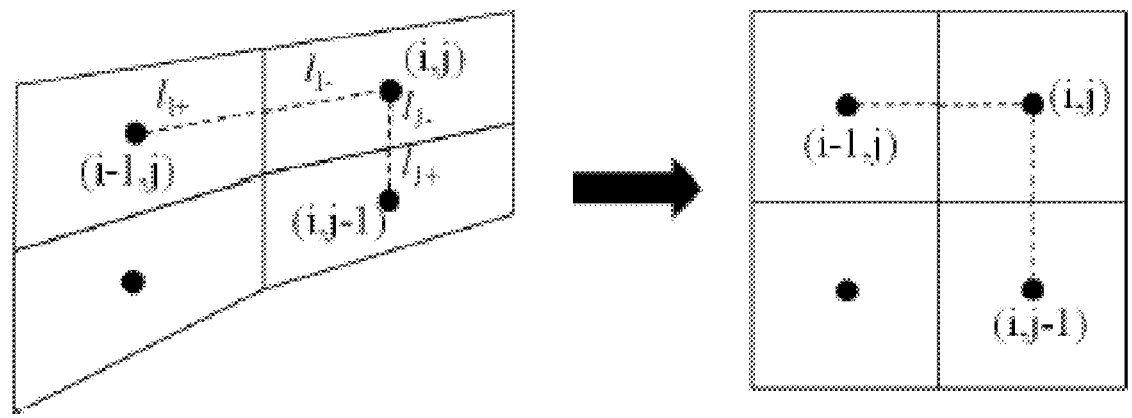
FIG. 4 depicts a 2D example of corner point grid isoparametric mapping and discretization for Equation 16.

For discretization of Equation 26, it will be assumed that the distortion of the corner point grid is locally mild, so that the tangent vector at the center of the cell can be used as an approximation. Here the 5-stencil scheme (or 7-stencil scheme for 3D) was chosen for discretization. Extensions to more complicated 9-stencil scheme (or 27-stencil scheme for 3D) can also be used (see later discussion of unstructured grid). Because the rock properties are usually associated with cells in reservoir models, the pressure front propagation speed will change between two cell centers where the $\tau$ values are to be calculated. In analogy to transmissibility calculations for solving flow equations, properties from the two half cells are combined to get an average speed for the pressure front in each principle direction I, J or K. FIG. 4 shows an example of 2D isoparametric mapping and the lower left quarter for cell (i, j) in the 5-stencil scheme. The discretization of Equation 26 can be written for this case as $$\frac{(\tau_{i,j} - \tau_{i-1,j})^2}{s_I^2} + \frac{(\tau_{i,j} - \tau_{i,j-1})^2}{s_J^2} = 1 \quad (27)$$

where $s_I$ and $s_J$ are the average "slowness" (inverse to pressure front propagation speed) in the reference grid $$s_I = \frac{l_{I+}(i-1,j)}{\sqrt{\alpha_I(i-1,j)}} + \frac{l_{I-}(i,j)}{\sqrt{\alpha_I(i,j)}} \quad (28)$$

$$s_J = \frac{l_{J+}(i,j-1)}{\sqrt{\alpha_J(i,j-1)}} + \frac{l_{J-}(i,j)}{\sqrt{\alpha_J(i,j)}} \quad (29)$$

Here $\alpha_I$ and $\alpha_J$ are diffusivity in I and J directions respectively. $l_{I+}$, $l_{I-}$, $l_{J+}$, and $l_{J-}$ are distances from cell centers to face centers as illustrated in FIG. 4. The same local solution has to be performed for the same cell (i,j) based on the other three pairs of neighbors and then the smallest $\tau$ value obtained from these solutions should be used as the updated value for cell (i, j). Extension of Equations 27, 28 and 29 to 3D are straightforward and eight local solutions need to be performed for each cell.

Figures 5A, 5B:
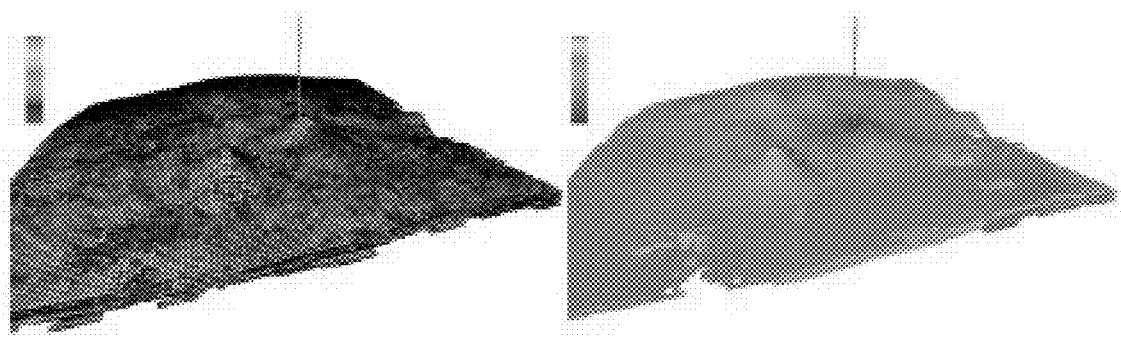
FIGS. 5A-5C depict a synthetic example showing Fast Marching Method in corner point grid.
Figure 5C:
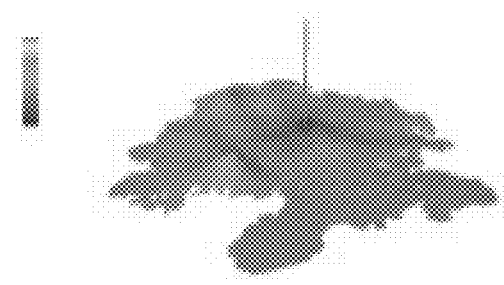

For illustration purposes, FIGS. 5A-5C show a synthetic example showing Fast Marching Method in a 3D corner point grid. FIG. 5A shows a heterogeneous permeability field with a vertical well. FIG. 5B shows the calculated diffusive time of flight (cells with infinity values are not shown). FIG. 5C shows the cells with diffusive time of flight smaller than a specified cutoff value. The diffusive time of flight can be related to physical time using Equation 14. Then, the results in FIG. 5C will approximate the drainage volume at that time.

Figure 6B:
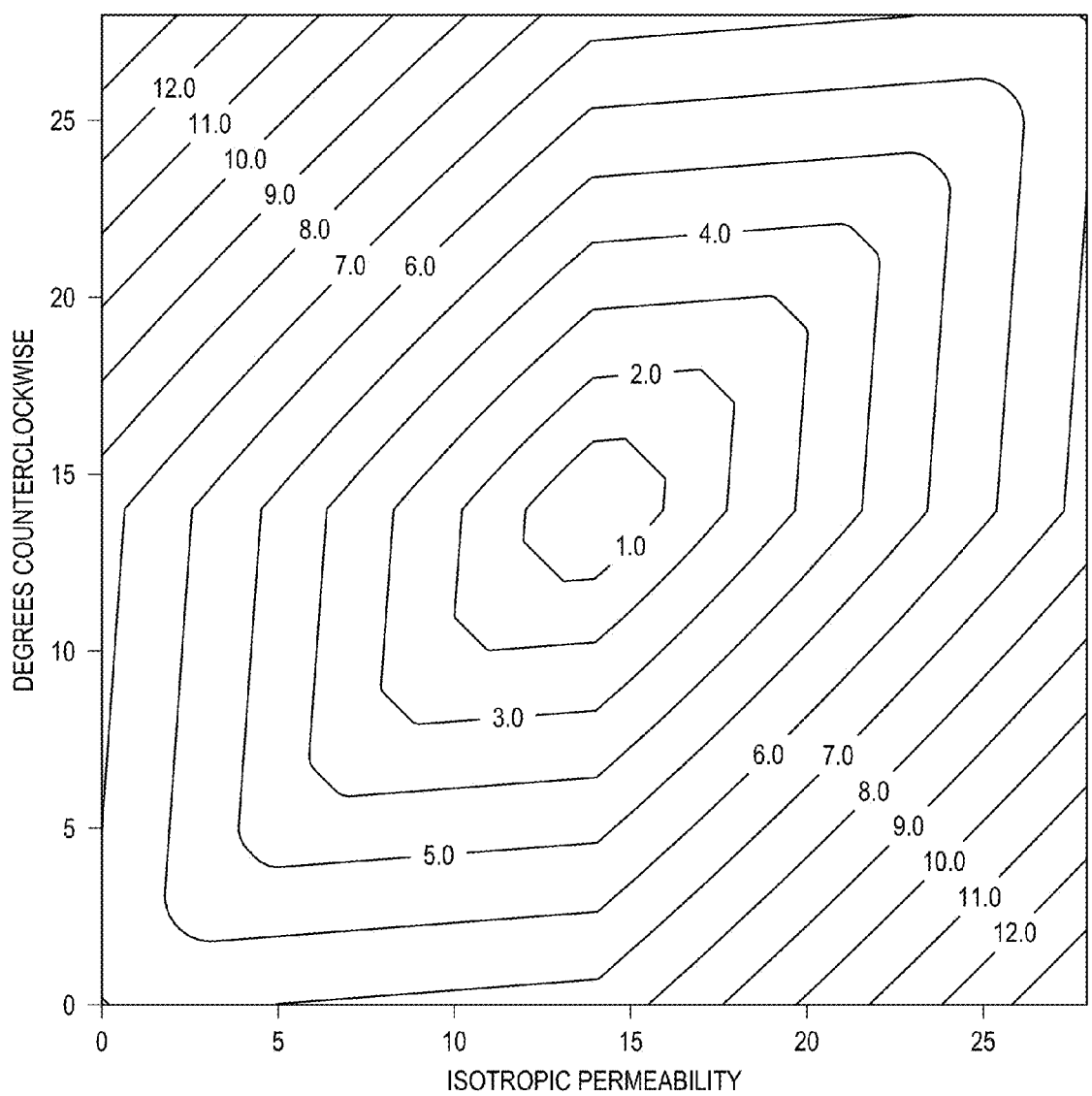
Figure 6C:
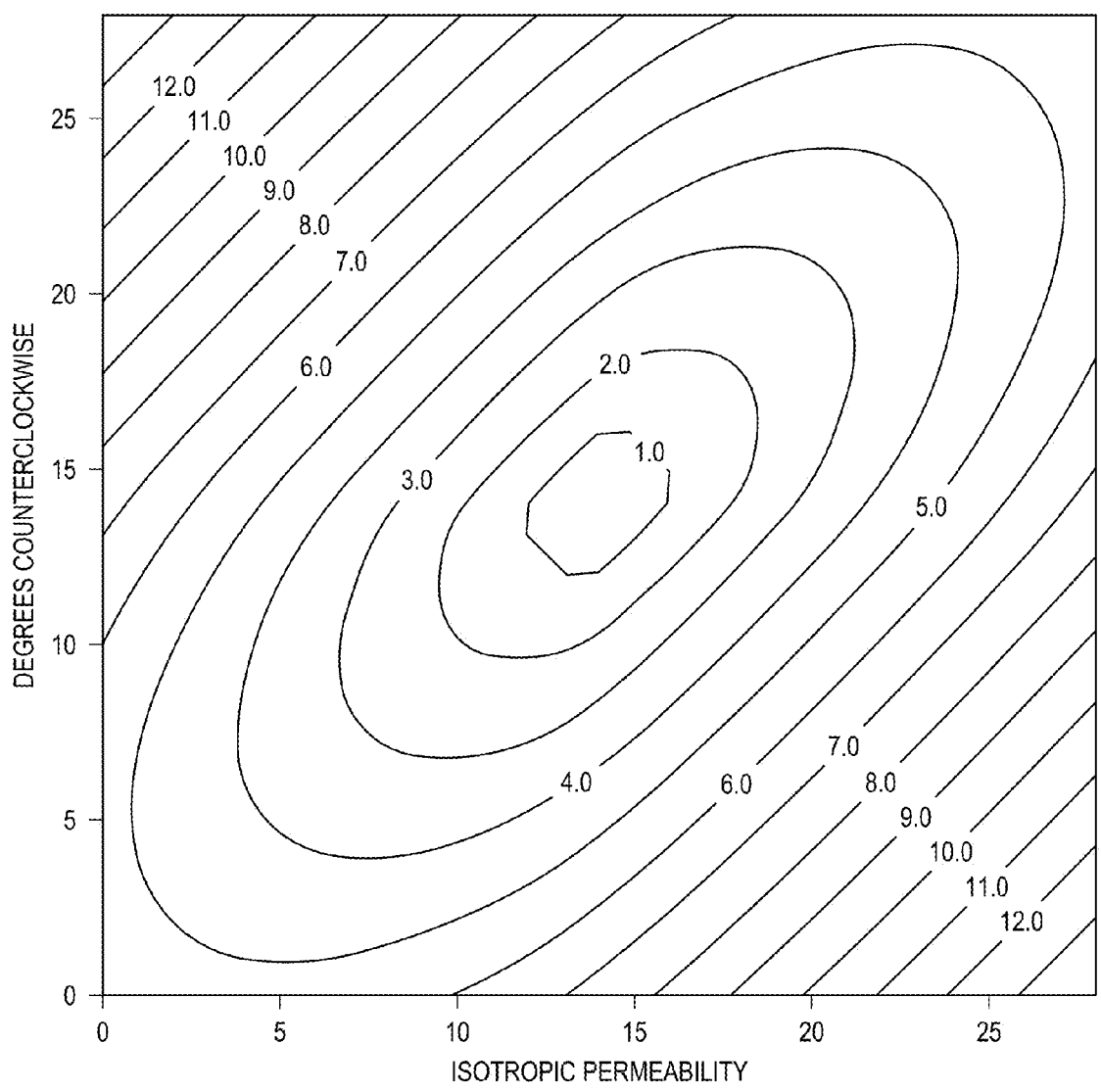
Figure 7B:
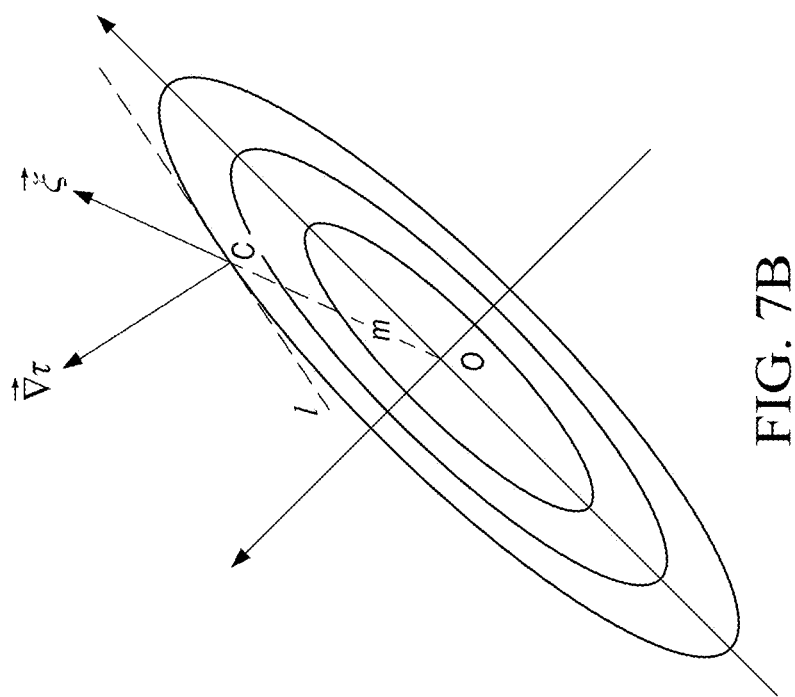
FIGS. 7A-7D illustrate the causality issues for isotropic and anisotropic cases.
Figure 7A:
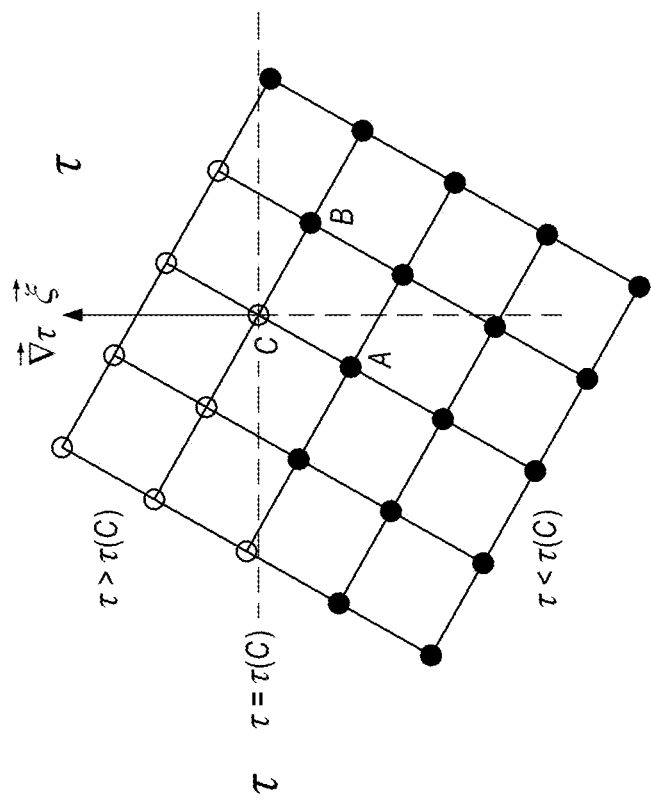
Figure 7D:
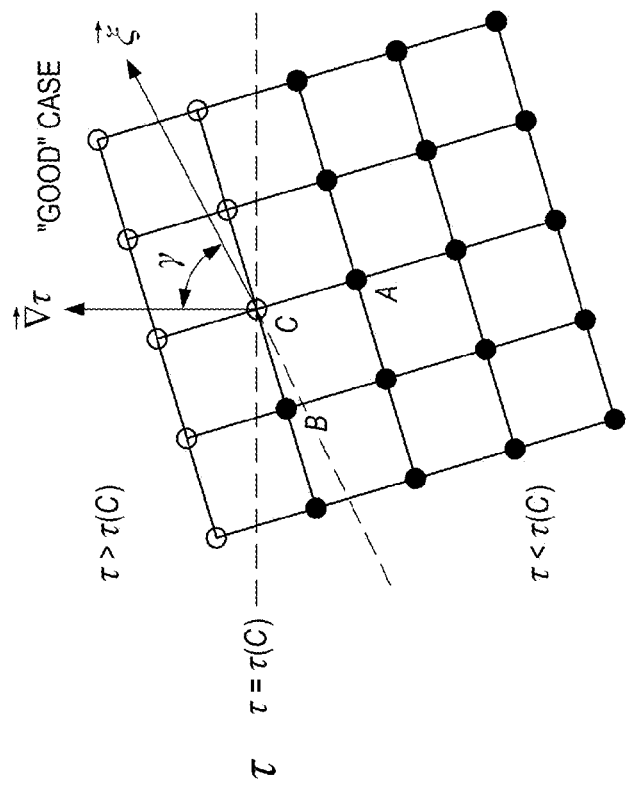
Figure 7C:
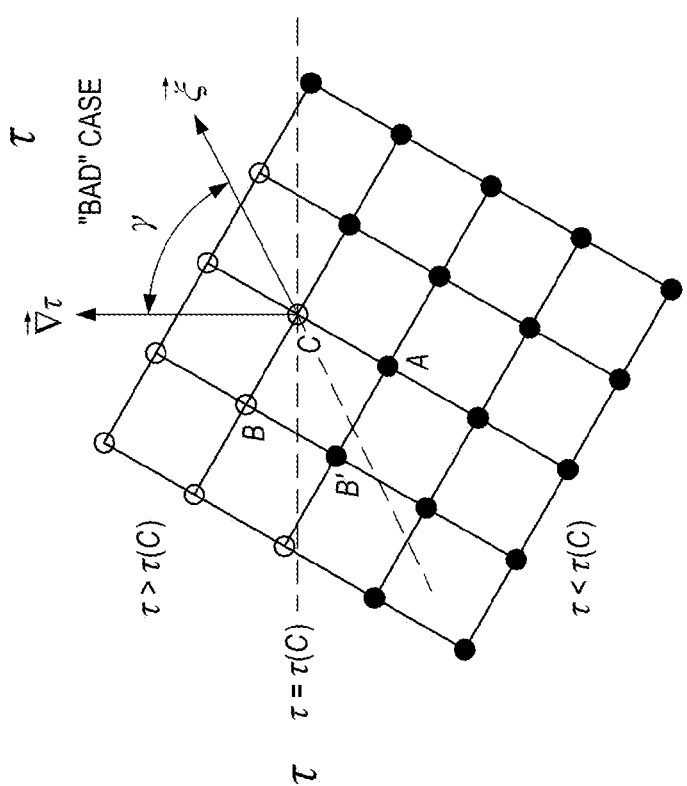

Why the isotropic Fast Marching Method will not produce acceptable results for general anisotropic cases will now be discussed. FIGS. 6A-6C show one simple 2D example to illustrate this point for a monotonically outward propagating front from a point source using the isotropic Fast Marching Method in a 5-stencil square grid. FIG. 6A shows the solution for an isotropic case. FIG. 6B shows the solution for an anisotropic case with the major axis of anisotropy 45 degrees counterclockwise to the x axis. The solution for the anisotropic case is clearly not acceptable. The correct solution for the front propagation is shown in FIG. 6C and will be discussed later. The reason for the incorrect solution is the violation of the so-called "causality condition" [41] as illustrated by FIGS. 7A-7D. The $\tau$ value at C is to be updated from its immediate neighbors A and B only if the angle ACB contains the characteristic direction. In FIGS. 7A-7D, solid dots represent points that have been accepted and circles represent points that have not been accepted. For isotropic case as shown in FIG. 7A, because the gradient direction $\nabla \tau$ always aligned with the characteristic direction and lies within the angle ACB, both the values at A and B have already been accepted before the $\tau$ value at C is calculated. The causality condition ($\tau_A < \tau_C$ and $\tau_B < \tau_C$) is always satisfied ensuring a good approximation of the characteristic direction and an accurate estimation of the $\tau$ value at C. For anisotropic cases in general, the gradient direction is not the same as the characteristic direction as illustrated by FIG. 7B. FIG. 7C shows a possible "bad case" where the characteristic direction and the gradient direction do not lie in the same cell. In this case, the $\tau$ value at point B has not yet been accepted before the calculation of the $\tau$ value at point C. In another word, one has $\tau_B > \tau_C$, which does not satisfy the causality condition. Therefore, the characteristic direction can only be estimated as from A to C, which is far from the true characteristic direction. Following this estimated characteristic direction, the updated T value at point C will be inaccurate. Moreover, this error will accumulate as the front propagates. FIG. 7D shows a possible "good case" where the characteristic direction and the gradient direction are in the same cell. This case is similar to FIG. 7A in that both the τ values at A and B have already been accepted before the τ value at C is calculated. From these examples the causality condition can be generalized as follows: at a certain node the line extending backwards along the characteristic direction must be enclosed by two neighboring nodes which have already been accepted (Sethian and Vladimirsky, 2000). Because the characteristic direction and the gradient direction are not known beforehand, one needs to deal with the possible "bad case" for general anisotropic situations.

There are two approaches to deal with this issue. One approach, known as the expanded neighborhood method, was proposed by [40]. The basic idea of the expanded neighborhood method is to enlarge the neighborhood which supports the calculation of τ value for a particular point. For example, in FIG. 7C if the neighborhood is enlarged by including point B', then the local triangle AB'C which contains the characteristic direction will have two accepted points enclosing the characteristic direction available for the calculation of τ value at C and produce acceptable results. The size of the neighborhood required to always τ produce acceptable results is bounded and its relation to the anisotropy ratio is given by [41]. The other approach, which is called the recursive Fast Marching Method, was proposed by [29]. This method contains a recursive correction step inside the main loop of the ordinary Fast Marching Method. The recursive construction allows one to build the entire "dependency graph" for any nodes and makes sure that the causality relationship is satisfied for the final accepted values. FIG. 6C shows the solution of the same case as FIG. 6B but using the recursive Fast Marching Method leading to more accurate estimation of the front propagation.

Figure 8A:
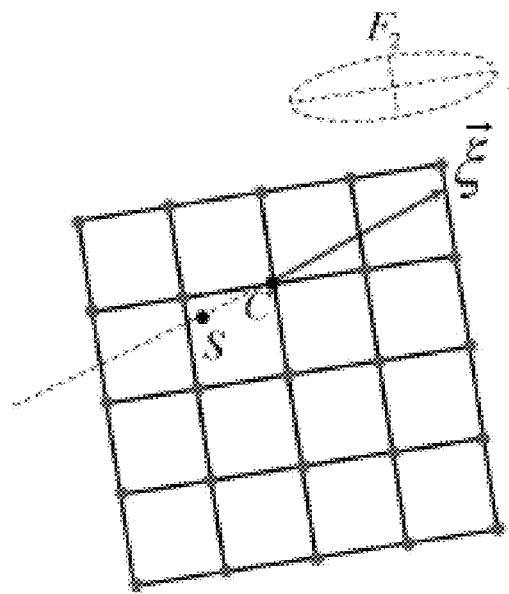
FIGS. 8A-8C illustrate the guarantee of causality relationship if the principle direction of anisotropy is aligned with the grid.
Figure 8B:
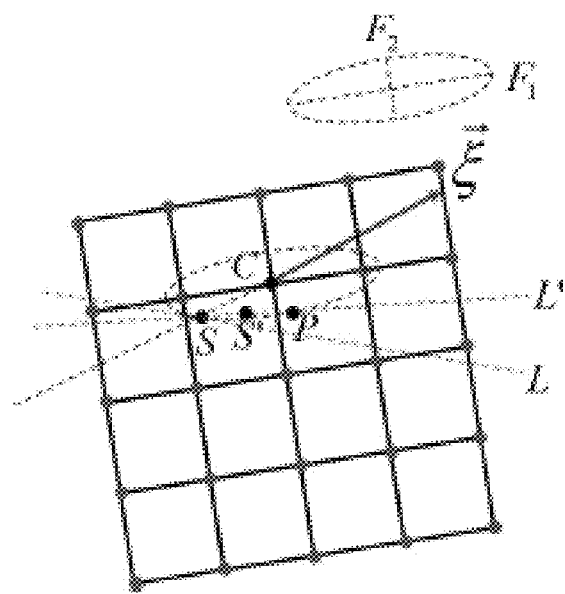
Figure 8C:
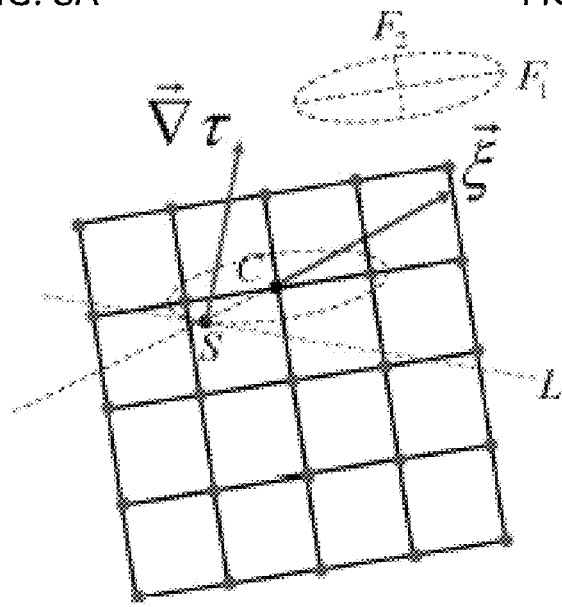
Figure 9A:
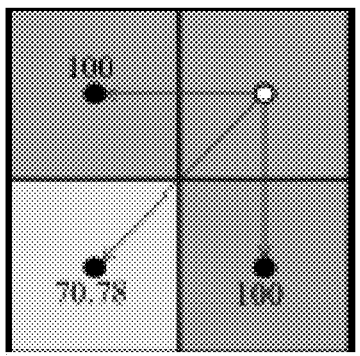
FIGS. 9A-9L depict all twelve different high/low permeability patterns for 2 by 2 local solution.
Figure 9B:
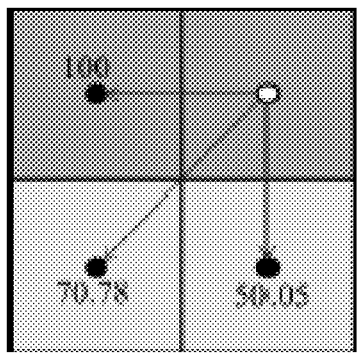
Figure 9C:
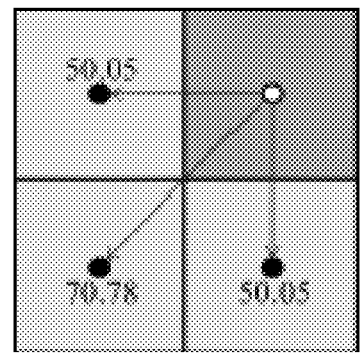
Figure 9D:
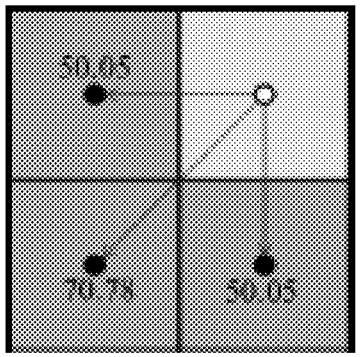
Figure 9E:
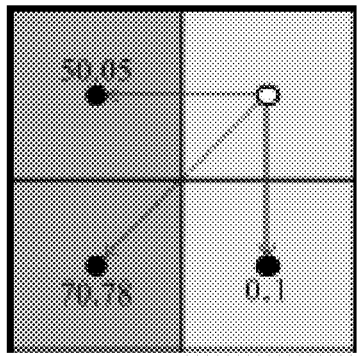
Figure 9F:
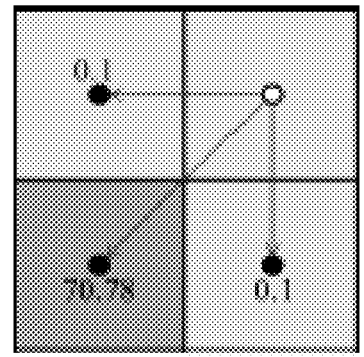
Figure 9G:
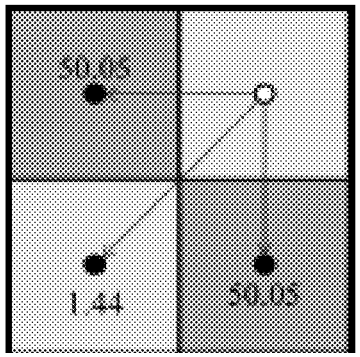
Figure 9H:
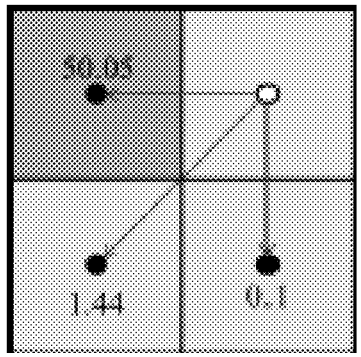
Figure 9I:
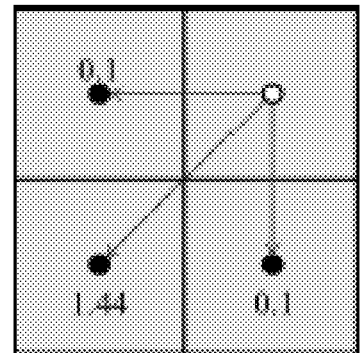
Figure 9J:
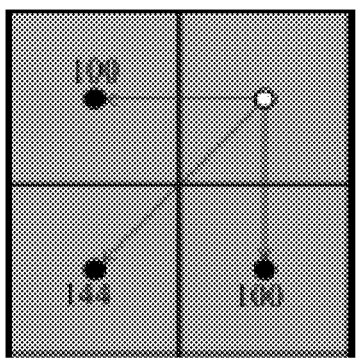
Figure 9K:
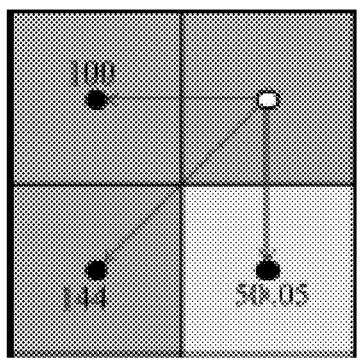
Figure 9L:
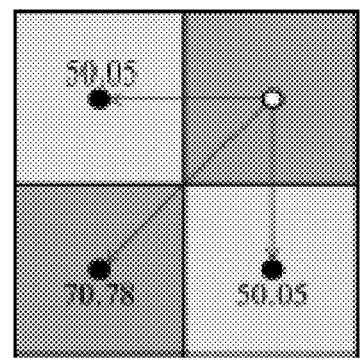

The formulation of the anisotropic fast marching in corner point grid previously discussed can guarantee a causality relationship so that the "bad case" shown in FIG. 7C will not occur. For this, the underlying assumption in the formulation that the principle directions of anisotropy are aligned with local cell edges [3] should be satisfied. As illustrated in FIGS. 8A-8C, suppose the speed of front propagation is given by the anisotropy ellipse which has major axis F1 and minor axis F2, both aligned with the grid. Suppose the characteristic direction at point C is known. It can be shown that the gradient direction will lie in the same cell as the characteristic direction. First, as shown in FIG. 8A, an arbitrary point S is taken close and upwind to point C along the characteristic direction. It is known that the shortest travel time to point C should come from point S. The local level line τ=τ(S) at point S is denoted as L in FIG. 8B. An ellipse of anisotropy is drawn centered at point C and passing through point S. It is shown in FIG. 8B that the line L has to be tangent to the ellipse. This can be proved by contradiction. If the level line τ=τ(S) at point S is not tangent to the ellipse (for example, line L'), suppose that it intersects the ellipse at another point P. Then the point S', which is the midpoint between S and P, will be inside the ellipse. Thus the travel time from S' to C will be smaller than from S to C. This is in contradiction with the assumption that SC is along the characteristic direction $\vec{\xi}$. Therefore, the line L must be tangent to the ellipse. The gradient direction $\nabla\tau$ will be perpendicular to the line L and thus will lie within the same cell as the characteristic direction $\vec{\xi}$. As point S moves in finitely close to point C, the gradient direction shown in FIG. 8C becomes the gradient direction at point C. Therefore, one will have the "good" case as shown in FIG. 6D. Thus, as long as the principle directions of anisotropy are aligned with local cell edges, the causality condition will be satisfied by the proposed formulation.

The previous discussion relies on the assumption that the medium has smoothly-varying properties. However, for the discretized problem, it is possible to have dramatic change in permeability when going from one cell to its neighboring cells. This gives rise to additional concern for the "causality issue" because the travel time updated based on a cell's immediate neighbors in a 5-stencil scheme in 2D (or 7-stencil scheme in 3D) may not be the smallest possible if the diagonal neighboring cells are also taken into consideration. In this portion of the description, this issue will be investigated by doing some numerical experiments.

A 2D regular grid is used to simplify our discussion. First, all possible patterns of high permeability (100 md) sand grid block and low permeability (0.0001 md) non-sand grid block are enumerated in a 2 by 2 local calculation scenario. The upper right corner grid block is taken as the one to be updated in this local calculation. Assuming all other parameters are constant, the direct travel time is calculated from the centers of its two immediate neighbors (bottom and left) and the center of its diagonal neighbor (bottom left) to the center of this grid block. The calculation is done in arbitrary units since the only concern is with the relative value of the travel time. The results are shown in FIGS. 9A-9L. Out of the twelve different possible sand/non-sand patterns, only four situations will have the diagonal travel time smaller than at least one of the two immediate neighbors' travel time. These situations are shown in FIGS. 9A, 9B, 9G, and 9H. In the situations shown in FIGS. 9A and 9G, the front will arrive through the diagonal before both the immediate neighbors. If the flow between diagonal blocks is allowed, the 5-stencil FMM will produce relatively large error, especially for situation shown in FIG. 9G. If direct diagonal flow is not allowed, then the 5-stencil FMM is actually desirable in order to be consistent with finite difference simulation. In the situations shown in FIGS. 9B and 9H, the diagonal travel time is only smaller than one of the immediate neighbors' travel time. In general, the 5-stencil FMM might overestimate the travel time due to the local violation of causality.

Figure 10A:
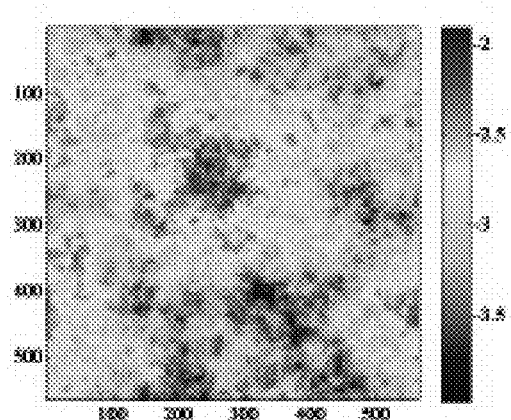
FIGS. 10A-10D depict (a) log(k) of a heterogeneous permeability field varying relatively smoothly, (b) log(k) of a heterogeneous permeability field with high contrast and channelized feature, (c) indicator numbers showing possible local "causality issue" for (a), and (d) indicator numbers showing possible local "causality issue" for (b)
Figure 10B:
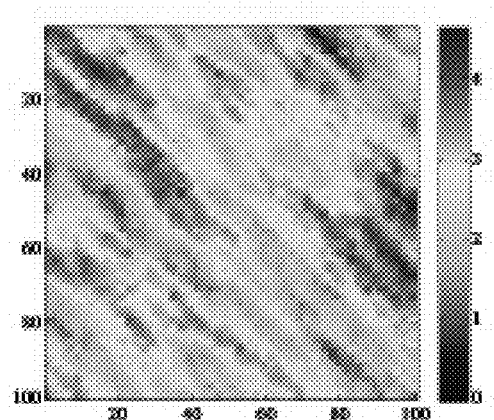
Figure 10C:
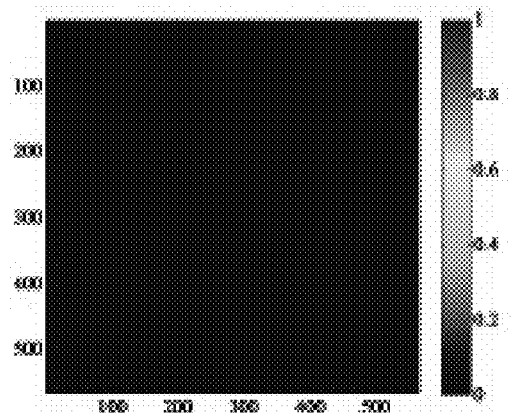
Figure 10D:
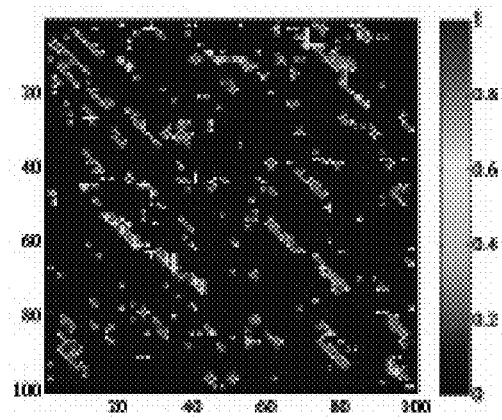

Next an identification of possible local violation of "causality issue" is attempted by doing the above local calculation for each grid block of a heterogeneous permeability field. For each grid block, the travel time is calculated from the grid block to its immediate neighbors (left, right, top, bottom) and its diagonal neighbors (top-left, top-right, bottom-left, bottom-right). For each diagonal neighbor, its travel time is compared with the two adjacent immediate neighbors' travel time. If the diagonal neighbor's travel time is smaller than both of the immediate neighbors' travel time, the grid block's indicator number will be increased by 1. If the diagonal neighbor's travel time is smaller than only one of the immediate neighbor' travel time, the grid block's indicator number will be increased by 0.5. A plot of the indicator numbers for all the grid blocks will show which grid blocks may have potential causality issue. Only two heterogeneous permeability fields were tested as shown in FIGS. 10A-10D. The first one varies relatively smoothly. The second one has local high contrast and channelized features (FIGS. 10A and 10B). For the first permeability field, no potential causality issue is discovered through this method (FIG. 10C). But for the second permeability field, there are some grid blocks that have been identified with potential causality issue (FIG. 10D). These grid blocks are located at the interface between the high permeability streaks and the low permeability regions. This shows that high contrast in permeability may potentially cause "causality issue".

Figure 11A:
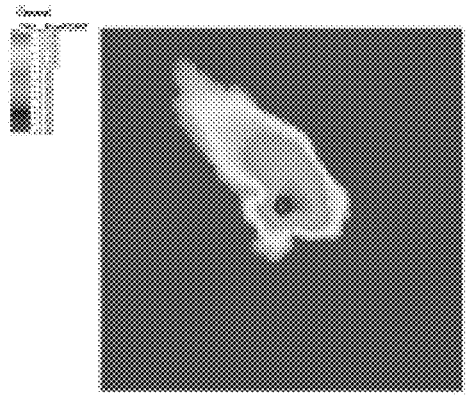
FIGS. 11A-11B depict diffusive time of flight calculated for the permeability field shown in FIG. 10B using FMM based on (a) 5-stencil scheme and (b) 9-stencil scheme.
Figure 11B:
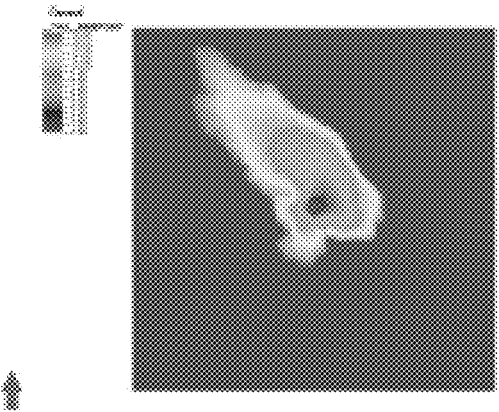
Figure 12A:
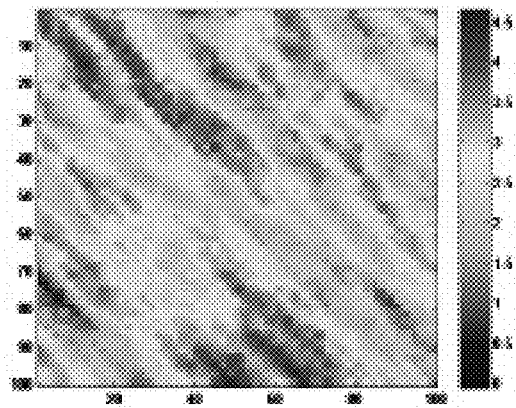
FIGS. 12A-12D depict (a) refined permeability field (800×800) based on the permeability field shown in FIG. 10B, (b) smoothed permeability field from (a) using a running 5-stencil average, (c) indicator numbers showing possible causality issue for (a), and (d) Indicator numbers showing possible causality issue for (b)
Figure 12B:
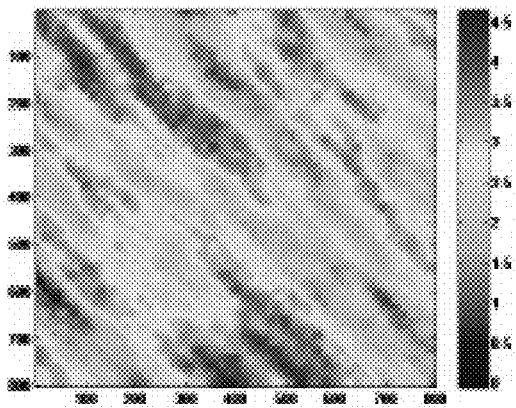
Figure 12C:
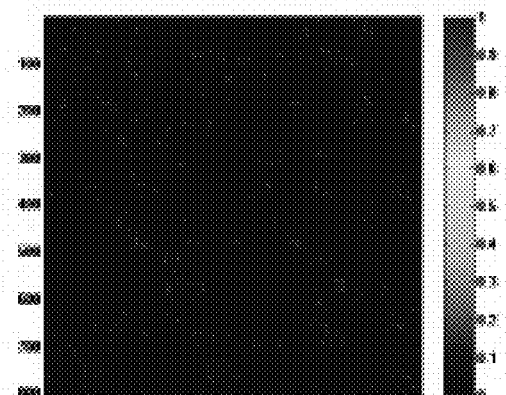
Figure 12D:
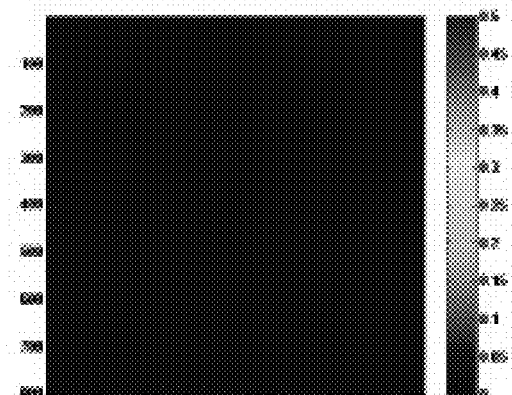
Figure 13A:
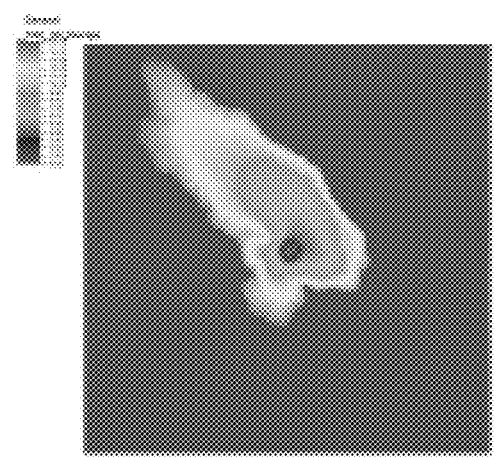
FIGS. 13A-13B depict the diffusive time of flight calculated using the 5-stencil FMM scheme for (a) permeability field in FIG. 12A and (b) permeability in FIG. 12B.
Figure 13B:
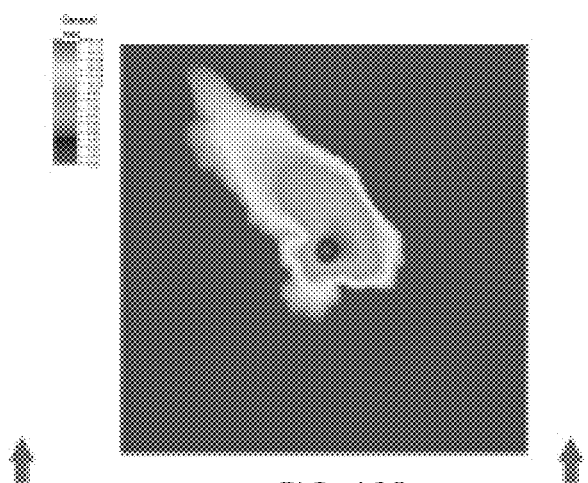

Based on the permeability field shown in FIG. 10B, some numerical experiments were performed to show the effect of the "causality issue" on the diffusive time of flight calculation using the FMM. FIGS. 11A-11B compare the FMM results obtained using the 5-stencil scheme versus the 9-stencil scheme. The well is place in the center of the permeability field. The color bar is the same for both sub-figures and is capped by the same maximum value. Because the 9-stencil scheme takes the diagonal grid block into the local calculation, it is much less affected by the "causality issue". The diffusive time of flight calculated by the 5-stencil scheme is slightly larger than the values calculated by the 9-stencil scheme. Another way to reduce the "causality issue" is to refine and smooth the permeability field (800×800) as shown in FIGS. 12A-12D. FIG. 12A shows the same permeability field as FIG. 10B but with much finer grid. Each original grid block is refined into 8×8 smaller grid blocks which retain the same permeability as the original coarse grid block. It can be see that the indicator numbers will be nonzero for a much smaller portion of the total grid blocks as shown in FIG. 12C. By further smoothing the permeability field using a running 5-stencil average (FIG. 12B) the indicator numbers of the permeability field can be completely removed (FIG. 12D). The diffusive time of flight calculated by the 5-stencil FMM scheme is shown in FIGS. 13A-13B for the permeability fields in FIGS. 12A-12B, respectively. It is observed that refining and smoothing the permeability field produce similar results compared to using the 9-stencil scheme for the coarse grid.

Figure 14:
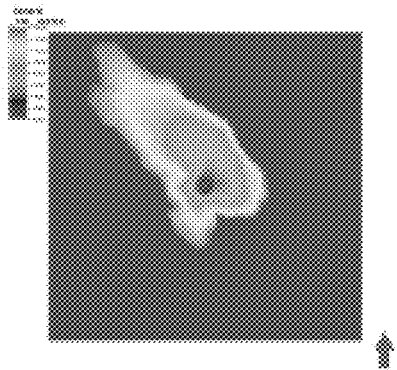
FIG. 14 depicts the diffusive time of flight calculated using the cell vertex based scheme for the permeability field in FIG. 10B.

Another way of dealing with the causality issue is to use the cell vertexes as the solution nodes instead of the cell centers. For a particular cell vertex, each local solution of the Eikonal Equation is always inside a particular cell volume with uniform cell properties. This guarantees "causality" because the nearest neighboring nodes always give the smallest travel time within that particular cell volume. Also because the averaging of properties between cells is avoided, the minimum possible travel time can always be found for the cell corners even if there is locally high permeability contrast between adjacent cells. Once the solution for all vertexes is obtained, the cell center solution can be locally solved within each cell based on the solution at its vertexes. FIG. 14 shows the diffusive time of flight calculated using the cell vertex based approach for the permeability field shown in FIG. 10B. Comparing FIGS. 11A-11B and 13A-13B with FIG. 14, it can be seen that the cell vertex based approach is also effective to avoid the "causality issue".

In general it is observed that the grid blocks where possible violation of the "causality issue" might happen are only located at the boundary of high and low permeability contrast. The fraction of these grid blocks are usually small and can be greatly reduced by grid refinement. The "causality issue" can also be avoided by using the cell vertex based approach. In highly heterogeneous and high-contrast permeability fields, the effect of the "causality issue" is not a significant concern compared with missing the higher order terms in the asymptotic solution as previously discussed.

The basic framework of FMM for unstructured grids is exactly the same as structured grids [40]. The only difference is how the local updates are obtained. Two general local solvers which treat 5-stencil Cartesian grid, 9-stencil Cartesian grid, and unstructured grids in a uniform manner [36] are described below.

The local solution mentioned in step (4) of the basic framework of Fast Marching Method will now be discussed. There are two distinct yet equivalent constructions of the local solver. One is based on the Fermat's principle; the other is based on Eulerian discretization. For simplicity, only the 2D case will be discussed. The extension to 3D is straightforward. Local triangles are constructed first, which are formed by the node considered (in red) and two of its adjacent neighbors. Then one of the local solvers is used to calculate the $\tau$ value based on each of the local triangle. Finally, the $\tau$ value to be updated at the node considered is the minimum value obtained from all the triangles. Both 5-stencil and 9-stencil Cartesian grids, as well as unstructured grids, can be treated in a uniform manner.

Here the derivation of [33, 39, 45] has given a 3D extension. Consider a local triangle ABC and calculate the $\tau$ value at node C. If neither node A nor B have been accepted, this local triangle for node C is discarded and the next one is looked for, because the true solution should not come from this local triangle. If only one node A or B has been accepted, then the $\tau$ value at node C can be simply calculated as a 1D problem either travelling from A to C or from B to C directly. Now the case will be considered when both node A and B have been accepted and the $\tau$ values at nodes A and B are $\tau_A$ and $\tau_B$ respectively. For the lowest order approximation, plane wave assumption is used. Let $\xi$ ($0 \le \xi \le 1$) be the normalized distance from A to S along the segment AB. The travel time $\tau$ at point $S(\xi)$ is approximated by the linear interpolation:

$$\tau_S = (1-\xi)\tau_A + \xi\tau_B \tag{30}$$

According to Fermat's principle, the actual travel time to C corresponds to the minimum of the travel time with respect to path perturbations:

$$\tau_C = \min_{\xi \in (0,1]} \left\{ \tau_S + \sqrt{\frac{\|AB\|^2(\xi - \xi_0)^2 + d_0^2}{\alpha}} \right\} \tag{31}$$

where $S_0(\xi_0)$ and $d_0$ are the normal projection point and the distance of C to AB. For isotropic case, diffusivity $\alpha$ is only a function of location and is taken at C. If the minimizer of the above equation $\xi^*$ corresponds to the point $S^*$, then the direction along $S^*C$ is the approximation of the characteristic direction. The minimization constraint ($0 \le \xi \le 1$) makes sure the causality relationship is satisfied, i.e. the characteristic direction estimated lies inside the triangle and thus $$\tau_C \ge \max\{\tau_A, \tau_B\} \tag{32}$$

This causality relationship makes sure that the acceptance of solution values will always in ascending order. Equation 31 can be solved by setting the derivative to zero $$\tau_B - \tau_A + \frac{\|AB\|^2(\xi - \xi_0)}{\sqrt{\alpha\|AB\|^2(\xi - \xi_0)^2 + \alpha d_0^2}} = 0 \tag{33}$$

This is a quadratic equation for and the solution is $$\xi = \xi_0 \pm \frac{d_0(\tau_A - \tau_B)}{\|AB\|\sqrt{\frac{\|AB\|^2}{\alpha} - (\tau_A - \tau_B)^2}} \qquad (34)$$

The appropriate branch of solution in [0, 1] is selected and the solution can be obtained $$\tau_C = d_0\sqrt{\frac{1}{\alpha} - \frac{(\tau_A - \tau_B)^2}{\|AB\|^2}} + \frac{\|BC\|}{\|AB\|}\tau_A\cos\theta_B + \frac{\|AC\|}{\|AB\|}\tau_B\cos\theta_A \qquad (35)$$

Here the derivation of [36, 40] is followed. Let a be the length of BC and b be the length of AC. Let $\vec{\sigma}_{AC}$ be the unit vector pointing from A to C and $\vec{\sigma}_{BC}$ be the unit vector pointing from B to C. Thus, $$\vec{\sigma}_{AC} = \frac{1}{b}(x_c - x_A, y_C - y_A) \qquad (36)$$

$$\vec{\sigma}_{BC} = \frac{1}{a}(x_C - x_B, y_C - y_B) \qquad (37)$$

Assuming a linear approximation of τ locally, the following finite difference equations are provided $$\frac{1}{b}(\tau_C - \tau_A) = \nabla\tau \cdot \vec{\sigma}_{AC} \qquad (38)$$

$$\frac{1}{a}(\tau_C - \tau_B) = \nabla\tau \cdot \vec{\sigma}_{BC} \qquad (39)$$

If matrix P is defined with rows to be $\vec{\sigma}_{AC}$ and $\vec{\sigma}_{BC}$, then the above equations can be written in matrix form as:

$$\begin{pmatrix} \frac{\tau_C - \tau_A}{b} \\ \frac{\tau_C - \tau_B}{a} \end{pmatrix} = P\nabla\tau \qquad (40)$$

Thus $$\nabla\tau = P^{-1}\begin{pmatrix} \frac{\tau_C - \tau_A}{b} \\ \frac{\tau_C - \tau_B}{a} \end{pmatrix} \qquad (41)$$

Substitute the above equation into the Eikonal equation, $$\left(\frac{\tau_C - \tau_A}{b}, \frac{\tau_C - \tau_B}{a}\right)P^{-1}\alpha(P)^T\begin{pmatrix} \frac{\tau_C - \tau_A}{b} \\ \frac{\tau_C - \tau_B}{a} \end{pmatrix} = 1 \qquad (42)$$

This quadratic equation is solved for $\tau_C$ and the solution should be verified against the causality condition: the solved value of $\tau_C$ can only be accepted, if the update is coming from within that triangle, i.e., only if the computed characteristic direction lies inside the triangle. The reader is referred to [36] for the details of this verification process. If there is no real solution from Equation 42 or the real solutions fail to pass the causality condition, then simply take the minimum value of the two 1D solutions from A and B directly to C as the value of $\tau_C$:

$$\tau_C = \min\left(\tau_A + \frac{b^2}{\alpha}, \tau_B + \frac{a^2}{\alpha}\right) \qquad (43)$$

Both 5-stencil and 9-stencil Cartesian grids as well as triangular unstructured grids can all be treated in a uniform manner. For example, if 5-stencil Cartesian grid is used, the matrix P simply becomes identity matrix and Equation 42 reduces back to the ordinary finite difference discretization in x and y directions. Using 9-stencil Cartesian grid or unstructured grid will provide better spatial resolution to more accurately estimate the characteristic direction and thus generally produce better results than the 5-stencil Cartesian grid.

Compared with the local solver based on Fermat's principle, Equation 42 can be more straightforwardly extended to 3D case in a tetrahedron. It is also more convenient to be extended to anisotropic case (a becomes a tensor) or to use higher order approximations [40]. However, the local solver based on Fermat's principle is more transparent to the physical meaning behind the solution and shows the causality condition in a way much easier to be understood.

Figure 15A:
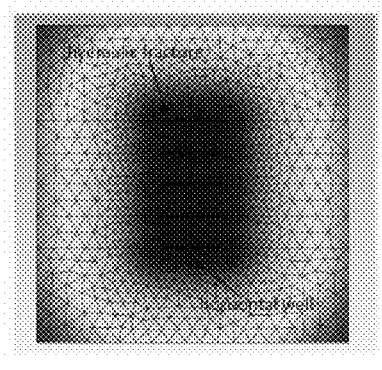
FIGS. 15A-15B depict fast marching examples using unstructured triangular mesh (a) 2D example with isotropic permeability, and (b) 3D example with anisotropic permeability (aspect ratio is 3:2:1)
Figure 15B:
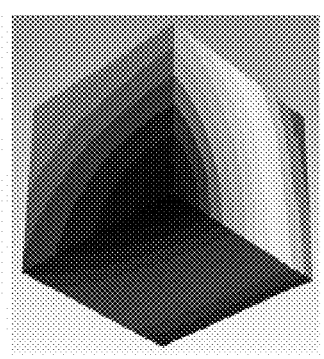

FIGS. 15A-15B show two illustrative examples using triangular mesh in 2D and 3D. FIG. 15A shows the calculated diffusive time of flight in a homogeneous isotropic field with a horizontal well completed by five transverse hydraulic fractures. FIG. 15B shows the point source solution for an anisotropic case in 3D (aspect ratio is 3:2:1).

Figure 16A:
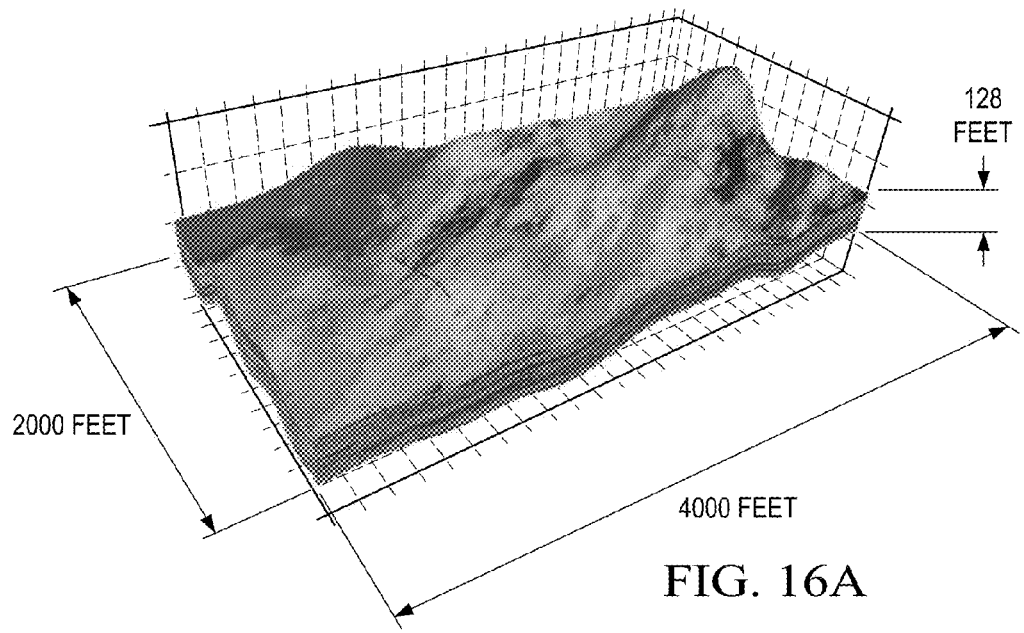
FIGS. 16A-16E depict a synthetic example of a heterogeneous reservoir with five transverse hydraulic fractures: (a) permeability field, (b) the geometry of five transverse fractures, (c) calculated diffusive time of flight, (d) drainage volume in 1 month, and (e) drainage volume in 30 years.
Figure 16B:
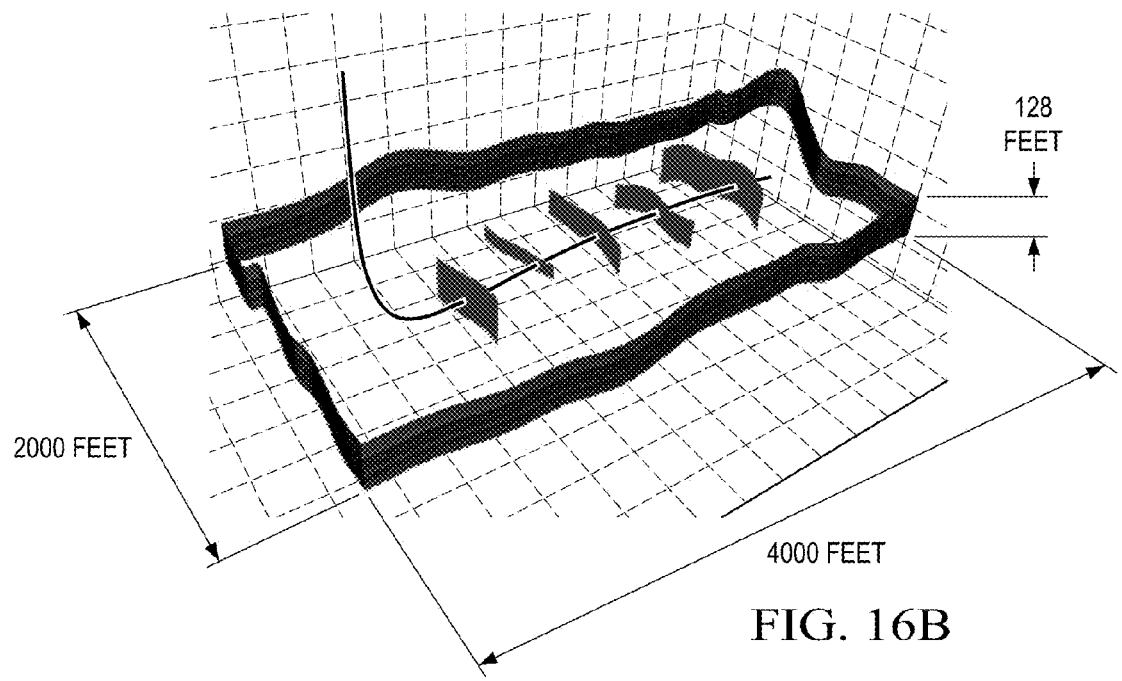
Figure 16C:
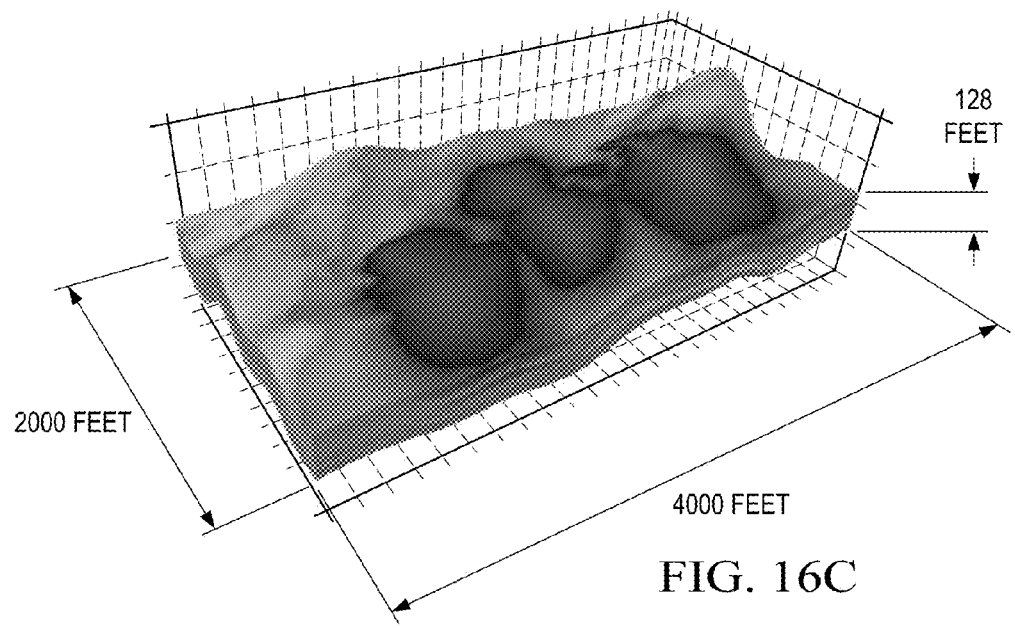
Figure 16D:
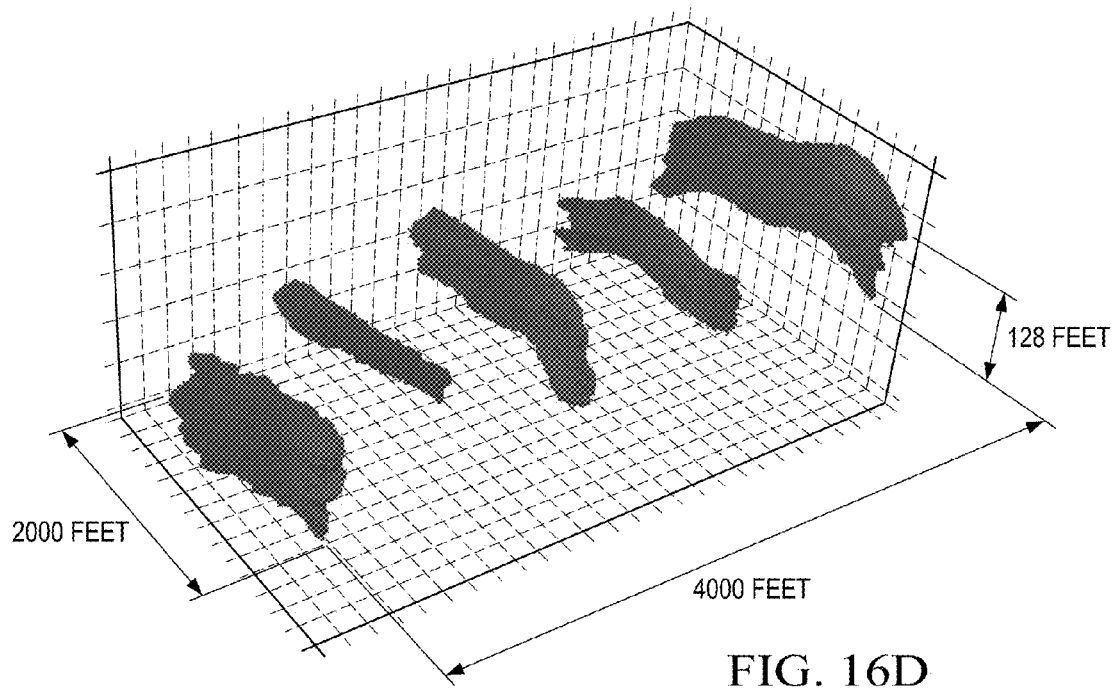
Figure 16E:
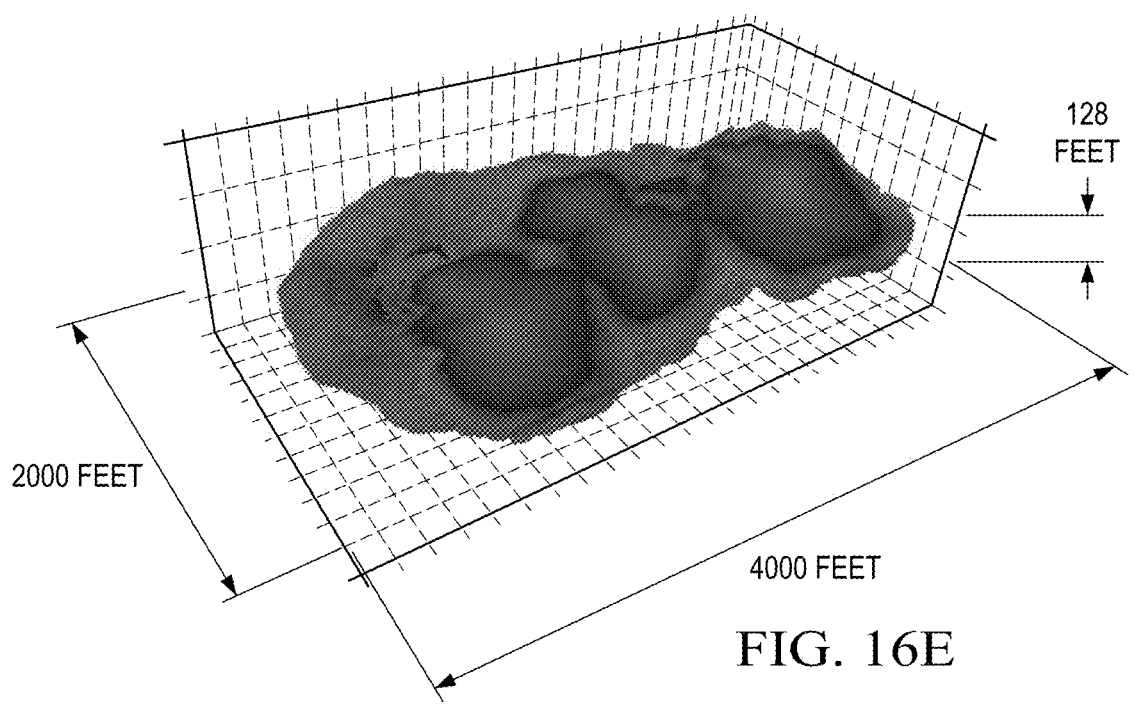

One of the most immediate and effective use of the method is for reservoir drainage volume calculations and visualization. For example, FIGS. 16A-16E depict a synthetic example of a heterogeneous reservoir with five transverse hydraulic fractures: (a) permeability field, (b) the geometry of five transverse fractures, (c) calculated diffusive time of flight, (d) drainage volume in 1 month, and (e) drainage volume in 30 years. FIG. 16A shows a reservoir model with matrix permeability ranges from 1 nanodarcy to 0:001 millidarcy. The $k_z/k_x$ ratio is 0:1 and $k_x=k_y$ for this case. The reservoir is 4000 ft×2000 ft×120 ft and contains 400×200×30 corner point cells. There are 5 transverse hydraulic fractures intersecting a horizontal well as shown in FIG. 16B. These fractures have different half length, height and location in the reservoir. Moreover, using corner point grid enables the simulation of even non-planer fractures such as in this example. The permeability of the hydraulic fractures is set to be 10 millidarcy, while porosity, viscosity, and compressibility are taken to be constant values of 0:1, 0:1cp, and 3×10$^{-5}$ psi$^{-1}$ respectively. FIG. 16C shows the result of the calculated diffusive time of flight using the fast marching approach. By transforming the diffusive time of flight to physical time, the drainage volume can be visualized for any given time. For example, FIGS. 16D and 16E show the drainage volume at 1 month and 30 years respectively. The fast marching calculation for this 2.5 million cell example takes about 15 minutes using a laptop computer. In contrast, finite difference simulation for such multi-million cell model is likely to take much longer computation time.

The formulation of the FMM in corner point grids has been derived, which is one of the most widely used grids for reservoir models. The causality issue associated with permeability anisotropy for smoothly varying medium has been discussed. If the principle directions of the permeability are aligned with the cell edges, which is usually the assumption for reservoir simulation models, the proposed FMM formulation for corner point grids will satisfy the causality relationship. For non-smoothly varying medium, some numerical experiments have been performed to study the effect of possible local violation of causality at the boundary of high permeability contrast. It has also been shown that the FMM approach can be applied to unstructured grid, which is gaining increased acceptance.

The concept of depth of investigation is important to characterize the production in unconventional reservoirs, because the boundary effects will rarely be seen during the lifetime of a well and all the production is obtained during the transient flow regime. This is why the FMM approach can be effectively applied to unconventional reservoirs. As has been demonstrated, it is straightforward to use the FMM for drainage volume calculations and visualization for unconventional reservoirs and wells with multi-stage hydraulic fractures. Furthermore, it will be shown below methods to associate the reservoir pressure with the evolving drainage volume and provide an easy way for well performance characterization and forecasting.

Streamline method underpins the petroleum industry's use of streamline simulation and streamline-based reservoir calibration, management and optimization for convection dominated flow such as water-flood. In the streamline method, the use of the convective time of flight as a spatial variable along streamlines effectively reduces the calculation to only one dimension. Furthermore, the convective time of flight greatly simplifies the calculation of reservoir parameter sensitivities and facilitates data integration and reservoir management optimization. For pressure depletion and associated reservoir processes, the expectation is that the adoption of the diffusive time of flight will allow similar advancements in methods and applications. In this portion of the description, the use of the diffusive time of flight as a spatial coordinate will be explored for development of an effective one-dimensional equation from the pressure diffusivity equation.

Figure 17:
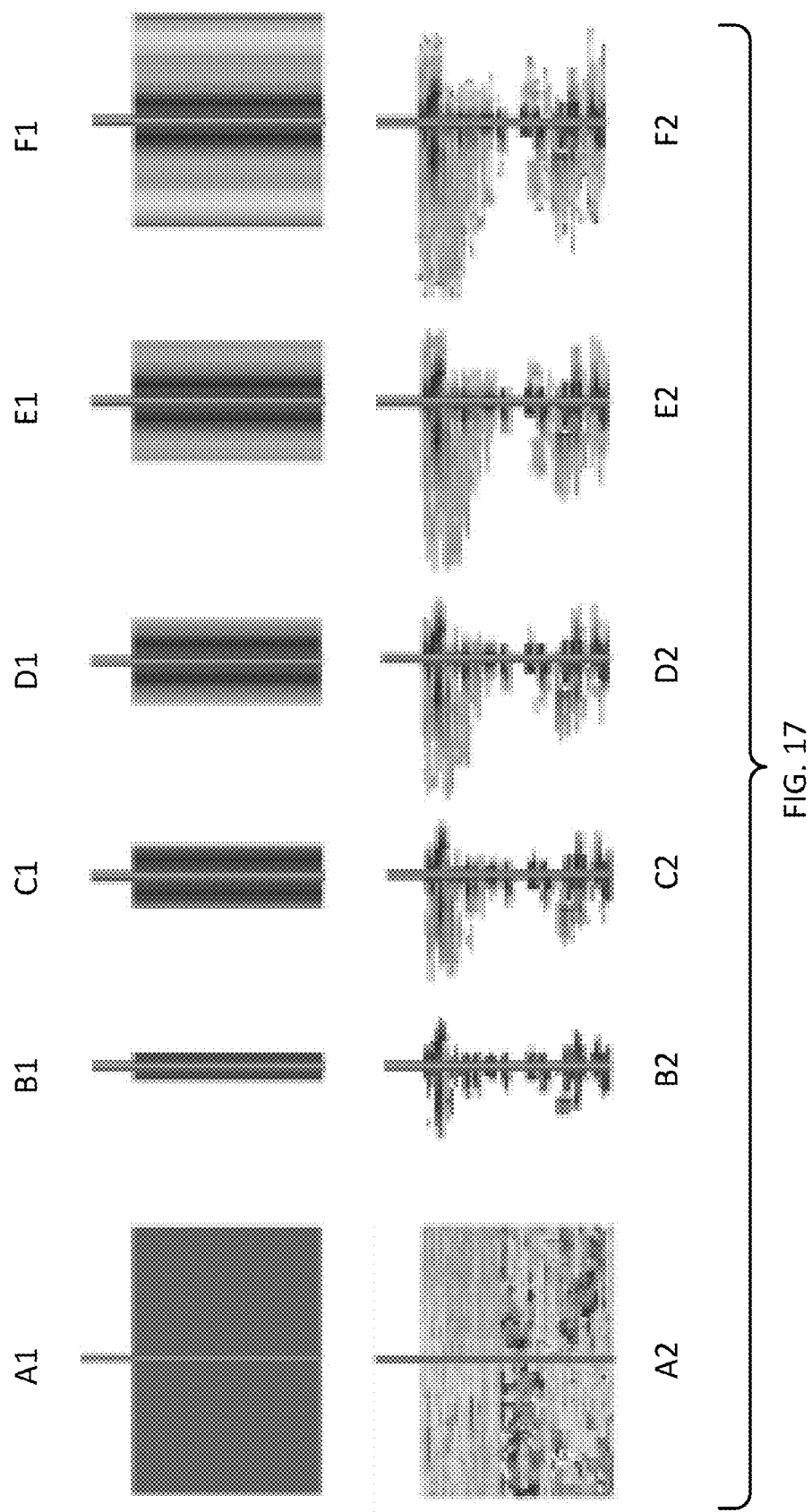
FIG. 17 illustrates the diffusive time of flight in a homogeneous reservoir (upper) and in a heterogeneous reservoir (lower)
Figure 18C:
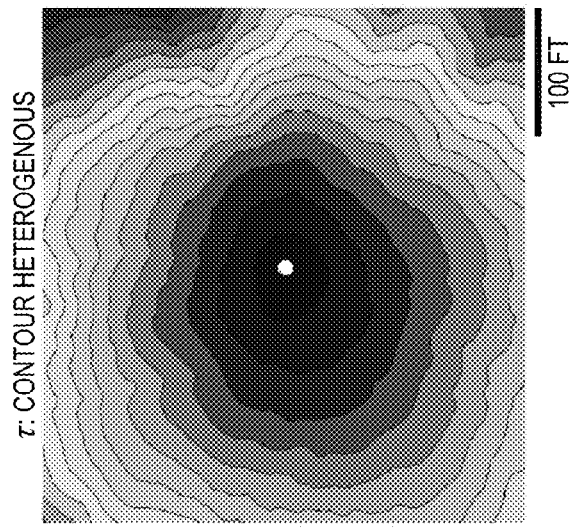
FIGS. 18A-18C illustrate examples of how heterogeneity is captured in $\tau$ as a spatial coordinate.
Figure 18B:
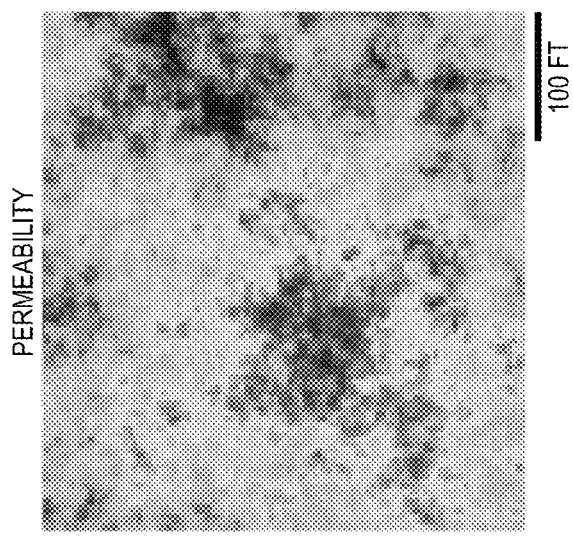
Figure 18A:
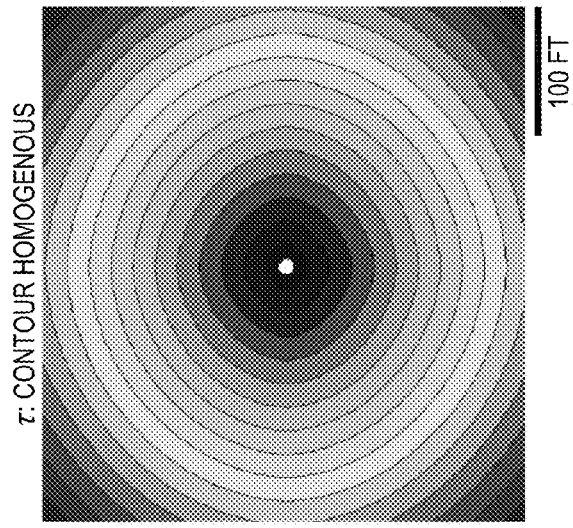

The analysis previously described demonstrates that reservoir heterogeneity information can be integrated into the drainage volume and the diffusive time of flight calculation as illustrated in FIG. 17. Examples of homogeneous reservoirs are designated as A1-F1 in the upper row, and the corresponding heterogeneous reservoirs are designated as A2-F2 in the lower row. Similarly, FIGS. 18A, 18B and 18C are examples of how heterogeneity is captured in $\tau$ as a spatial coordinate. As shown in FIGS. 19A-19E, the 3D to 1D conversion in accordance with the present disclosure is analogous to streamline models, but can be orders of magnitude faster than conventional finite difference.

$$\left\| \frac{\partial(\tau, \psi, \chi)}{\partial(x, y, z)} \right\| = (\nabla \psi \times \nabla \chi) \cdot \nabla \tau = \vec{u} \cdot \nabla \tau = \phi \tag{44}$$

Recent published work has emphasized the calculation of drainage volume and the diffusive time of flight, and a specific pseudo-steady state (PSS) geometric approximation to the pressure and rate [50, 51]. Compared with the PSS geometric approximation, the new method is much more general theoretically in the sense that additional physics can be easily incorporated elegantly into the formulation as necessary (e.g., slightly compressible flow (oil case), compressible flow (gas case), gas adsorption, geomechanical/compaction effects, dual porosity/permeability, multi-phase flow, adsorption/Knudsen diffusion, non-Darcy effects, compositional flows/anomalous phase behavior, etc.). Another advantage is that both pressure and rate boundary conditions can be used without significant change of the formulation and calculation procedures. Finally, the new formulation does not assume PSS condition and produces more accurate results for pressure distributions.

This novel method has many potential applications. For example, it can be used to predict reservoir pressures and rates, especially to optimize multi-stage fracture design in tight and unconventional reservoirs, to optimize well spacing and timing in conventional reservoirs, and to rank and/or calibrate reservoir models against field performance data.

The present disclosure will now be described in more detail. A pseudo-steady state geometric approximation for pressure calculation based on the drainage volume and diffusive time of flight has been proposed [50]. An extension of that solution to transient flow is described in the following. To derive this approximation, the diffusivity equation is first expressed in a mixed form by introducing the Darcy flux q:

$$A(r)\phi c_t \frac{\partial P}{\partial t} = \frac{\partial q}{\partial r} \tag{45}$$

and $$q = \frac{kA(r)}{\mu} \frac{\partial P}{\partial r} \tag{46}$$

Here, $A=2\pi rh$ is the surface area for cylindrical flow, and similarly, $A=4\pi r^2$ is the surface area for spherical flow, and A is a constant for linear flow. The sign convention used here is that q is positive for producers (inwardly directed flux) and $\Delta p$ is the pressure draw-down. Following the chain rule, $$\frac{\partial q}{\partial r} = \frac{\partial q}{\partial V_p} \frac{\partial V_p}{\partial r} = \frac{\partial q}{\partial V_p} \phi A(r) \tag{47}$$

Expressed in terms of the pore volume, Equation 45 can be rewritten as $$c_t \frac{\partial P}{\partial t} = \frac{\partial q}{\partial V_p} \tag{48}$$

Substitution of the flux into this expression leads to the pressure diffusivity equation. The geometric approximation assumes that the Darcy flux is negligible beyond the drainage volume and that within the drainage volume the pressure is approximated by a pseudo-steady state solution [1, 34, 50]. An improved transient flow approximation can be obtained using the WKBJ method. Based on these assumptions, $$c_t \frac{\partial P}{\partial t} = \frac{\partial q}{\partial V_p} \cong -\frac{q_w}{V_p(t)} e^{-\tau^2/4t} \tag{49}$$

where $q_w$ is the well flow rate and $\tau$ is the diffusive time of flight. Therefore, the welltest derivative, evaluated at $\tau=0$, can be obtained by $$\frac{d\Delta P_{wf}}{d\ln t} = -t\frac{dP_{wf}}{dt} = \frac{q_w I}{c_t V_p(t)} \qquad (50)$$

Equation 49 can be integrated to obtain the approximate pressure distribution and bottomhole pressure (BHP). Equation 50 is especially useful for flow regime diagnostics.

The above derivation is under the constant flow rate boundary condition. The constant wellbore pressure boundary condition requires a different formulation as shown by [51].

In order to use Equation 49 and 50, the drainage pore volume must be obtained as a function of time. However, from the FMM calculation what is obtained is the drainage pore volume as a function of the diffusive time of flight, $\tau$. Therefore, it is necessary to convert the diffusive time of flight $\tau$ to real time t. As previously discussed, this conversion can be done straightforwardly for homogeneous cases as shown by Equation 14. For the heterogeneous case, the WKBJ approximation can be used to transform the drainage volume:

$$V_p(t) = \int_{\tau=0}^{\infty} d\tau \frac{dV_p}{d\tau} e^{-\tau^2/4t} = \int_{\tau=0}^{\infty} dV_p e^{-\tau^2/4t} \qquad (51)$$

The depth of investigation can also be calculated $$\tau^2(t) = \int_{\tau=0}^{\infty} dV_p \tau^2 e^{-\tau^2/4t} \Big/ \int_{\tau=0}^{\infty} dV_p e^{-\tau^2/4t} \qquad (52)$$

These integral relations reduce to the known results for homogeneous media, in 1D/2D/3D.

Arguably it is more natural and beneficial to treat $\tau$ as a spatial variable rather than a time variable. This leads to a new formulation of the diffusivity equation using $\tau$ as a spatial variable. The new formulation will reduce exactly to the original diffusivity equation for the 1D, 2D, and 3D homogeneous cases. This makes sure that there is a sound starting point to extend to heterogeneous reservoirs, without the need for any analytic approximations. It will be demonstrated that the $\tau$-coordinate formulation is able to provide a reasonable approximation for heterogeneous reservoirs with much less computational cost than solving the 3D diffusivity equation directly. In addition, it is possible to incorporate additional physical processes into the formulation, which is important in shale gas and shale oil reservoir applications.

The basic formulation for slightly compressible fluid and isotropic medium will now be described. The following assumptions will be used: 1. Darcy flow; 2. No gravity effects; 3. Isotropic properties; 4. Fluid has small, constant compressibility; and 5. No geomechanical effects. Under these assumptions, the diffusivity equation is $$\nabla \cdot \left(\frac{k}{\mu}\nabla P\right) = \phi c_t \frac{\partial P}{\partial t} \qquad (53)$$

The goal is to rewrite Equation 53 from a 3D equation to a 1D equation in space using the diffusive time of flight $\tau$ as the new spatial coordinate variable. To simplify the notation, the diffusivity $\alpha = k/\phi\mu c_t$ is introduced. Then Equation 53 can be written as:

$$\nabla \cdot (\phi c_t \alpha \nabla P) = \phi c_t \frac{\partial P}{\partial t} \qquad (54)$$

The diffusive time of flight $\tau$ is calculated in isotropic medium according to the Eikonal equation $$\|\nabla \tau\| = \frac{1}{\sqrt{\alpha}} \qquad (55)$$

To reduce the diffusivity equation to only one dimension in space, it will be assumed that the pressure only depends on $\tau$ in space. This is equivalent to the assumption that the pressure gradient direction aligns with the $\tau$ gradient direction, or the contour surfaces of pressure P are also the contour surfaces of $\tau$. Based on this assumption, it can be written $$\nabla P \approx \frac{\partial P}{\partial \tau}\nabla \tau = \frac{\partial P}{\partial \tau}\frac{1}{\sqrt{\alpha}}\hat{n}_r \qquad (56)$$

Here the Eikonal equation (Equation 55) is incorporated into the formulation and $\hat{n}_r$ is the unit normal vector to the contour of $\tau$. Substituting Equation 56 into Equation 54, provides $$\nabla \cdot \left(\phi c_t \sqrt{\alpha} \frac{\partial P}{\partial \tau}\hat{n}_r\right) = \phi c_t \frac{\partial P}{\partial t} \qquad (57)$$

The divergence operator in 3D Cartesian space is written as:

$$\nabla \cdot \vec{F} = \frac{\partial F_x}{\partial x} + \frac{\partial F_y}{\partial y} + \frac{\partial F_z}{\partial z} \qquad (58)$$

It is desirable to do a coordinate transformation from (x, y, z) to $(\tau, \psi, \chi)$, where $\tau$ is the diffusive time of flight and the other two coordinates $\psi$ and $\chi$ are defined on the contour surfaces of $\tau$ and are orthogonal to each other and to $\tau$. The divergence operator in the $(\tau, \psi, \chi)$ coordinate system can be written as $$\nabla \cdot \vec{F} = \frac{1}{h_\tau h_\psi h_\chi}\left(\frac{\partial(h_\psi h_\chi F_\tau)}{\partial \tau} + \frac{\partial(h_\tau h_\chi F_\psi)}{\partial \psi} + \frac{\partial(h_\tau h_\psi F_\chi)}{\partial \chi}\right) \qquad (59)$$

Here $h_\tau$, $h_\psi$, and $h_\chi$ are the length of the covariant vectors. For example, $h_\tau$ is the length of the covariant vector $\vec{t}_\tau$, $$\vec{t}_\tau = \frac{\partial \vec{x}}{\partial \tau} = \left(\frac{\partial x}{\partial \tau}, \frac{\partial y}{\partial \tau}, \frac{\partial z}{\partial \tau}\right) \qquad (60)$$

The definitions of the other two covariant vectors are similar. If the divergence operator in Equation 57 is written according to Equation 59, $$\frac{1}{h_\tau h_\psi h_\chi} \frac{\partial}{\partial \tau}\left(\phi c_t h_\psi h_\chi \sqrt{\alpha}\, \frac{\partial P}{\partial \tau}\right) = \phi c_t \frac{\partial P}{\partial t} \tag{61}$$

The differential terms in $\psi$ and $\chi$ do not appear because the divergence of the vector function has only a $\tau$ direction component. It can be obtained from Equations 55 and 60 that $h_\tau = \sqrt{\alpha}$. The product $h_\tau h_\psi h_\chi$ is simply the Jacobian J of the coordinate transformation. Therefore, Equation 61 reduces to $$\frac{\partial}{\partial \tau}\left(J\phi \frac{\partial P}{\partial \tau}\right) = J\phi \frac{\partial P}{\partial t} \tag{62}$$

The Jacobian J and the porosity $\phi$ are functions of $(\tau,\psi,\chi)$ in general. In order to further reduce Equation 62 to only depend on $\tau$, both sides are integrated over the other two coordinates $\psi$ and $\chi$ which are orthogonal to $\tau$. Because the pressure P is assumed to be only a function of $\tau$ and t, it can be taken out of that integral. Thus Equation 62 reduces to $$\frac{\partial}{\partial \tau}\left(w(\tau)\frac{\partial P}{\partial \tau}\right) = w(\tau)\frac{\partial P}{\partial t} \tag{63}$$

where $$w(\tau) = \int\int \phi J(\tau, \psi, \chi) d\psi d\chi \tag{64}$$

The function $w(\tau)$ can be related to the drainage pore volume by $$w(\tau) = \int\int \phi J(\tau, \psi, \chi) d\psi d\chi = \frac{dV_p(\tau)}{d\tau} \tag{65}$$

because the drainage pore volume can be written as $$V_p(\tau) = \int_{\tau 0}^{\tau}\left(\int\int \phi J(\tau, \psi, \chi) d\psi d\chi\right) d\tau \tag{66}$$

Extension to anisotropy and compressible fluid cases will now be discussed in detail. Equation 63 will now be derived from a different perspective to include anisotropy into the formulation. Imagine a series of contour surfaces partitioning the domain into a series of non-overlapping layers. Consider a very thin layer of volume enclosed by the contour surfaces $S(\tau)$ and $S(\tau+\Delta\tau)$. The volume element of this thin layer dv can be written as the area element $d\sigma$ multiplied by the thickness of the layer $$dv = \frac{\Delta \tau}{\|\nabla \tau\|} d\sigma \tag{67}$$

The diffusion equation can be written as:

$$-\nabla \cdot \vec{u} = \phi c_t \frac{\partial P}{\partial t} \tag{68}$$

The volumetric integral is taken over the thin layer $$-\oint_V \nabla \cdot \vec{u}\, dv = \oint_V \phi c_t \frac{\partial P}{\partial t} dv \tag{69}$$

The left hand side can be written as the surface integral by applying Green's theorem $$-\oint_V \nabla \cdot \vec{u}\, dv = -\oint_S \vec{u} \cdot \hat{n} d\sigma = -\oint_S \vec{u} \cdot \nabla \tau \frac{d\sigma}{\|\nabla \tau\|} \tag{70}$$

The surface integral can then be written in terms of the two $\tau$ contour surfaces enclosing the thin layer $$-\oint_S \vec{u}\cdot \nabla\tau \frac{d\sigma}{\|\nabla\tau\|} = -\left(\int_{S(\tau+\Delta\tau)} \nabla\tau\cdot\vec{u}\frac{d\sigma}{\|\nabla\tau\|} - \int_{S(\tau)} \nabla\tau\cdot\vec{u}\frac{d\sigma}{\|\nabla\tau\|}\right) \tag{71}$$

The right hand side of Equation 69 can also be written as a surface integral by applying Equation 67

$$\oint_V \phi c_t \frac{\partial P}{\partial t} dv = \Delta\tau \int_{S(\tau)} \phi c_t \frac{\partial P}{\partial t} \frac{d\sigma}{\|\nabla\tau\|} \tag{72}$$

For anisotropic permeability the velocity is given by Darcy's Law as:

$$\vec{u} = -\frac{\overline{k}}{\mu}\cdot \nabla P \tag{73}$$

Under the assumption that the pressure gradient direction aligns with the $\tau$ gradient direction, i.e., the contour surfaces of $\tau$ are also the contour surfaces of P, Equation 56 can be applied to get $$\vec{u} \cong -\frac{\overline{k}}{\mu}\cdot \nabla\tau \frac{\partial P}{\partial t} \tag{74}$$

Substituting Equation 74 into Equation 71 and applying the anisotropic Eikonal equation $\nabla_\tau\cdot \overline{k}\cdot\nabla_\tau = \phi\mu c_t$, it is possible to eliminate the permeability tensor completely. Thus the original diffusion equation (Equation 69) has been transformed into $$\int_{S(\tau+\Delta\tau)} \phi \frac{\partial P}{\partial \tau}\frac{d\sigma}{\|\nabla\tau\|} - \int_{S(\tau)} \phi \frac{\partial P}{\partial t}\frac{d\sigma}{\|\nabla\tau\|} = \Delta\tau \int_{S(\tau)} \phi \frac{\partial P}{\partial \tau}\frac{d\sigma}{\|\nabla\tau\|} \tag{75}$$

TABLE 1

Field units used in Equation 79.

| Quantity | Unit | Quantity | Unit |
|---|---|---|---|
| Pressure | psi | Length | ft |
| Time | day | Permeability | md |
| Viscosity | cp | Compressibility | psi$^{-1}$ |
| Oil flow rate | bb/day | Drainage pore volume | ft$^3$ |
| Gas flow rate | scf/day | Temperature | °R |

Divide both sides by $\nabla_\tau$ and let $\nabla_\tau \to 0$ $$\frac{\partial}{\partial \tau}\left(\int_{S(\tau)} \phi \frac{\partial P}{\partial \tau} \frac{d\sigma}{\|\nabla \tau\|}\right) = \int_{S(\tau)} \phi \frac{\partial P}{\partial t} \frac{d\sigma}{\|\nabla \tau\|} \qquad (76)$$

Under the assumption that pressure is only a function of τ and t, terms containing only P can be taken outside the integral. This arrives at exactly the same form as Equation 63.

$$\frac{\partial}{\partial \tau}\left(w(\tau) \frac{\partial P}{\partial \tau}\right) = w(\tau) \frac{\partial P}{\partial t} \qquad (77)$$

with $$w(\tau) = \int_{S(\tau)} \phi \frac{d\sigma}{\|\nabla \tau\|} = \frac{dV_p(\tau)}{d\tau}$$

The pressure boundary conditions are described below in reference to Equations 113 through 120. The relationship between $w(\tau)$ and the drainage pore volume $V_p(\tau)$ can be established by writing $V_p(\tau)$ according to Equation 67.

$$V_p(\tau) = \int_{\tau 0}^{\tau}\left(\int_{S(\tau)} \phi \frac{d\sigma}{\|\nabla \tau\|}\right) d\tau \qquad (78)$$

In field units shown in TABLE 1, Equation 63 is $$\frac{\partial}{\partial \tau}\left(w(\tau) \frac{\partial P}{\partial \tau}\right) = 158.2 w(\tau) \frac{\partial P}{\partial t} \qquad (79)$$

For compressible fluid (gas), the fluid viscosity μ and compressibility $c_g$ will depend on pressure. When the diffusive time of flight τ is calculated using FMM, the values at the initial reservoir pressure $\mu_i$ and $c_{gi}$ respectively will be used. The total compressibility at the initial reservoir pressure is then $c_{ti}=c_{gi}+c_f$, where $c_f$ is the rock compressibility and considered to be constant. For real gas, the diffusivity equation can be written as:

$$-\nabla \cdot (\rho \vec{u}) = -\frac{\partial(\phi \rho)}{\partial t} \qquad (80)$$

The equation of state for real gas is $$PV = Z \frac{m}{M} RT \qquad (81)$$

where Z is a compressibility factor. Thus the gas density can be expressed as $$\rho = \frac{PM}{ZRT} \qquad (82)$$

The gas compressibility is $$c_g = -\frac{1}{V}\frac{\partial V}{\partial P} = \frac{1}{\rho}\frac{\partial \rho}{\partial P} \qquad (83)$$

The rock compressibility is $$c_f = \frac{1}{\phi}\frac{\partial \phi}{\partial P} \qquad (84)$$

The total compressibility is defined as $$c_t = c_g + c_f \qquad (85)$$

By applying Equations 81 to 85 the right hand side of Equation 80 is $$\frac{\partial(\phi \rho)}{\partial t} = \frac{M}{RT} \phi c_t \frac{P}{Z} \frac{\partial P}{\partial t} \qquad (86)$$

The left hand side of Equation 80 is only different from Equation 69 by an extra density. Following exactly the same derivation as previous described and applying Equation 82 for gas density, the following equation is derived $$\frac{\partial}{\partial \tau}\left(w(\tau) \frac{P}{\tilde{\mu}(P)Z(P)} \frac{\partial P}{\partial \tau}\right) = w(\tau) \tilde{c}_t(P) \frac{P}{Z(P)} \frac{\partial P}{\partial t} \qquad (87)$$

where function $w(\tau)$ has been defined previously, $\tilde{\mu}(P)$ and $\tilde{c}_t(P)$ are dimensionless viscosity and total compressibility defined as $$\tilde{\mu}(P) = \frac{\mu(P)}{\mu_i} \qquad (88)$$

and $$\tilde{c}(P) = \frac{c_t(P)}{c_{ti}} \qquad (89)$$

If the real gas pseudo-pressure is defined as $$m(P) = \int_{P_0}^{P} \frac{P \, dP}{\tilde{\mu}(P)Z(P)} \qquad (90)$$

Then Equation can be written as:

$$\frac{\partial}{\partial \tau}\left(w(\tau) \frac{\partial m}{\partial t}\right) = w(\tau) \tilde{c}_t(m) \tilde{\mu}(m) \frac{\partial m}{\partial t} \qquad (91)$$

$\tilde{\mu}(P)$ and $\tilde{c}_t(P)$ are functions of P and thus are also functions of m. By using a pseudo-time defined as:

$$t_s(t) = \int_{t_0}^{t} \frac{dt}{\tilde{c}_t \tilde{\mu}} \quad (92)$$

the equation can be further reduced to the same form as the slightly compressible case $$\frac{\partial}{\partial \tau}\left(w(\tau)\frac{\partial m}{\partial \tau}\right) = w(\tau)\frac{\partial m}{\partial t_s} \quad (93)$$

The pressure boundary conditions for the gas case are the same as the oil case shown in Equation 113 and 114. The rate boundary conditions can be written for the wellbore as:

$$\left(w(\tau)\frac{\partial m}{\partial \tau}\right)_{\tau=\tau_w} = 2 \times \frac{P_{ST}T}{T_{ST}\mu_i c_{ti}} q_w \quad (94)$$

Here $q_w$ is the gas flowing rate at the standard condition. Similar equation can be written for the outer boundary.

The compositional equation in 1D coordinates for water is:

$$w(\tau)\frac{\partial\left(e^{c_r(p^0-p)}\rho_w S_w\right)}{\partial t} = \frac{\partial}{\partial t}\left(w(\tau)\left(\frac{\gamma_t}{\lambda_t}\right)_{init} \rho_w \frac{k_{rw}}{\mu_w}\frac{\partial p}{\partial \tau}\right) + v(\tau)q_w \quad (95)$$

and for the oil and gas components $$w(\tau)\frac{\partial\left(e^{c_r(p^0-p)}F z_i\right)}{\partial t} = \frac{\partial}{\partial t}\left(w(\tau)\left(\frac{\gamma_t}{\lambda_t}\right)_{init}\left(x_i\rho_o\frac{k_{ro}}{\mu_o} + y_i\rho_g\frac{k_{rg}}{\mu_g}\right)\frac{\partial p}{\partial \tau}\right) + v(\tau)(x_i q_o + y_i q_g) \quad (96)$$

$$w(\tau)\frac{\partial\left(e^{c_r(p^0-p)}F\right)}{\partial t} = \frac{\partial}{\partial t}\left(w(\tau)\left(\frac{\gamma_t}{\lambda_t}\right)_{init}\left(\rho_o\frac{k_{ro}}{\mu_o} + \rho_g\frac{k_{rg}}{\mu_g}\right)\frac{\partial p}{\partial \tau}\right) + v(\tau)(q_o + q_g) \quad (97)$$

where $w(\tau)$ is the derivative of drainage volume with respect to diffusive time of flight.

The following discussion will illustrate that the new formulation will reduce back to the ordinary diffusivity equations in 1D, 2D, and 3D homogeneous medium. For 1D linear flow, $$\tau = \frac{x}{\sqrt{\alpha}} \quad (98)$$

where x is the linear distance. The drainage pore volume can be written as:

$$V_p(\tau) = \phi A x = \phi A \sqrt{\alpha}\tau \quad (99)$$

where A is the intersectional area. Therefore, $$w(\tau) = \frac{dV_p}{d\tau} = \phi A \sqrt{\alpha} \quad (100)$$

Substitute this equation into Equation 63 and the result is:

$$\frac{\partial^2 P}{\partial \tau^2} = \frac{\partial P}{\partial t} \quad (101)$$

Substitute Equation 98 and write the equation in terms of x coordinate, which arrives at the ordinary diffusivity equation in 1D homogeneous medium $$\frac{\partial^2 P}{\partial x^2} = \frac{\phi\mu c_t}{k}\frac{\partial P}{\partial t} \quad (102)$$

For 2D radial flow, $$\tau = \frac{r}{\sqrt{\alpha}} \quad (103)$$

where r is the radial distance. The drainage pore volume can be written as:

$$V_p(\tau) = \pi\phi r^2 h = \pi\phi\alpha\tau^2 h \quad (104)$$

Therefore, $$w(\tau) = \frac{dV_p}{d\tau} = 2\pi\phi\alpha h\tau \quad (105)$$

Substitute this equation into Equation 63. The result is:

$$\frac{1}{\tau}\frac{\partial}{\partial \tau}\left(\tau\frac{\partial P}{\partial \tau}\right) = \frac{\partial P}{\partial t} \quad (106)$$

Substitute Equation 103 and write the equation in terms of r coordinate, which arrives at the ordinary diffusivity equation in 2D homogeneous medium $$\frac{1}{r}\frac{\partial}{\partial r}\left(r\frac{\partial P}{\partial r}\right) = \frac{\phi\mu c_t}{k}\frac{\partial P}{\partial t} \quad (107)$$

Figure 20A:
FIGS. 20A and 20B illustrate the transformation of a 2D case.
Figure 20B:
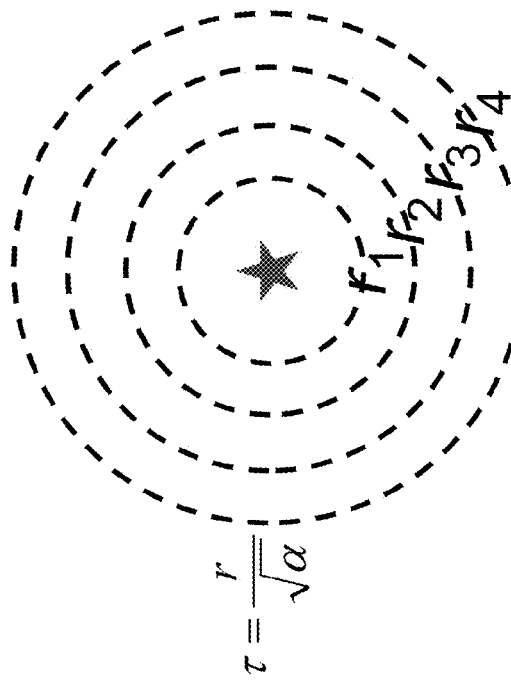
Figure 21A:
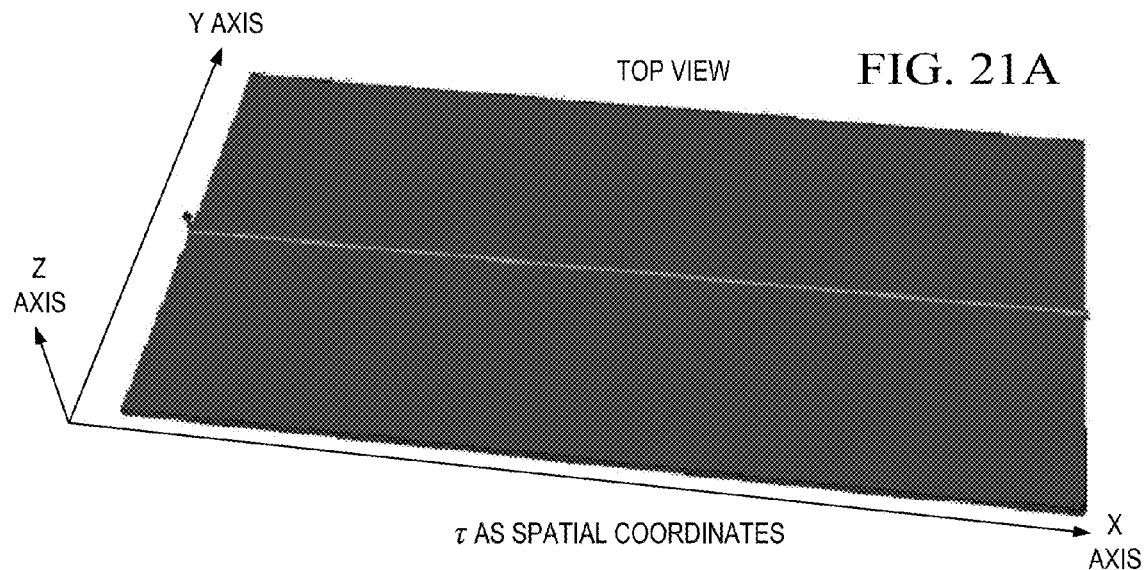
FIGS. 21A-21B and 22A-22B illustrate additional examples of the transformation of a 2D case.
Figure 21B:
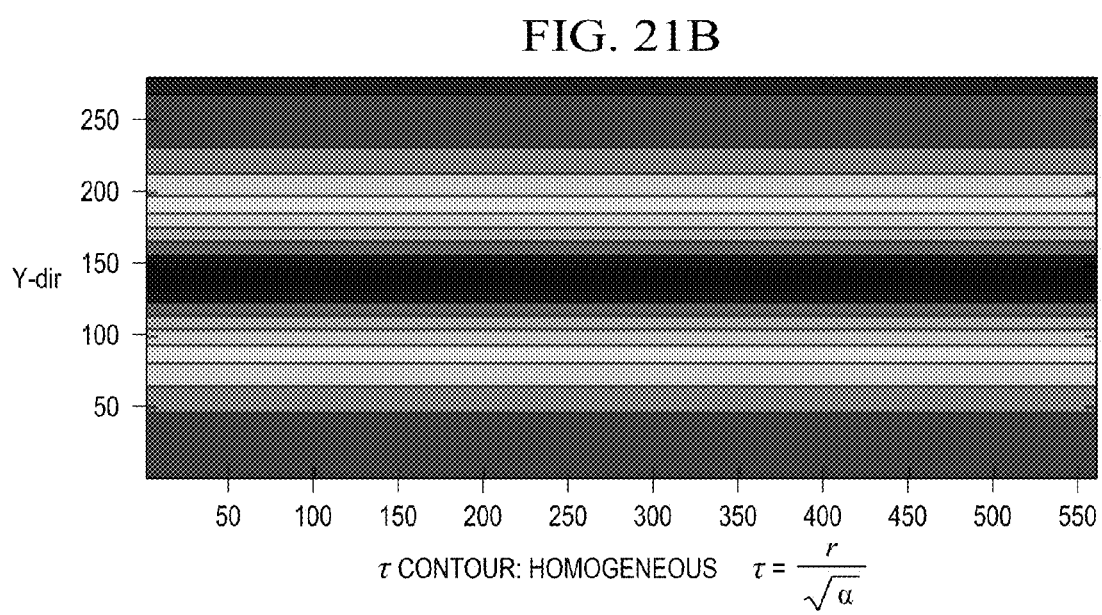
Figure 22B:
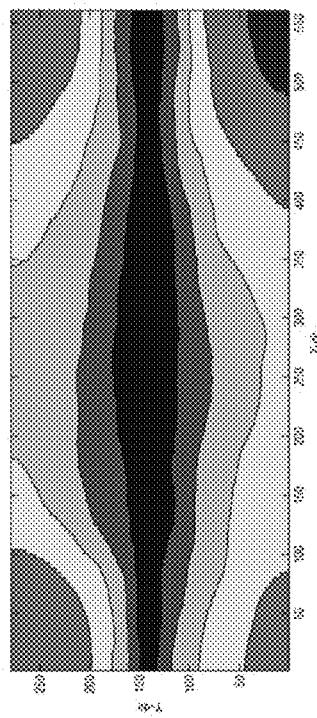
Figure 22A:
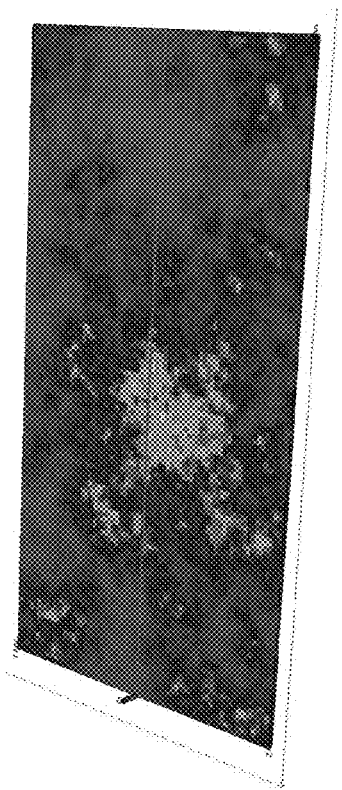

FIGS. 20A and 20B illustrate the transformation of a 2D case. FIGS. 21A-B and 22A-B illustrate additional examples of the transformation of a 2D case.

For 3D spherical flow, $$\tau = \frac{r}{\sqrt{\alpha}} \quad (108)$$

where r is the radial distance. The drainage pore volume can be written as:

$$V_p(\tau) = \frac{4}{3}\pi\phi r^3 = \frac{4}{3}\pi\phi\alpha^{3/2}\tau^2 \quad (109)$$

Therefore, $$w(\tau) = \frac{dV_p}{d\tau} = 4\pi\phi\alpha^{3/2}\tau^2 \quad (110)$$

Substitute this equation into Equation 63. The result is:

$$\frac{1}{\tau^2}\frac{\partial}{\partial\tau}\left(\tau^2\frac{\partial P}{\partial\tau}\right) = \frac{\partial P}{\partial t} \quad (111)$$

Substitute Equation 108 and write the equation in terms of r coordinate, which arrives at the ordinary diffusivity equation in 3D homogeneous medium $$\frac{1}{r^2}\frac{\partial}{\partial r}\left(r^2\frac{\partial P}{\partial r}\right) = \frac{\phi\mu c_t}{k}\frac{\partial P}{\partial t} \quad (112)$$

One advantage of the $\tau$-coordinate formulation over analytic approximations is that it is more straightforward to implement the solution based on various boundary conditions and to incorporate additional physics. The pressure boundary condition can be simply written as:

$$P|_{\tau=\tau_w} = P_{wf} \quad (113)$$

for the wellbore and $$P|_{\tau=\tau_e} = P_e \quad (114)$$

for the outer boundary. Here the solution domain is $[\tau_w, \tau_e]$. The lower bound $\tau_w$ corresponds with the wellbore radius and the upper bound $\tau_e$ corresponds with the boundary of the reservoir. $\tau_w$ can be calculated from the wellbore radius by $$\tau_w = r_w\sqrt{\frac{\phi_w\mu c_t}{k_w}} \quad (115)$$

where $\phi_w$ and $k_w$ are porosity and permeability at the wellbore. This relationship can be generalized for heterogeneous multi-layered reservoir as:

$$\tau_w = r_w\sqrt{\frac{\mu c_t \Sigma_i \phi_w h_i}{\Sigma_i k_{wi} h_i}} \quad (116)$$

where the thickness weighted summations of porosities and permeabilities for each completion layer are used.

Following the derivation from Equation 53 to 62, it can be seen that the flux term has the following corresponding relationship $$\frac{k}{\mu}\nabla P = c_t J\phi\frac{\partial P}{\partial\tau} \quad (117)$$

Because from Equation 62 to Equation 63 the surface integration is applied over the area perpendicular to the reservoir flow, the flow rate relationship can then be written as:

$$q = A\frac{k}{\mu}\nabla P = c_t w(\tau)\frac{\partial P}{\partial\tau} \quad (118)$$

Therefore, the flow rate boundary conditions can be written for Equation 63 as:

$$\left(w(\tau)\frac{\partial P}{\partial\tau}\right)_{\tau=\tau_w} = \frac{q_w}{c_t} \quad (119)$$

for the wellbore and $$\left(w(\tau)\frac{\partial P}{\partial\tau}\right)_{\tau=\tau_e} = \frac{q_e}{c_t} \quad (120)$$

for the outer boundary. Here $q_w$ is the down-hole flow rate at the wellbore. For no-flow boundary condition, $q_e$ is zero. Different boundary conditions can be imposed at different times and this will be illustrated later. The rate boundary conditions for compressible fluid were previously described.

To solve Equation 63, the drainage volume derivative $w(\tau)$ needs to be evaluated. This is critical because the $w(\tau)$ function contains the reservoir heterogeneity information. The drainage pore volume $V_p(\tau)$ can be calculated using the FMM as previously described. Because the reservoir is discretized into grid blocks, during the process of the FMM calculation, the drainage pore volume can be gradually accumulated as new grid blocks are being accepted. However, this raw correspondence between $\tau$ and $V_p$ cannot be directly used for derivative calculation because the data is not locally smooth. An ideal solution to this problem would be to generate 3D $\tau$ contour surfaces using the calculated $\tau$ values at each cell center. Then calculate the volume enclosed by each $\tau$ contour for the corresponding value of $\tau$. However, this requires some 3D contouring algorithm which may be very complex and computationally expensive. It was chosen to use a customized Gaussian kernel smoother for the raw $V_p$ versus $\tau$ data collected during the FMM calculation. The advantage is that it is computationally cheap and easy to implement. The disadvantage is that the bandwidth of the Gaussian kernel needs to be customized to give the best results. A super-smoother has also been tried but has not been adopted because it may oversmooth the data and give wrong results especially at the lower end of $\tau$ values. Once the $V_p$ versus $\tau$ data has been smoothed, the derivative can be calculated based on a weighted average between the upstream and the downstream derivatives as proposed by Bourdet et al. (1989).

The oil case will now be described. To start with, a homogeneous oil reservoir in 1D, 2D, and 3D is used to generate benchmark for both the $\tau$-coordinate formulation and the PSS geometric approximation. As previously described, the $\tau$-coordinate formulation reduces back to the ordinary form of the diffusivity equation for homogeneous reservoirs in 1D, 2D, and 3D. Therefore, for homogeneous reservoirs, the $\tau$-coordinate formulation gives exactly the same results as solving the diffusivity equation directly.

Figure 23:
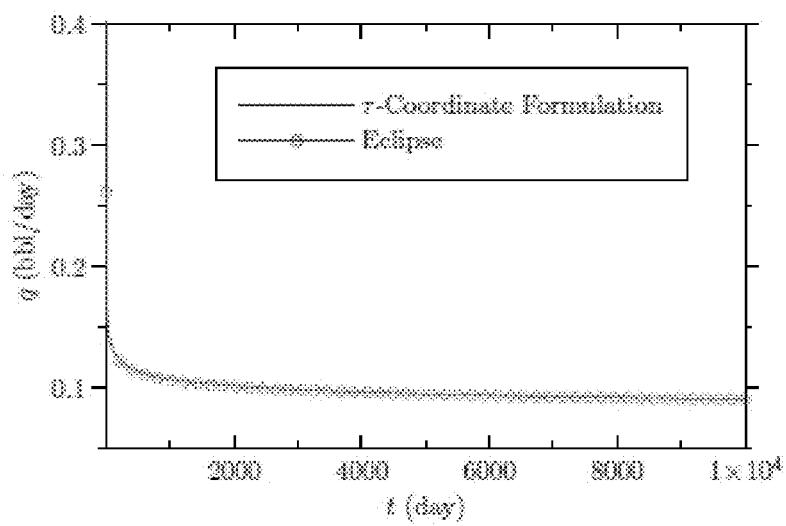
FIG. 23 is a graph showing the calculated well bottomhole flow rate under constant well bottomhole pressure (BHP) (4000 psi) using the $\tau$-coordinate formulation and the Eclipse® simulator for the homogeneous oil example.

To demonstrate the capability of handling different boundary conditions, the well flow rate is calculated by setting the BHP at 4000 psi. The results are shown in FIG. 23 compared with the analytic solution.

TABLE 2

Reservoir parameters for testing of oil case.

| | |
|---|---|
| Reservoir permeability, k | 0.001 md |
| Reservoir thickness, h | 100 ft |
| Reservoir porosity, φ | 0.1 |
| Total compressibility, $c_t$ | $3 \times 10^{-6}$ psi$^{-1}$ |
| Bottom-hole flow rate, q | 0.1 bbl/day |
| Fluid viscosity, μ | 1 cp |
| Initial reservoir pressure, $P_{init}$ | 5000 psi |
| Wellbore radius, $r_w$ | 0.3 ft |

TABLE 3

Geometry data for 1D, 2D, and 3D cases.

| 1D | 2D | 3D |
|---|---|---|
| $r_0$ = 0.3 ft | $r_0$ = 0.3 ft | $r_0$ = 0.3 ft |
| A = 2000 ft$^2$ | h = 100 ft | |

$r_0$ is the inner boundary. A is the cross-sectional area in 1D linear flow. h is the thickness in 2D radial flow.

In another example for a 2D homogeneous model with a vertical well, the following model specifications were used.

| Model specifications for 2D model with vertical well | |
|---|---|
| Dimension | 564 × 564 |
| Grid size | 10 × 10 × 100 |
| Fluid | Oil and Water |
| Initial pressure | 5,000 psi |
| Permeability | 1mD (const.) |
| Porosity | 0.4 (const.) |
| Sw, init | 0.4 (const.) |
| Capillary | neglected |
| Well BHP | 3,000 psi |

Figure 24:
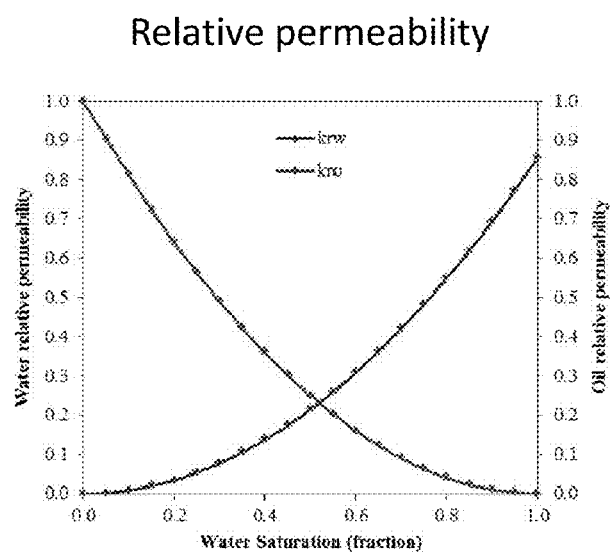
FIGS. 24-25 depict the relative permeability and bottom flow rate for a 2D homogeneous model with a vertical well for oil and water.
Figure 25:
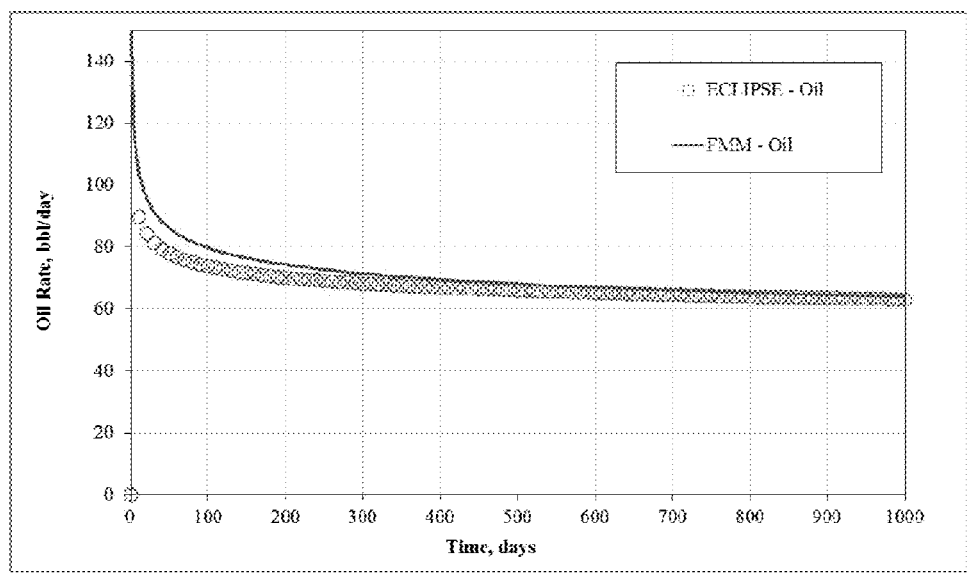

The relative permeability is shown in FIG. 24 and a graph comparing Eclipse® to FMM is shown in FIG. 25.

Multiphase flows will now be discussed by comparing the single phase diffusivity equations with the multiphase diffusivity equations.

| Single Phase | | Multiphase | |
|---|---|---|---|
| $\alpha(x) = \dfrac{k}{\phi \mu c_t}$ | | $\alpha(x) = \dfrac{k \lambda_t}{\phi \gamma_t}$ | |
| $c_t = c_r + c_l$ | CompressibilityTerm | $\gamma_t = \sum\limits_{l=o,w} \dfrac{S_l}{B_l}(c_r + c_l)$ | |
| $\dfrac{1}{\mu_l}$ | Mobility Term | $\lambda_t = \sum\limits_{l=o,w} \dfrac{k_{rl}}{B_l \mu_l}$ | |

DTOD measures the slowness of pressure propagation. Saturation heterogeneity is incorporated in the compressibility and mobility terms.

Assume that the total velocity (global pressure deference) are along DTOF. Transformation into DOT coordinates yields the following equation.

$$\nabla \cdot (\nabla p) = \frac{1}{v(\tau)} \frac{\partial}{\partial \tau}\left(v(\tau) \frac{\partial p}{\partial \tau}\right) \quad (121)$$

Transformation into DOTF coordinates yields the following equations.

$$\phi \gamma_o \frac{\partial p}{\partial t} + \frac{\phi}{B_o} \frac{\partial S_o}{\partial t} = \frac{1}{v(\tau)} \frac{\partial}{\partial \tau}\left[v(\tau)\left(\frac{\phi \gamma_t}{\lambda_t}\right)_{init} \frac{k_{ro}}{B_o \mu_o} \frac{\partial p}{\partial \tau}\right] + q_{o,sc} \quad (122)$$

$$\phi \gamma_w \frac{\partial p}{\partial t} + \frac{\phi}{B_w} \frac{\partial S_w}{\partial t} = \frac{1}{v(\tau)} \frac{\partial}{\partial \tau}\left[v(\tau)\left(\frac{\phi \gamma_t}{\lambda_t}\right)_{init} \frac{k_{rw}}{B_w \mu_w} \frac{\partial p}{\partial \tau}\right] + q_{w,sc} \quad (123)$$

where v(τ) is the derivative of bulk volume with respect to DTOF.

Figure 26A:
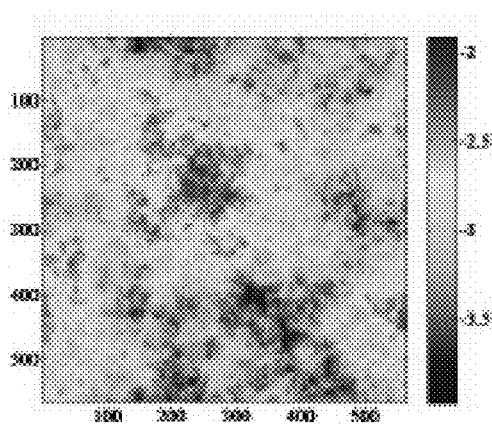
FIGS. 26A-26B depict the (a) logarithm of the permeability field used for testing, and (b) calculated diffusive time of flight $\tau$ for this permeability field for oil case.
Figure 26B:
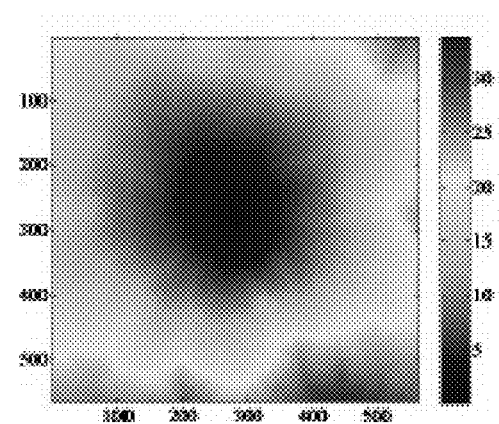
Figure 27:
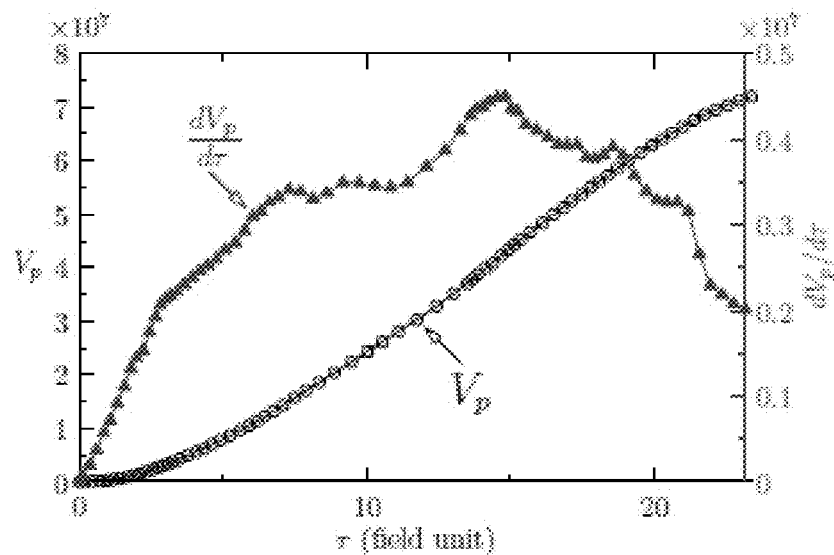
FIG. 27 is a graph showing the drainage pore volume calculated as a function of the diffusive time of flight and its derivative for the heterogeneous oil reservoir example.
Figure 28:
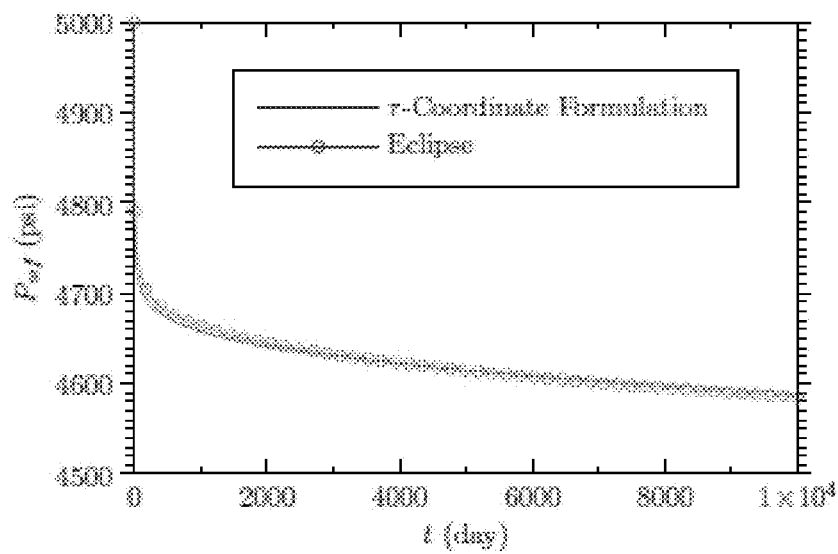
FIG. 28 is a graph showing the BHP calculated using the $\tau$-coordinate formulation and the Eclipse® simulator for the heterogeneous oil reservoir example.

An example of heterogeneous oil reservoir and demonstration that the τ-coordinate formulation is capable of incorporating the heterogeneity information will now be shown. The logarithm of the reservoir permeability is shown in FIG. 26A. The grid is 564×564 with each grid block 5 ft×5 ft. All other parameters are the same as the homogeneous case shown in TABLE 2. The diffusive time of flight map calculated by the FMM is shown in FIG. 26B. FIG. 27 illustrates the drainage pore volume as a function of τ and its first derivative (the w(τ) function). That is the essential information used in the τ-coordinate formulation. FIG. 28 shows the BHP as a function of time for 10000 days. As can be seen, the result obtained by the τ-coordinate formulation agrees well with the Eclipse® simulation.

In another example for a 2D heterogeneous permeability model with a vertical well, the following model specifications were used.

| Model specifications for 2D model with vertical well | |
|---|---|
| Dimension | 564 × 564 |
| Grid size | 10 × 10 × 100 |
| Fluid | Oil and Water |
| Initial pressure | 5,000 psi |
| Permeability | Heterogeneous |
| Porosity | 0.4 (const.) |
| Sw, init | 0.4 (const.) |
| Capillary | neglected |
| Well BHP | 3,000 psi |

Figure 29:
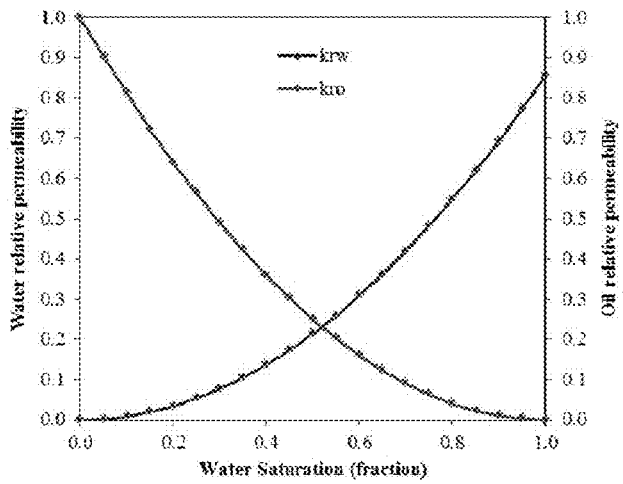
FIGS. 29-33 are graphs depicting the relative permeability, log permeability, diffusive time of flight, drainage volume and bottom flow rate for a 2D heterogeneous model with a vertical well for oil and water.
Figure 30:
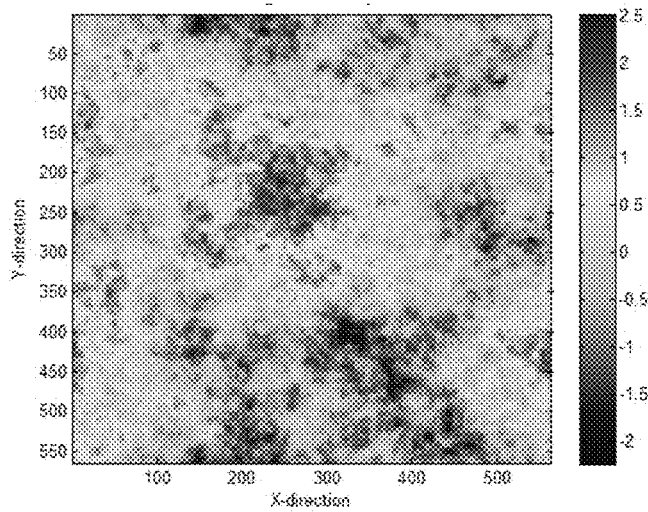
Figure 31:
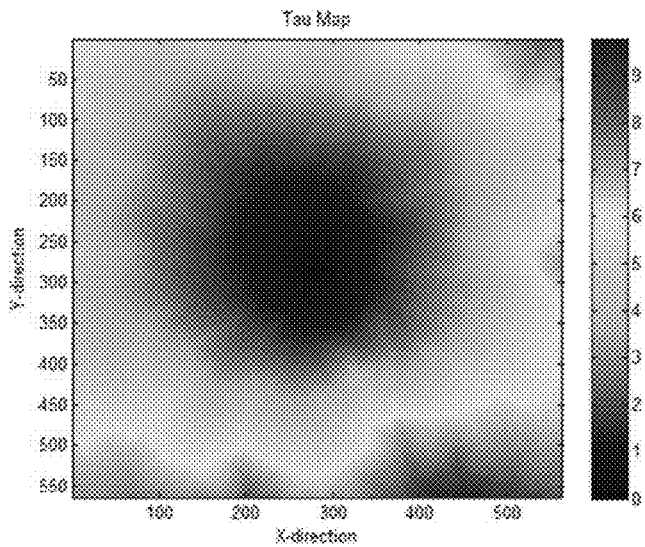
Figure 32:
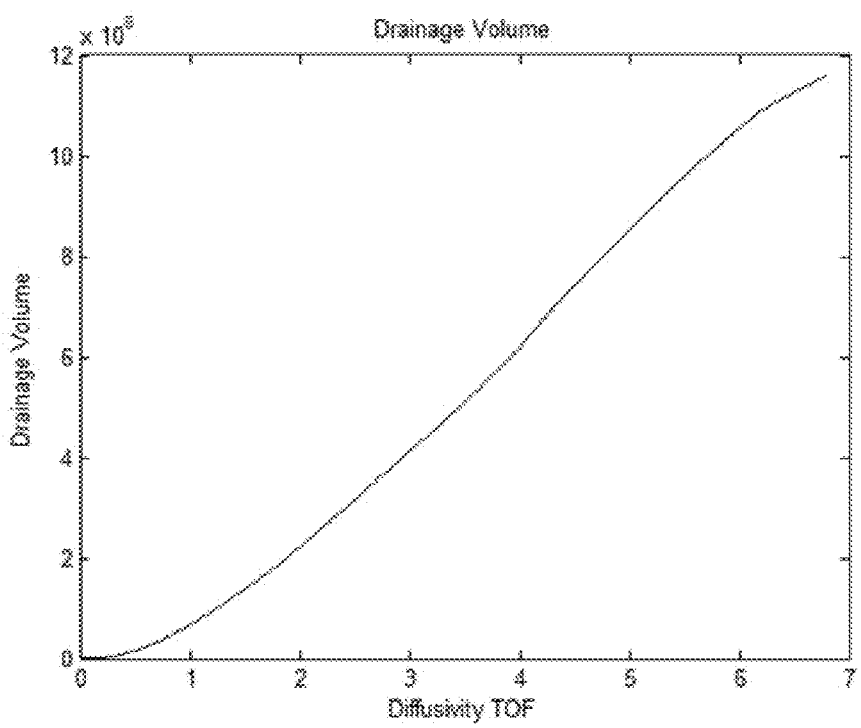
Figure 33:
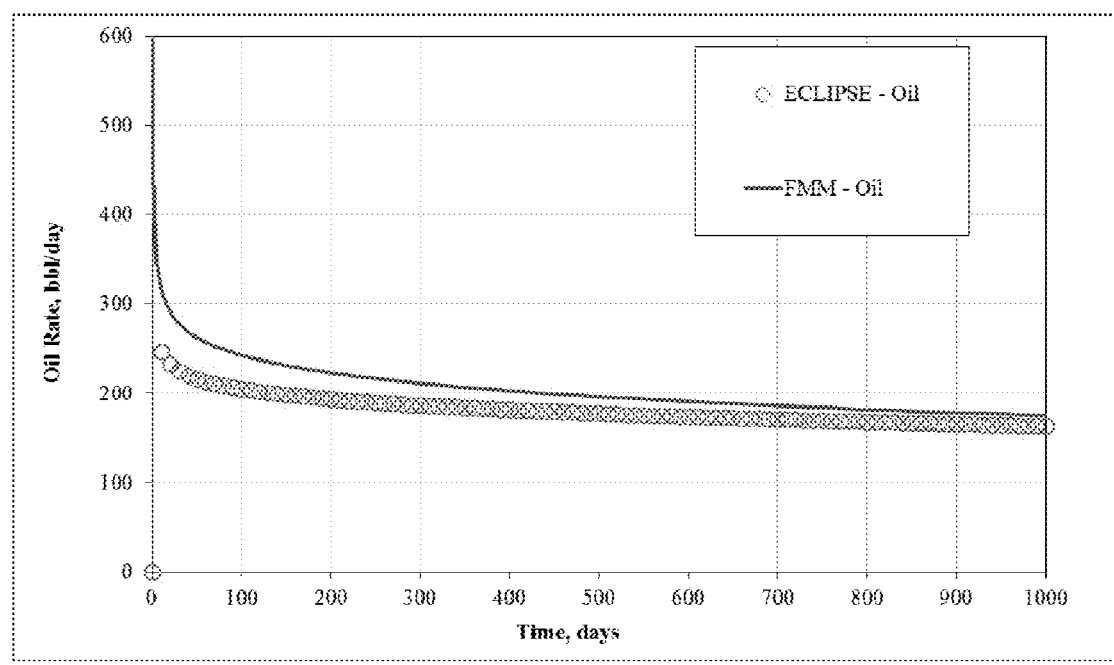

The relative permeability is shown in FIG. 29, the log permeability is shown in FIG. 30, the diffusive time of flight is shown in FIG. 31, the drainage volume is shown in FIG. 32, and a graph comparing Eclipse® to FMM is shown in FIG. 33. Note that the drainage volume includes both oil and water.

Figure 34:
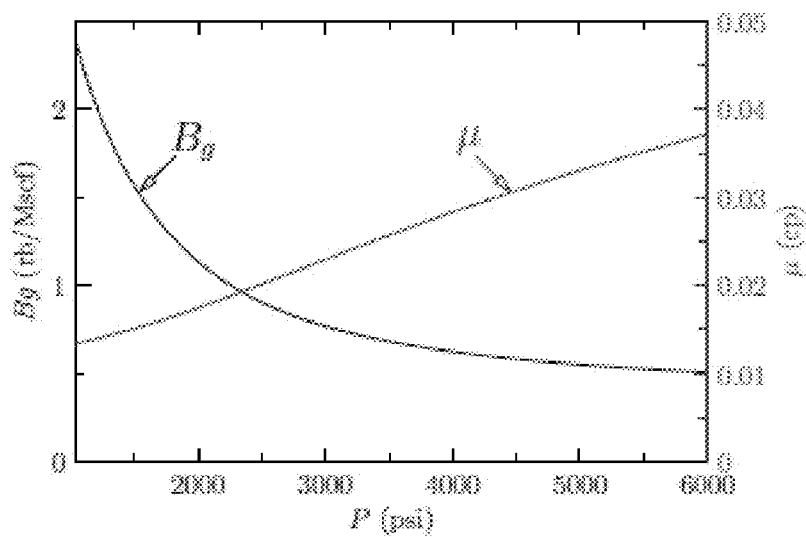
FIG. 34 is a graph showing the gas formation volume factor $B_g$ and gas viscosity $\mu$ as functions of pressure.
Figure 35:
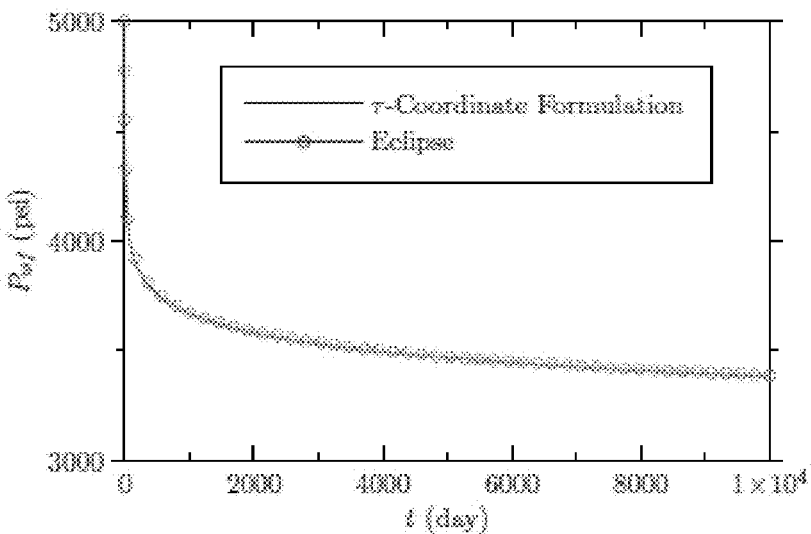
FIG. 35 is a graph showing the BHP calculated using the τ-coordinate formulation and the Eclipse® simulator for the homogeneous gas reservoir example.

The gas case will now be described. Reservoir parameters used for testing the gas case are shown in TABLE 4. The gas has a specific gravity of 0.7 and its formation volume factor and viscosity are shown in FIG. 34 as functions of pressure. FIG. 35 shows the calculated BHP versus time under constant rate constraint. As can be seen, the τ-coordinate formulation agrees well with the Eclipse® simulation result.

TABLE 4

Reservoir parameters for testing of gas case.

| | |
|---|---|
| Reservoir permeability, k | 0.001 md |
| Reservoir thickness, h | 100 ft |
| Reservoir porosity, $\phi$ | 0.1 |
| Formation compressibility, $c_f$ | $3 \times 10^{-6}$ psi$^{-1}$ |
| Gas specific gravity, $\gamma$ | 0.7 |
| Gas flow rate, q | 0.1 Mscf/day |
| Initial reservoir pressure, $P_{init}$ | 5000 psi |
| Wellbore radius, $r_w$ | 0.3 ft |

Figure 36:
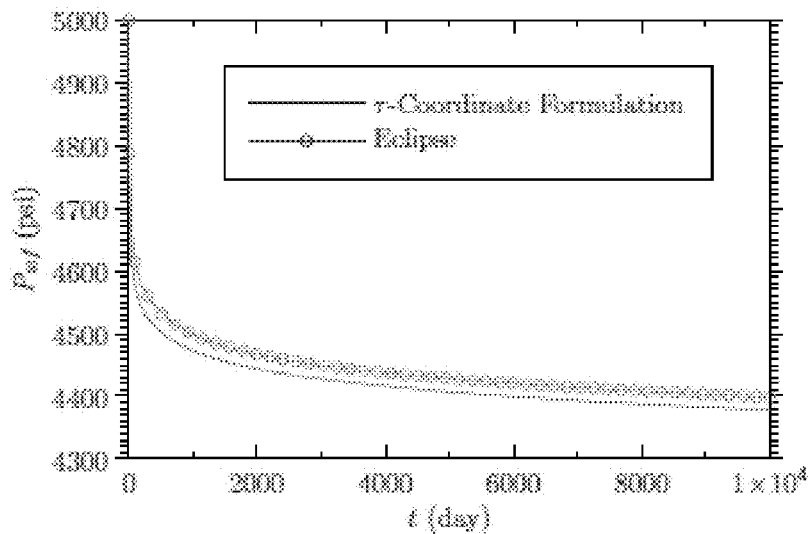
FIG. 36 is a graph showing the BHP calculated using the τ-coordinate formulation and the Eclipse® simulator for the heterogeneous gas reservoir example.
Figure 37:
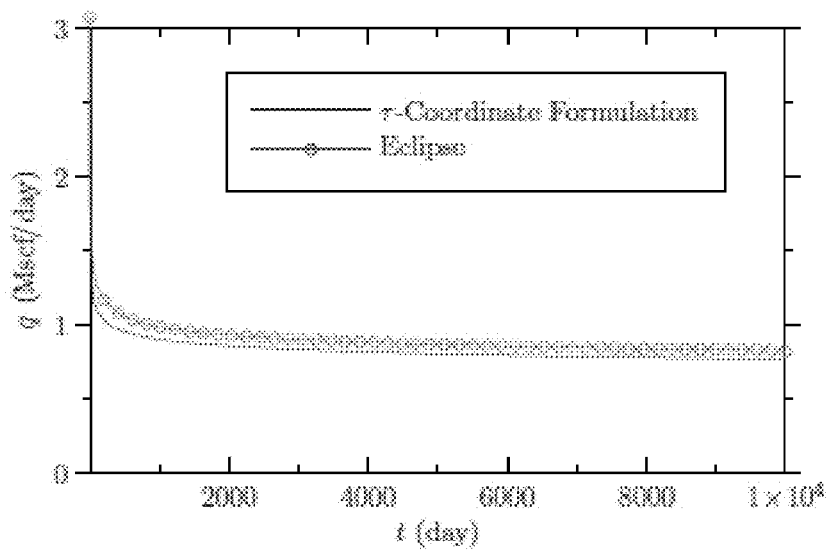
FIG. 37 is a graph showing the well flow rate calculated under constant BHP (4500 psi) constraint using the τ-coordinate formulation and the Eclipse® simulator for the heterogeneous gas reservoir example.

The gas case was tested using the same heterogeneous permeability shown in FIG. 26A. Other parameters were taken from TABLE 4 as well. The calculated BHP by the τ-coordinate formulation is only slightly different from the Eclipse® simulation as shown in FIG. 36. FIG. 37 shows the well flow rate under constant BHP (4500 psi) constraint. Again it is observed that a reasonable agreement between the τ-coordinate formulation and Eclipse® simulation.

Figure 38:
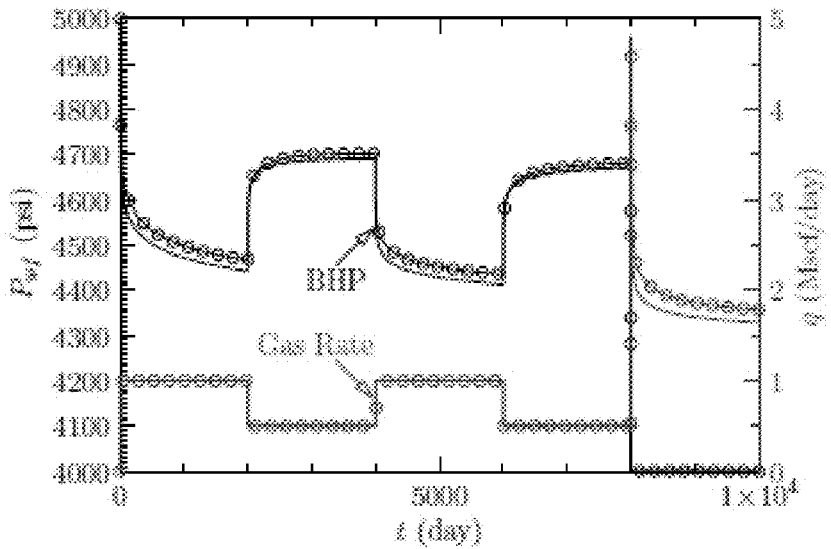
FIG. 38 is a graph showing the comparison of BHP and well flow rate calculated using the τ-coordinate formulation (solid line) and the Eclipse® simulation (circles) for the heterogeneous gas reservoir example under complex well flow rate and BHP controls.

One major advantage of the τ-coordinate formulation is that it is relatively easy to handle complex well controls. As an example, FIG. 38 shows the same heterogeneous gas case with changing flow rate and BHP controls.

Figure 39:
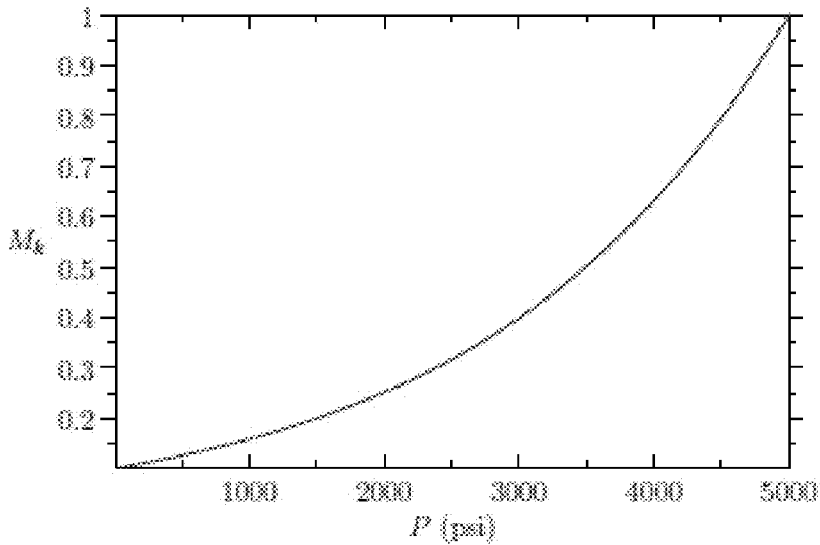
FIG. 39 is a graph showing the permeability multiplier versus pore pressure due to reservoir compaction effect for the test case.
Figure 40:
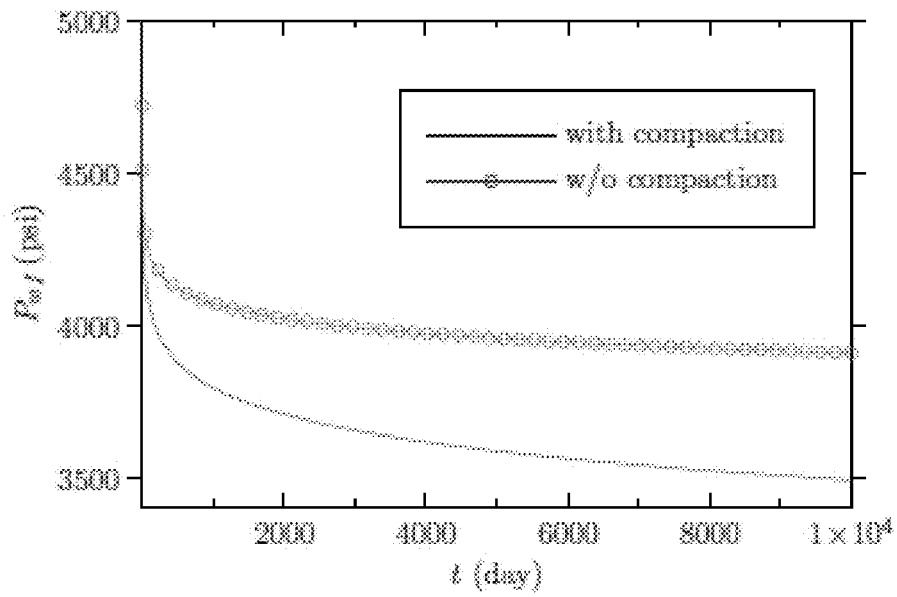
FIG. 40 is a graph showing the BHP calculated with and without the reservoir compaction effect using the τ-coordinate formulation.

The homogeneous oil case is used for testing of the reservoir compaction effect. The reservoir parameters are shown in TABLE 2 for the base case (see Equation 124). The permeability multiplier is shown in FIG. 39 as a function of pore pressure. For simplicity, porosity is assumed to be constant. The calculated BHP with and without the compaction effect are shown in FIG. 40. In this particular example, permeability will decrease during pressure depletion. As a result, for constant production rate, the pressure drop becomes larger if the compaction effect is taken into account.

Figure 41:
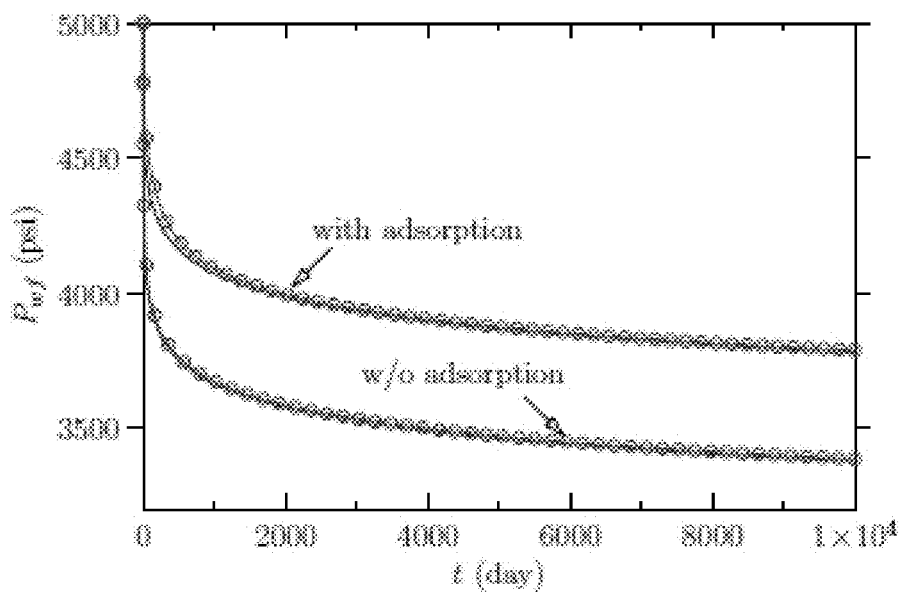
FIG. 41 is a graph showing the gas adsorption effect calculated using the τ-coordinate formulation (solid lines) and the Eclipse® simulation (circles) for the heterogeneous gas reservoir example.

The homogeneous gas case is used for testing of the gas adsorption effect. The reservoir parameters are shown in TABLE 4 for the base case. The Langmuir isotherm model is used as described above (see Equation 10) for gas adsorption with the Langmuir volume $V_L$=2000 scf/ft$^3$ and the Langmuir pressure $P_L$=4000 psi. The calculated BHP with and without the gas adsorption effect are shown in FIG. 41. The same calculation was done using Eclipse® with gas adsorption option. It can be seen that our method produces consistent results compared with Eclipse®. As can be seen in FIG. 41, the gas adsorption effect helps maintain the reservoir pressure, and thus the pressure will drop more slowly if gas adsorption is taken into consideration.

Figure 42:
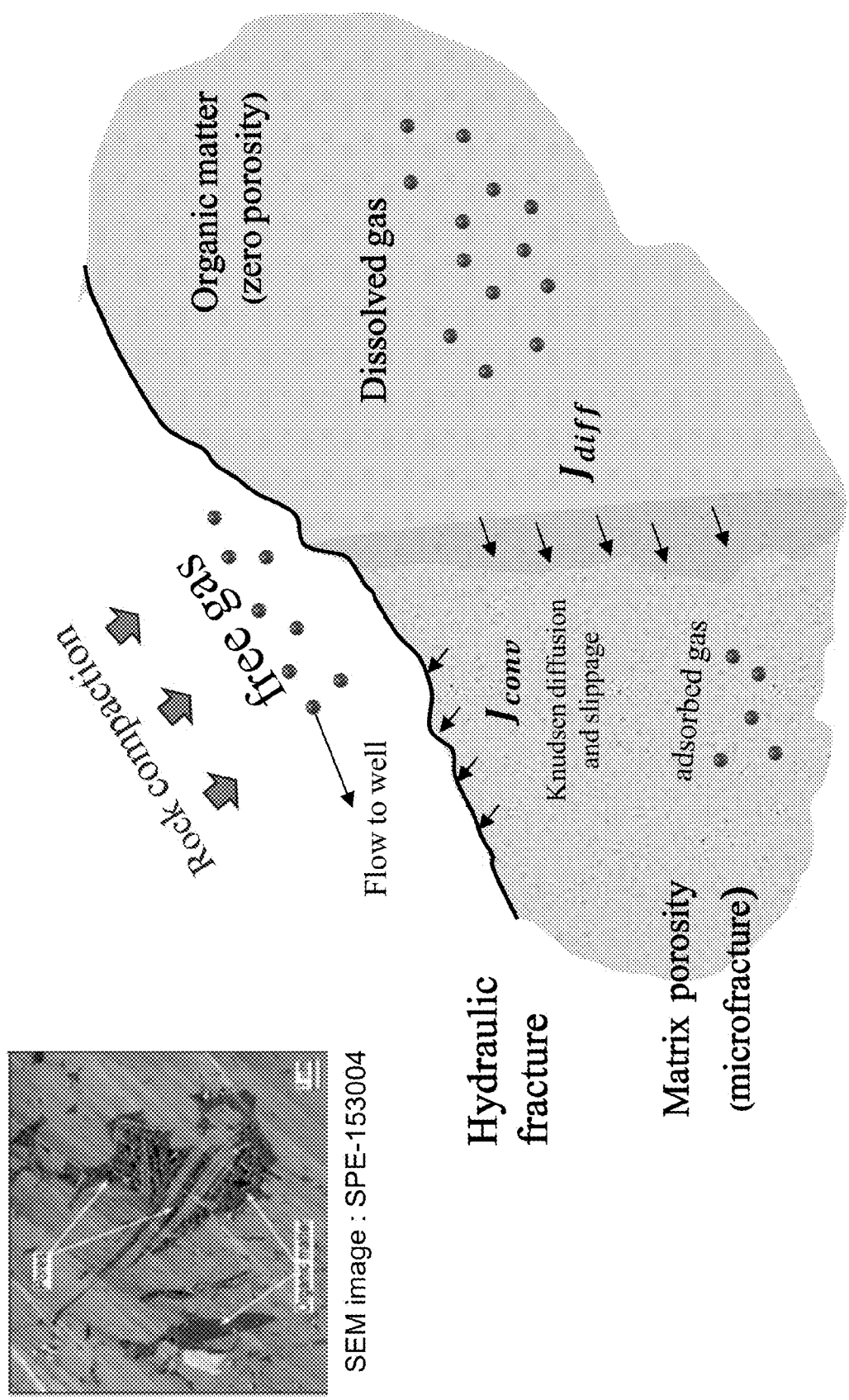
FIG. 42 shows the conceptual flow schematics in a shale gas reservoir.

In order to make the new formulation applicable for more realistic shale gas reservoirs, some additional physics that are potentially important in shale gas reservoir production will be incorporated into the formulation. FIG. 42 shows the conceptual flow schematics in a shale gas reservoir. The reservoir compaction effect and the gas slippage effect can be treated using a decoupled model, in which the effects are represented by pressure dependent permeabilities and porosities. Under the decoupled model, it is assumed in general that permeabilities and porosities can be written as the values at the initial conditions multiplied by certain multipliers which are known functions of pressure, e.g. $k(P)=k_i M_k(P)$ and $\phi(P)=\phi_i M_\phi(P)$. Because the reservoir properties changes with time, one should not rely on the relationship of τ with the pressure front propagation for pressure calculation. As a result, it is difficult to apply the PSS geometric approximation to these situations. However, the new τ-coordinate formulation is not restricted by this.

The permeabilities and porosities at the initial reservoir condition are used in the FMM calculation to obtain the diffusive time of flight τ. No specific physical meaning of τ is relied upon herein other than it is a spatial coordinate which has incorporated the heterogeneity information. Based on the decoupled model, the final τ-coordinate formulation for shale gas reservoirs can be written as:

$$\frac{\partial}{\partial \tau}\left(w(\tau) \frac{M_k(P)P}{\bar{\mu}(P)Z(P)} \frac{\partial P}{\partial \tau}\right) = w(\tau)M_\phi(P)\tilde{c}_t(P)\frac{P}{Z(P)} \frac{\partial P}{\partial t} \quad (124)$$

where $M_k(P)$ and $M_\phi(P)$ are permeability and porosity multipliers respectively, and Z is a compressibility factor.

The gas adsorption and diffusion can be incorporated by adding additional accumulation and source terms in the diffusivity equation (Shabro et al., 2012):

$$-\nabla \cdot (\rho \vec{u}) = \frac{\partial}{\partial t}(\rho \phi + \rho_{ST} V_{ads}) - \rho_{ST} J \quad (125)$$

In this equation, $V_{ads}$ is the adsorbed gas (in standard cubic feet per unit volume of shale). J is the diffusion gas flow rate (in standard cubic feet per day per unit volume of shale). $\rho_{ST}$ is the gas density at the standard condition. It is assumed that a transfer function can be applied for the gas diffusion between kerogen and pore system, thus $$j = \sigma D_k(C_k - C_e(P)) \quad (126)$$

Here σ (unit: ft$^{-2}$) is a factor to account for the kerogen-pore interface area per unit bulk volume. $D_k$ (unit: ft$^2$/day) is the diffusion coefficient in kerogen. $C_k$ (unit: scf/ft$^3$) is the gas concentration in kerogen. $C_e(P)$ is the kerogen gas concentration in equilibrium with the free gas in the pore at pressure P. Mass balance of gas in kerogen gives:

$$\frac{\partial C_k}{\partial t} = -J \quad (127)$$

The coupled Equations 125 and 127 should be solved together. Following the same procedure described above, Equation 125 can be re-written using the coordinate as $$\frac{\partial}{\partial \tau}\left(w(\tau) \frac{P}{\bar{\mu}(P)Z(P)} \frac{\partial P}{\partial \tau}\right) = \left\{w(\tau)\frac{\tilde{c}_t(P)P}{Z(P)} + v(\tau)Y\frac{dV_{ads}}{dP}\right\}\frac{\partial P}{\partial t} + v(\tau)YJ \quad (128)$$

In this equation, Y is the constant group $(P_{ST}T)/(T_{ST}c_{ti})$. A new function $v(\tau)$ is introduced as:

$$v(\tau) = \frac{dV_b(\tau)}{d\tau} \quad (129)$$

where $V_b(\tau)$ is the reservoir bulk volume calculated as a function of τ. This can be calculated at the same time as the drainage pore volume $V_b(\tau)$.

The following parameters were used for the shale gas case:

| Input Parameters | | | |
|---|---|---|---|
| Pressure | psi | 7470 | given |
| Temperature | denF | 276 | given |
| Fluid (gas) | — | 8 components | given |
| Pore radius | Nm | 10 | assuming |
| Smoothness of pore surface | $0 < \alpha < 1$ | 0.5 | assuming |

| Output Results | | |
|---|---|---|
| (Ideal) Darcy permability | mD | 0.0127 |
| Apparent permeability | mD | 2.08 |
| Contribution by Slippage | mD | 1.62 |
| Contribution by Knudsen diffusion | mD | 0.45 |

Figure 43:
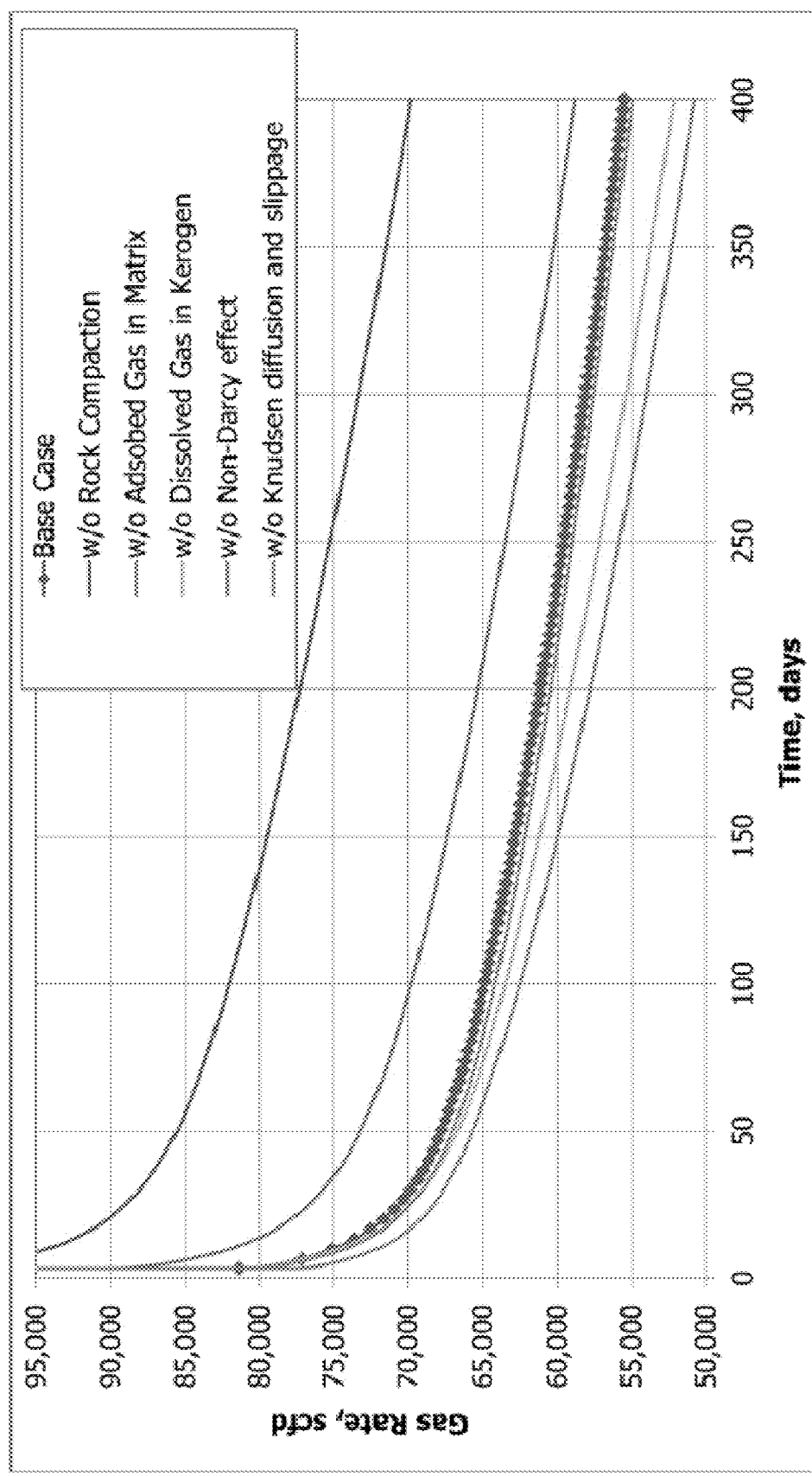
FIG. 43 shows gas flow rates for six cases where calculations were run without various parameters to show the impact of each.
Figure 44A:
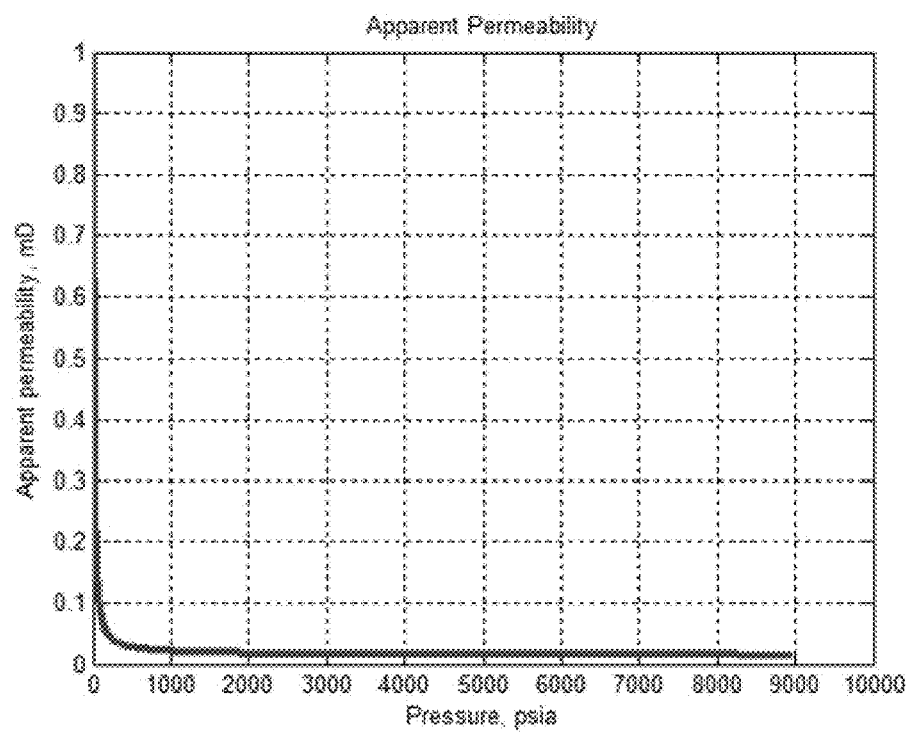
FIGS. 44A-44B are graphs showing the sensitivity and pore size in the shale gas case.
Figure 44B:
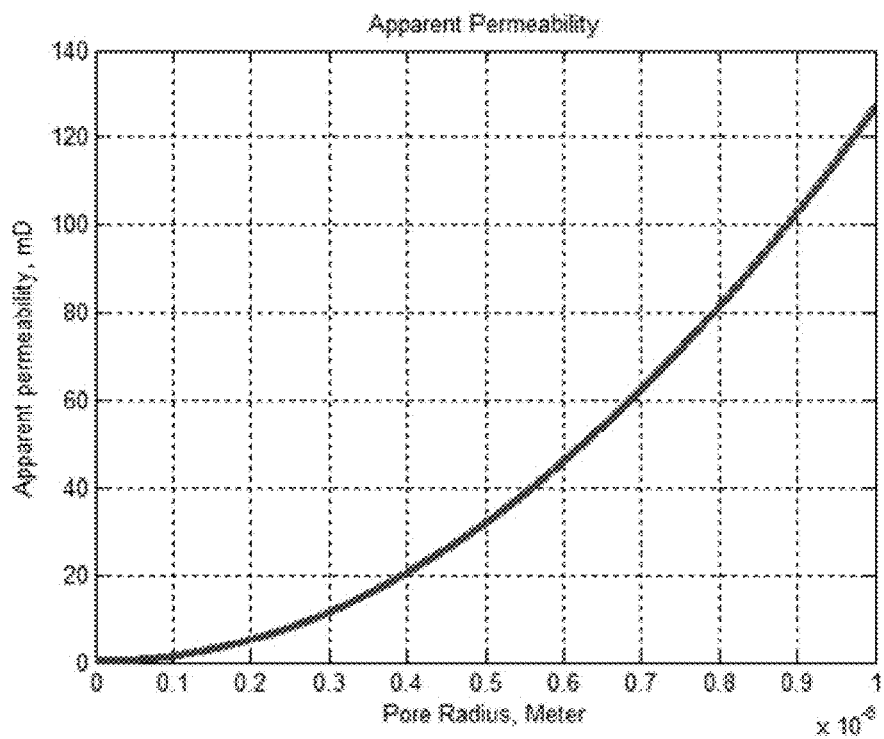
Figure 45A:
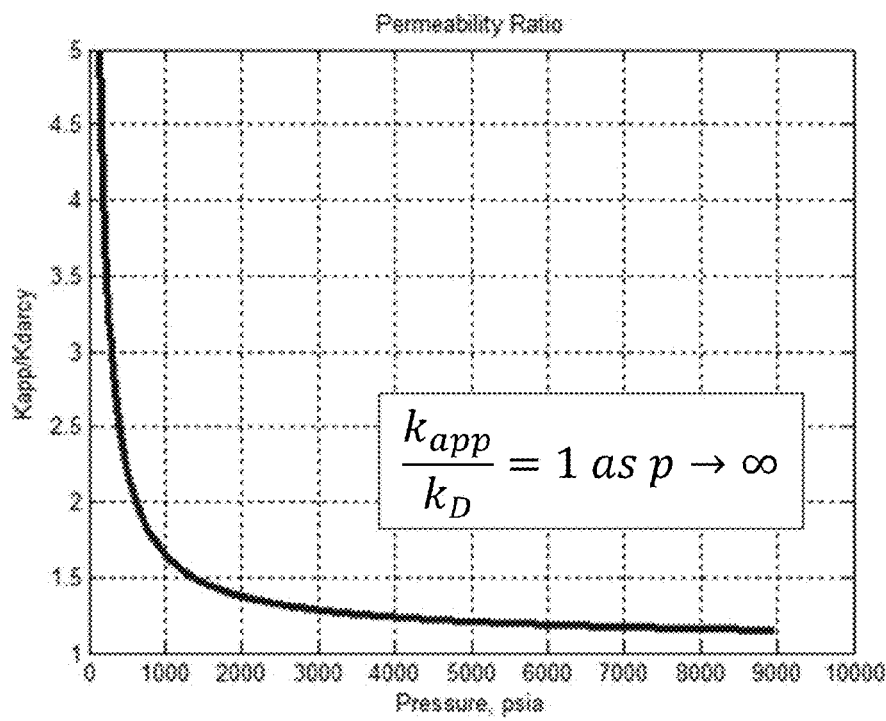
FIGS. 45A-45B are graphs showing the $$\frac{k_{app}}{K_D}$$
Figure 45B:
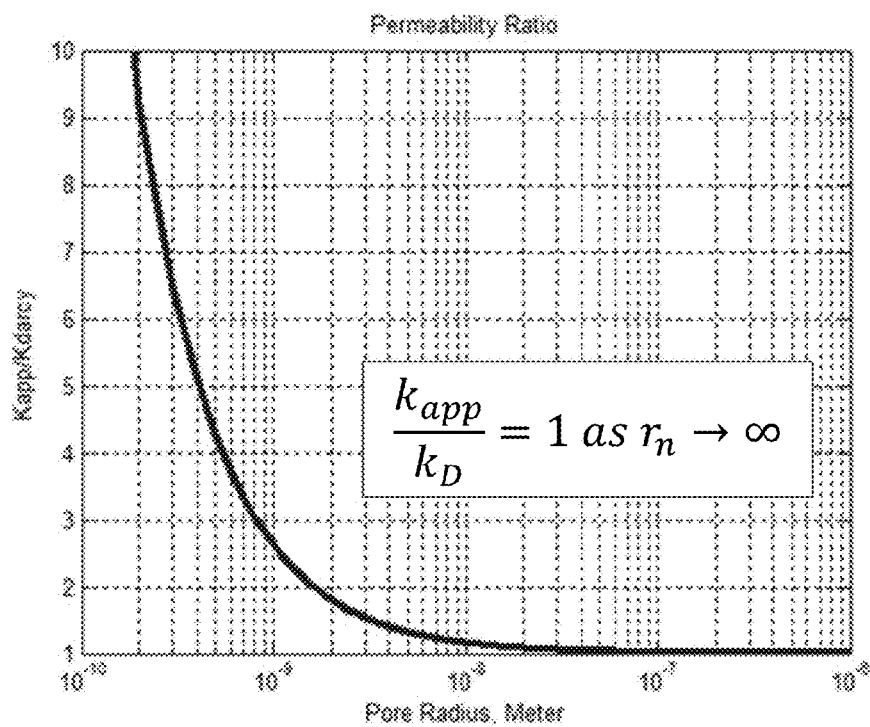

FIG. 43 shows gas flow rates for six cases where calculations were run without various parameters. The sensitivity of pressure and pore size are shown in FIGS. 44A (Pressure from 0 to 9,000 psia and Pore size equal to 10 nm) and 44B (Pore radius from 0.01 to 100 nm and Pressure equal to 7,470 psia), respectively. The Knudsen diffusion is proportional to the pore radius. The Slippage is inversely proportional to the pore radius. The $k_{app}/K_D$ Ratio for pressure and pore size are shown in FIGS. 45A (Pressure from 0 to 9,000 psia and Pore size equal to 10 nm) and 45B (Pore radius from 0.01 to 100 nm and Pressure equal to 7,470 psia), respectively. The Darcy permeability decreases with the square of pore radius. Slippage and Knudsen diffusion are most dominant at low pressures and small pore sizes (<10 nm).

This formulation is essentially a dual porosity model in τ-coordinate. Here the pore system can be seen as the "fracture" and the kerogen the "matrix". It is also possible to use the same formulation for dual porosity naturally fractured reservoirs. The mass balance in a naturally fractured medium is:

$$\nabla \cdot \left(\frac{\rho}{\mu} k_f \nabla p_f\right) = \frac{\partial(\rho \phi_f)}{\partial t} + \rho_{up} \sigma \frac{k_m}{\mu_{up}}(p_f - p_m) \quad (130)$$

which yields:

$$\frac{\partial}{\partial t}\left(w(\tau) \frac{p_f}{\bar{\mu} Z} \frac{\partial p_f}{\partial t}\right) = w(\tau) \frac{p_f \tilde{c}_t}{Z} \frac{\partial p_f}{\partial t} + v(\tau) \frac{1}{c_{ti}}\left(\frac{p}{\mu Z}\right)_{up} \sigma k_m (p_f - p_m) \quad (131)$$

The mass balance in matrix is:

$$0 = \frac{\partial(\rho \phi_m)}{\partial t} - \rho_{up} \sigma \frac{k_m}{\mu_{up}}(p_f - p_m) \quad (132)$$

An example of a naturally fractured system using a dual porosity, single permeability (DPSP) model is shown in FIG. 46. The parameters as shown in the following table.

| Parameters | Units | Quantity |
|---|---|---|
| (NX, NY, NZ) | — | (199, 199, 5) |
| (DX, DY, DZ) | ft | (5, 5, 10) |
| Initial Pressure | psia | 5,470 |
| BHP | psia | 4,000 |
| Simulated Time | days | 3655 |
| Matrix Properties | | |
| Shaped Factor | fraction | 0.15 (const.) |
| Poro | fraction | 0.1 (const.) |
| Perm | mD | 0.0001 (const.) |

Note that the matrix properties and shape factor are assumed to be constant. FIGS. 47A-47D illustrate the fracture properties (permeability and porosity). FIG. 48 compares the single porosity, single permeability (SPSP) models to the DPSP models using Eclipse® and FMM.

With respect to hydraulic fractures, the flow equations on 1D diffusive time of flight are as follows. Flow equation in hydraulic fracture:

$$\frac{c_{ti}}{w(\tau_f)} \frac{\partial}{\partial t}\left(w(\tau) \frac{p_f M_k}{\bar{\mu} Z} \frac{\partial p_f}{\partial t}\right) = \frac{p_f}{Z}\left(M_\phi c_t + \frac{\partial M_\phi}{\partial p_f}\right)\frac{\partial p_f}{\partial t} + \frac{1}{\phi_f}\left(\frac{p}{Z}\right)_{up} \sigma_{FM} \frac{k_{app}}{\mu_{up}}(p_f - p_m) \quad (133)$$

Flow equation in matrix:

$$0 = \frac{\partial}{\partial t}(\rho \phi_m + \rho_{SC} V_E) - \rho_{up} \sigma_{FM} \frac{k_{app}}{\mu_{up}}(p_f - p_m) + \sigma_{MK} D_k (C_{ADS} - C_k) \quad (134)$$

Flow equation in Kerogen:

$$\frac{\partial C_k}{\partial t} = \sigma_{MK} D_k (C_{ADS} - C_k) \quad (135)$$

Examples of various applications of the present disclosure will now be shown.

The Cotton Valley tight gas reservoir includes a horizontal well with six stage hydraulic fractures. The fracture properties are $w_f k_f = 4.0$ mD·ft and $L_f = 200$ ft. The reservoir properties are 1760 ft×5280 ft×40 ft, $\phi = 0.076$ and $k_m = 7.5 \times 10^{-3}$ mD. FIGS. 49A-49B (Heterogeneous Matrix Permeability Field), 50A-50D (Heterogeneous Matrix Depth of Investigation), 51A-51D (Heterogeneous Matrix Depth of Investigation), 52 (Heterogeneous Matrix Pressure Diagnostic Plot), 53A-53B (Optimal Number of Fractures) and 54A-54D (Depth of Investigation at 2 years) illustrate the use of the present disclosure to analyze the Cotton Valley tight gas reservoir.

An example of integrating micro-seismic and production data to understand stimulated reservoir volume (SRV) using the present disclosure will now be shown. Elements of the calculation are shown in FIGS. 55A-55D. Micro-seismic events are interpreted using an unconventional fracture model with discrete fracture network. The wire-mesh model, which essentially is an ellipse with orthogonal fractures calibrated to micro-seismic events is shown in FIGS. 56A-56C. [7-9].

Another example of analyzing a shale gas reservoir using the present disclosure will now be shown. The shale gas reservoir has four stage hydraulic fractures (FIGS. 57A-57B) and has the following reservoir parameters and fluid properties.

|  | Property | Value | Unit |
| --- | --- | --- | --- |
| Reservoir | Size | 2640 × 2280 × 50 | ft$^3$ |
|  | Grid number | 264 × 228 × 5 | — |
|  | Porosity | 0/042 | — |
|  | Initial Pressure | 3000 | psi |
|  | Temperature | 275 | °F |
| Fluid | Viscosity | 0.03 | cp |
|  | Total compressibility | 5.0E-4 | psi$^{-1}$ |
|  | Gas expansion factor | 1.404 | Mscf/bbl |
| Well/Fracture | Bottom hole pressure | 1000 | psi |
|  | Facture number | 4 | — |
|  | History matching time | 365 | day |

Figure 59:
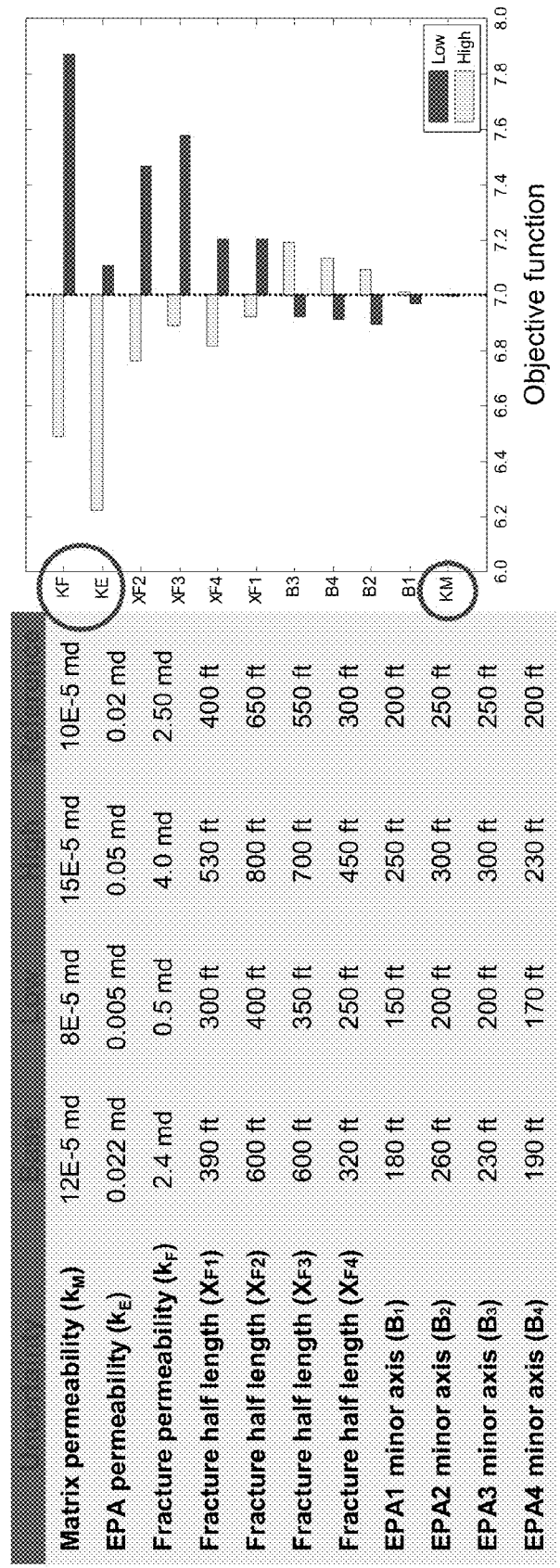
Figure 60:
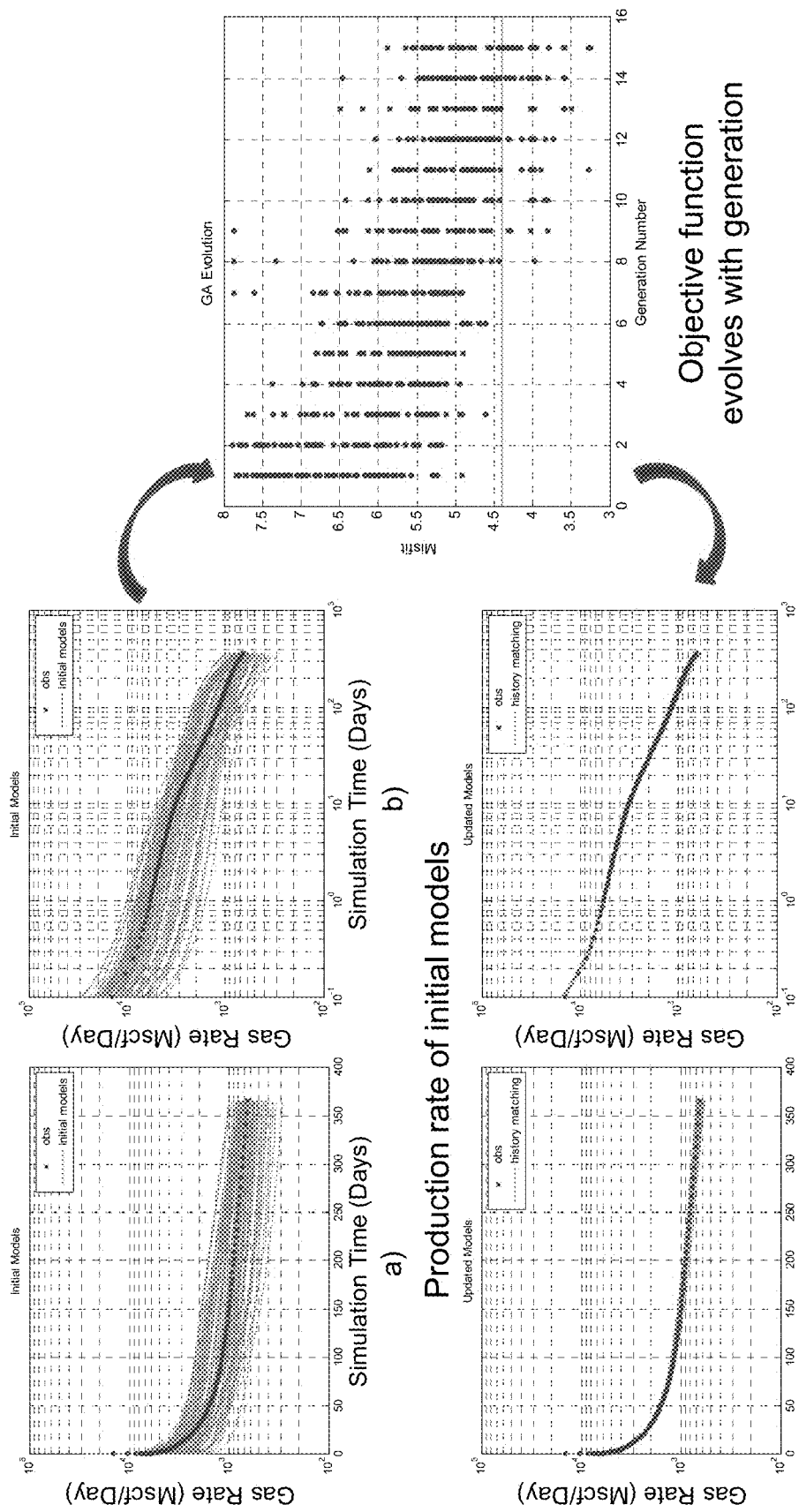

History matching is performed using a genetic algorithm as shown in FIG. 58. The genetic algorithm will vary reservoir and hydraulic fracture characteristics (permeability (fracture, EPA, matrix), fracture half-length, EPA minor axis) and calibrate against one year of production data (well gas rate). The selected parameters for history matching are shown in FIG. 59 and the results of the genetic algorithm are shown in FIG. 60. The present disclosure enables well calibration of facture and enhanced matrix permeability (FIG. 61). The matrix permeability is not sensitive for this particular case. The present disclosure provides improved estimation of fracture half length as shown in FIGS. 62A-62B. The first plateau in the drainage volume plot indicates the pore volume corresponding to the SRV (FIGS. 63A-63B). Although the present disclosure provides improved estimation of SRV, the specific shape is not able to be constrained. The reference SRV versus four updated models are shown in FIG. 64.

Figure 65A:
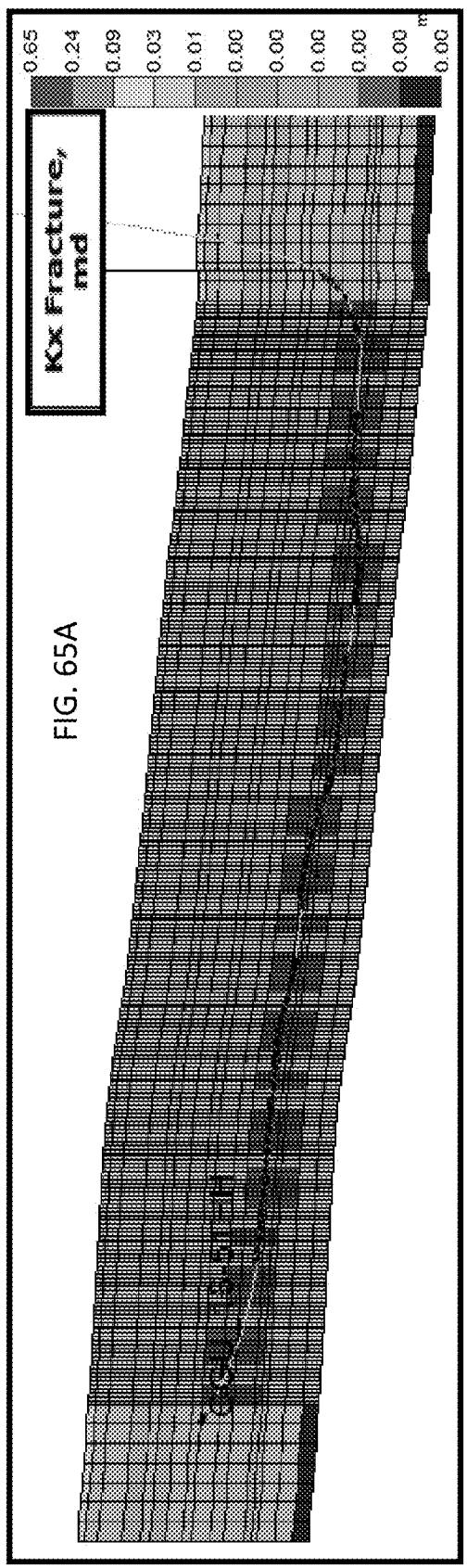
Figure 65C:
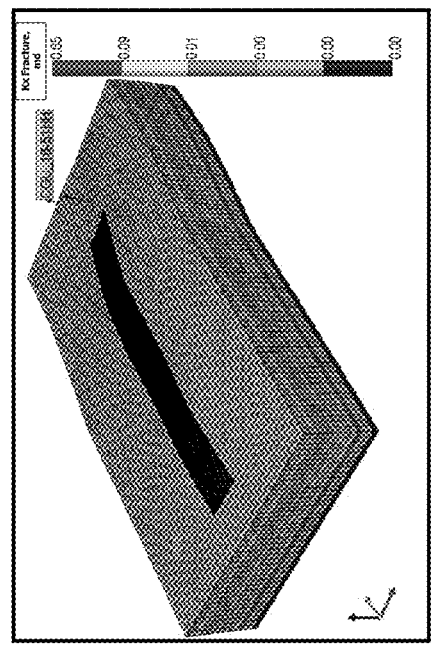
Figure 65B:
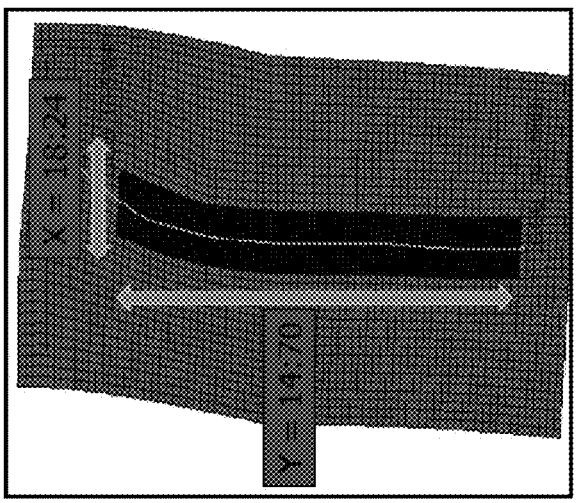
Figure 68:
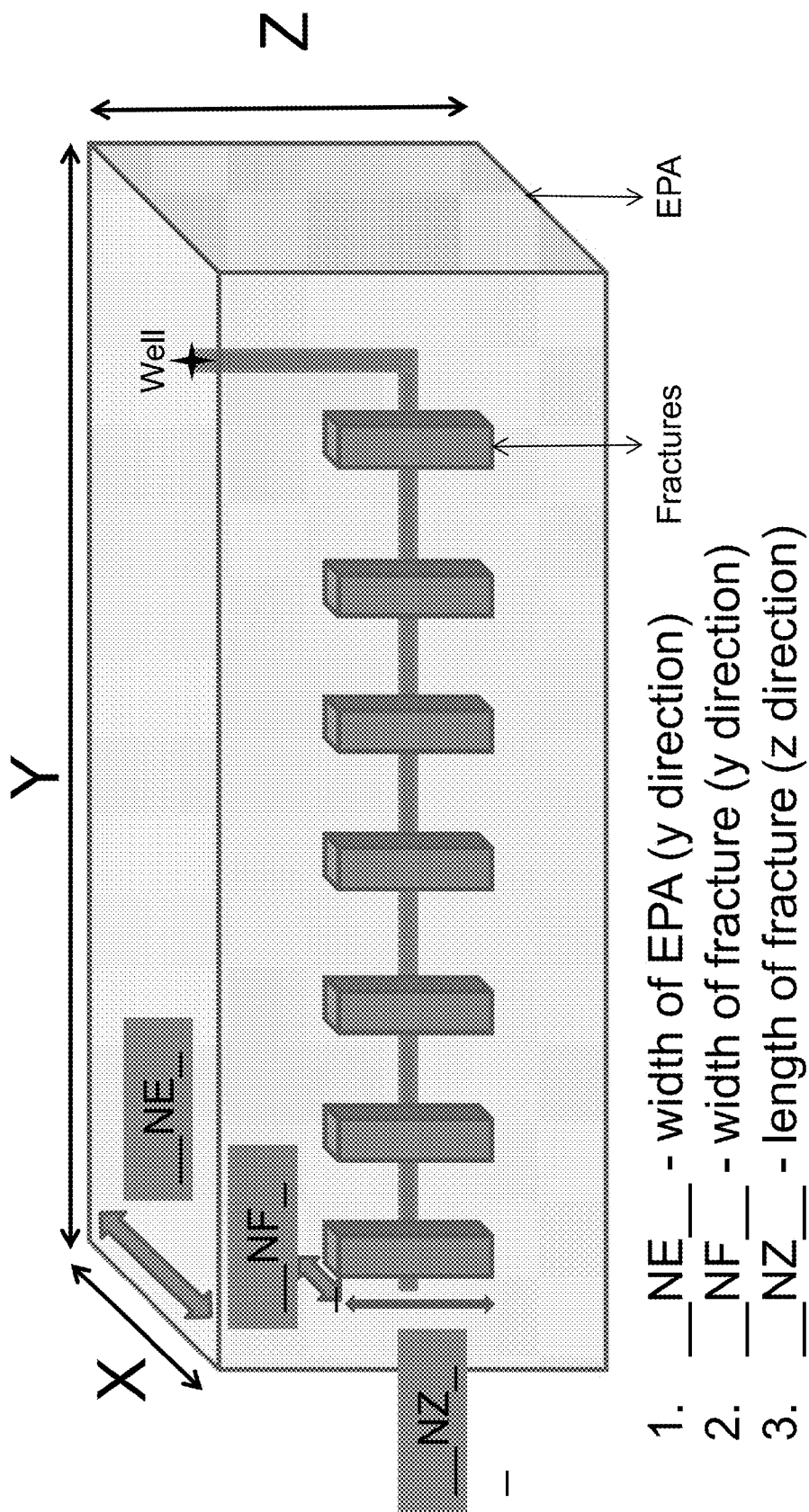
Figure 70:
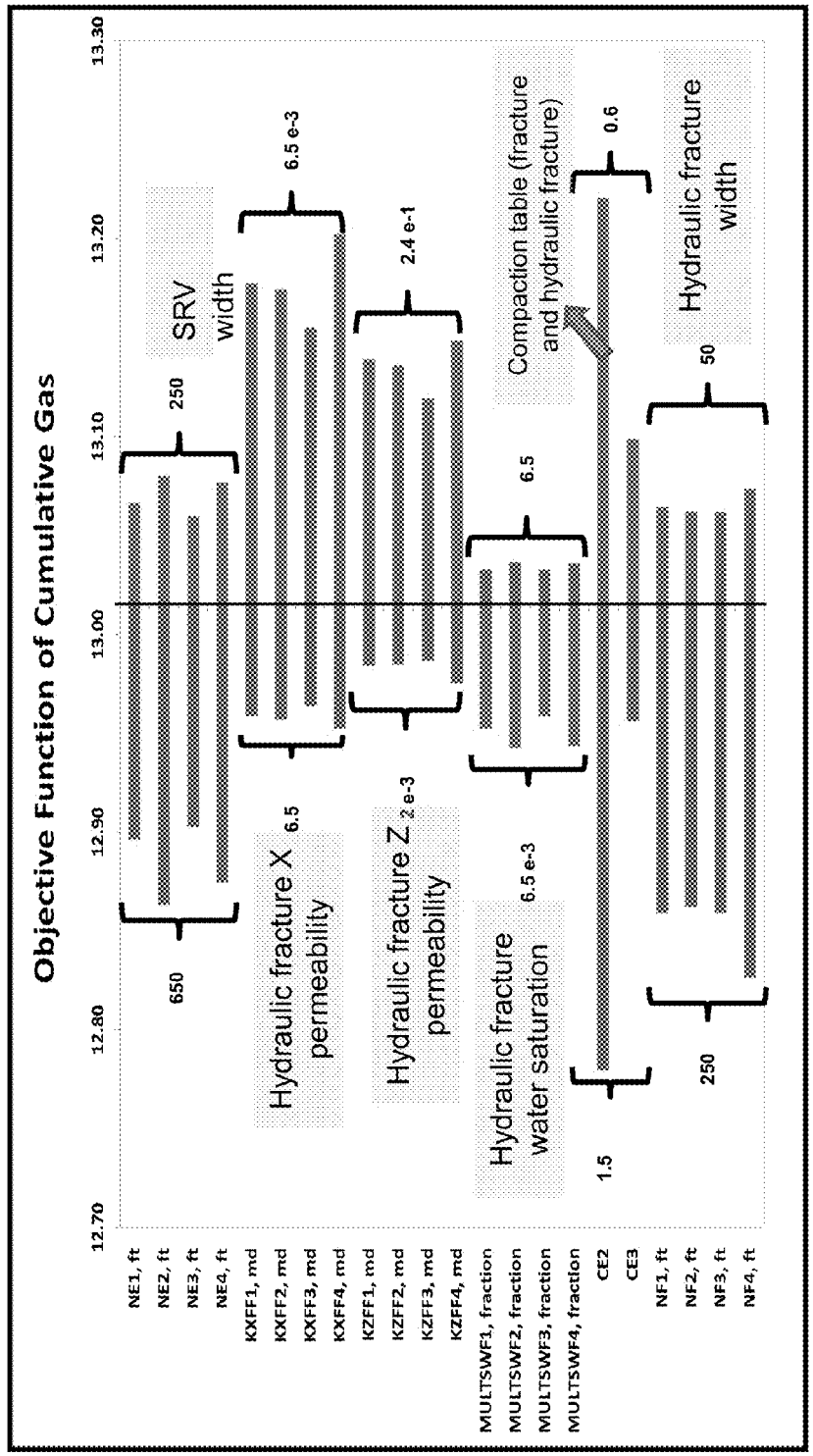
Figure 71:
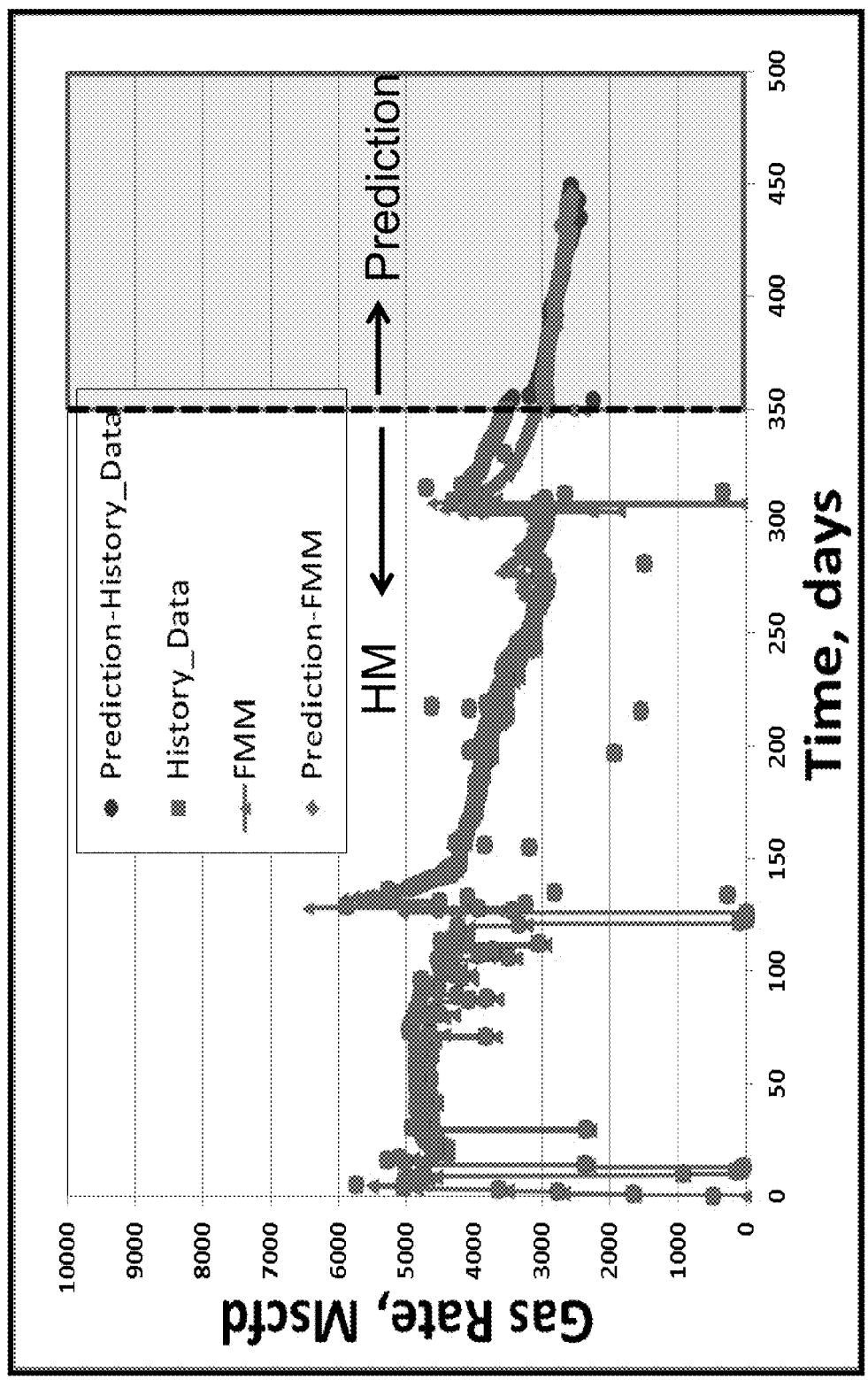
Figure 72:
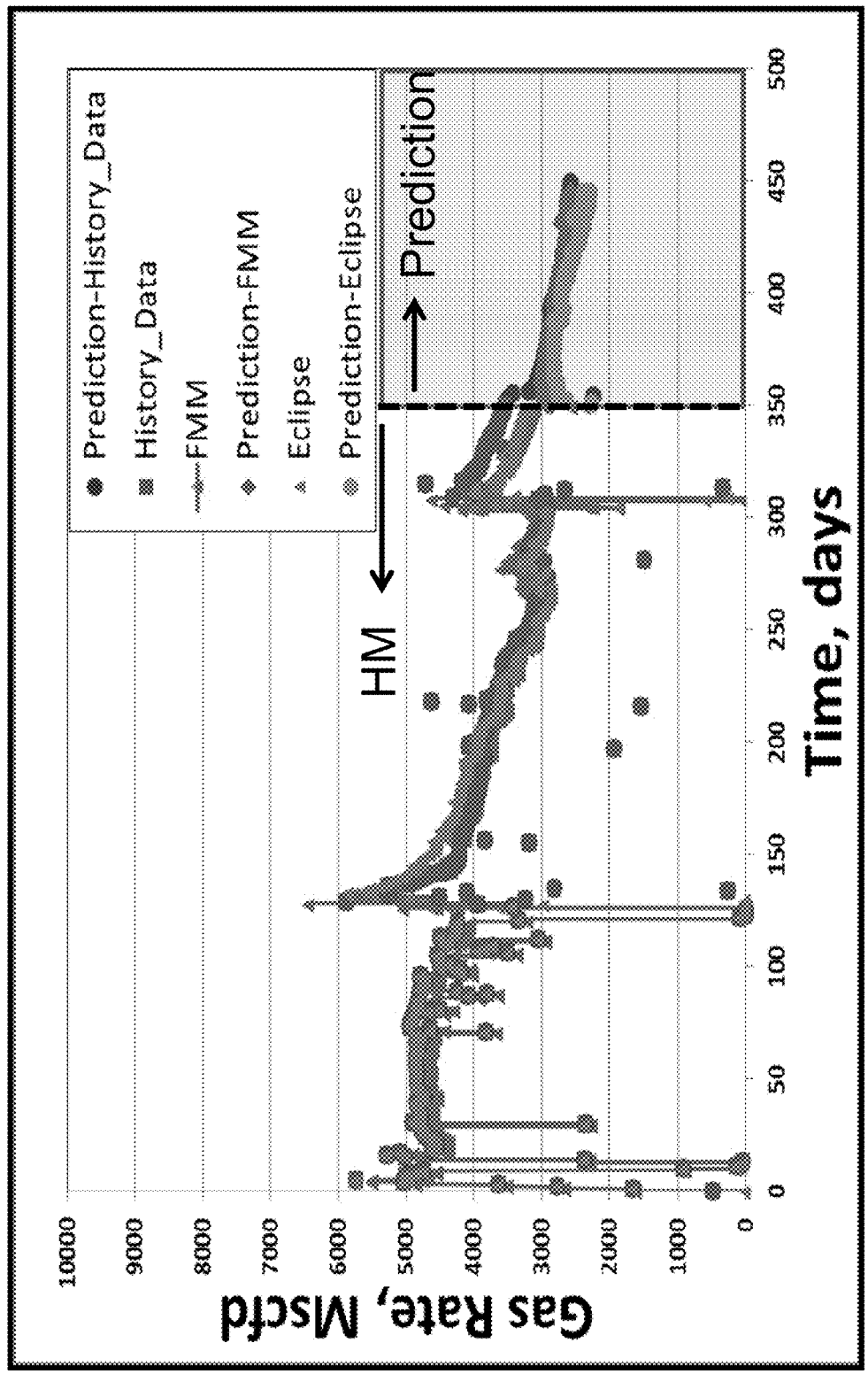

Fast history matching and performance predictions of a shale gas reservoir using the present disclosure will be shown. The model is shown in FIGS. 65A-65C. The grid is 41×77×16 with a single shale gas horizontal well in a reservoir with 22 hydraulically fractured stages. A layer cake model (i.e., only vertical heterogeneity with no areal heterogeneity) is used. DX and DY are about 100 ft., and DZ is in the order of 10 ft. The following properties were used: dual porosity; rock compaction and rock compressibility; local grid refinement; and SRV definition. FIGS. 66A-66B show FMM before history matching. FIG. 67 shows EPA sensitivity—region description. FIG. 68 shows the parameter definition for EPA and hydraulic fracture. FIG. 69 shows the parameter uncertainties for sensitivity and history matching. FIG. 70 shows a tornado diagram of the objective function—logarithm of cumulative gas misfit. FIG. 71 shows a prediction plot. FIG. 72 shows a comparison with Eclipse®.

A novel formulation of the diffusivity equation using the diffusive time of flight τ as a spatial coordinate has been shown. The diffusive time of flight can be efficiently calculated using the FMM previously presented. The diffusive time of flight contains the reservoir heterogeneity information and thus is able to reduce the three-dimensional diffusivity equation to simply one dimension in space. The major benefit is to significantly increase the numerical efficiency for pressure drainage calculation without losing too much of accuracy.

Numerical solutions based on the τ-coordinate formulation also shows several advantages over analytic approximations for the pressure drainage calculation. Both pressure and flow rate well controls can be easily implemented using the same formulation. Moreover, this formulation is quite general and can be extended to incorporate additional physical processes. It has been demonstrated that the new formulation reduces back to the traditional diffusivity equation for homogeneous reservoirs. The performance of the new formulation has been tested for both oil and gas reservoirs under various well controls and reservoir properties. In general, the results obtained by the new τ-coordinate formulation agree well with either the analytical solution or the traditional finite difference reservoir simulation. The ability of the method to take into account the reservoir compaction effect and the gas adsorption effect has been demonstrated.

In summary, the present disclosure provides some important extensions to two highly efficient reservoir modeling methods, the streamline method and the Fast Marching Method. Both methods are alternatives to conventional finite difference reservoir simulation, but lack the dispersive physics of the τ-coordinate formulation. Mainly due to their numerical efficiency, they are often found to be advantageous over the conventional simulation technique for the purpose of dynamic reservoir characterization, which often requires fast forward modeling. The extensions enable those methods to be applied to more complex grid geometries.

The formulation of the FMM in corner point grids has been developed based on the isoparametric mapping. The numerical discretization is demonstrated in detail using solution nodes based on cell centers and the local five-point stencil. For smoothly varying medium with anisotropy, it has been demonstrated that the causality condition if the principal direction of the permeability are aligned with the cell edges. For non-smoothly varying medium, numerical experiments have been performed to study the effect of possible local violation of causality at the boundary of high permeability contrast. Results show that such effects can be mitigated by using a nine-stencil scheme or doing grid refinement. An alternative discretization scheme using solution nodes based on cell vertexes can also be used to guarantee causality condition for locally high permeability contrast. However, the differences created by using different schemes are not very significant for practical applications. The foregoing demonstrates using the FMM for drainage volume visualization for unconventional reservoirs and wells with multi-stage hydraulic fractures.

The present disclosure provides a novel formulation of the diffusivity equation using the diffusive time of flight as a spatial variable. This new formulation enables the calculation of pressure drainage based on the results of the FMM. Because the diffusive time of flight obtained by the FMM contains the reservoir heterogeneity information, the new formulation essentially reduces the 3D problem to only 1D in space. This greatly improves the numerical efficiency without losing too much accuracy. The new formulation has been benchmarked by using various test cases including both oil and gas, homogeneous and heterogeneous reservoirs. The results have been compared with analytical solutions or commercial finite difference reservoir simulators. In order to deal with shale gas reservoirs, additional physical processes have been incorporated into the formulation that could take into account reservoir compaction effect, gas adsorption effect etc.

It will be understood that particular embodiments described herein are shown by way of illustration and not as limitations of the disclosure. The principal features of this disclosure can be employed in various embodiments without departing from the scope of the disclosure. Those skilled in the art will recognize, or be able to ascertain using no more than routine experimentation, numerous equivalents to the specific procedures described herein. Such equivalents are considered to be within the scope of this disclosure and are covered by the claims.

All publications, patents and patent applications mentioned in the specification are indicative of the level of skill of those skilled in the art to which this disclosure pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context.

All of the compositions and/or methods disclosed and claimed herein can be made and executed without undue experimentation in light of the present disclosure. While the compositions and methods of this disclosure have been described in terms of preferred embodiments, it will be apparent to those of skill in the art that variations may be applied to the compositions and/or methods and in the steps or in the sequence of steps of the method described herein without departing from the concept, spirit and scope of the disclosure. All such similar substitutes and modifications apparent to those skilled in the art are deemed to be within the spirit, scope and concept of the disclosure as defined by the appended claims.

REFERENCES

[1] Agarwal, R. G. (2010), Direct method of estimating average reservoir pressure for flowing oil and gas wells, in *SPE Annual Technical Conference and Exhibition*, Society of Petroleum Engineers, Florence, Italy, doi:10.2118/135804-MS.

[2] Akkutlu, I. Y., and E. Fathi (2012), Multiscale gas transport in shales with local kerogen heterogeneities, *SPE Journal*, 17(4), pp. 1002-1011, doi:10.2118/146422-PA.

[3] Alton, K., and I. M. Mitchell (2008), Fast marching methods for stationary Hamilton Jacobi equations with axis-aligned anisotropy, *SIAM Journal on Numerical Analysis*, 47(1), 363-385, doi:10.1137/070680357.

[4] Bourdet, D., J. Ayoub, and Y. Pirard (1989), Use of pressure derivative in well test interpretation, *SPE Formation Evaluation*, 4(2), 293-302, doi:10.2118/12777-PA.

[5] Bravo, M. C. (2007), Effect of transition from slip to free molecular flow on gas transport in porous media, *Journal of Applied Physics*, 102(7), 074905, doi:10.1063/1.2786613.

[6] Cipolla, C. L., E. Lolon, J. C. Erdle, and B. Rubin (2009), Reservoir modeling in shale-gas reservoirs, in *SPE Eastern Regional Meeting*, Society of Petroleum Engineers, Charleston, W. Va., USA, doi:10.2118/125530-MS.

[7] Cipolla, C. L., X. Weng, H. Onda, T. Nadaraja, U. Ganguly, and R. Malpani (2011 a), New algorithms and integrated work flow for tight gas and shale completions, in *SPE Annual Technical Conference and Exhibition*, Society of Petroleum Engineers, Denver, Colo., USA, doi:10.2118/146872-MS.

[8] Cipolla, C. L., X. Weng, M. G. Mack, U. Ganguly, H. Gu, 0. Kresse, and C. E. Cohen (2011b), Integrating microseismic mapping and complex fracture modeling to characterize fracture complexity, in *SPE Hydraulic Fracturing Technology Conference*, Society of Petroleum Engineers, The Woodlands, Tex., USA, doi:10.2118/140185-MS.

[9] Cipolla, C. L., S. C. Maxwell, and M. G. Mack (2012), Engineering guide to the application of microseismic interpretations, in *SPE Hydraulic Fracturing Technology Conference*, Society of Petroleum Engineers, The Woodlands, Tex., USA, doi:10.2118/152165-MS.

[10] Clarkson, C. R., M. Nobakht, D. Kaviani, and T. Ertekin (2012), Production analysis of tight-gas and shale-gas reservoirs using the dynamic-slippage concept, *SPE Journal*, 17(1), pp. 230-242, doi:10.2118/144317-PA.

[11] Cormen, T. H., C. E. Leiserson, R. L. Rivest (1990), *Introduction to Algorithms*, The MIT Press.

[12] Darlow, B., R. Ewing, and M. Wheeler (1984), Mixed finite element method for miscible displacement problems in porous media, *SPE Journal*, 24(4), 391-398, doi:10.2118/10501-PA.

[13] Datta-Gupta, A., and M. King (2007), *Streamline Simulation: Theory and Practice*, Textbook Series, SPE, Richardson, Tex.

[14] Datta-Gupta, A., J. Xie, N. Gupta, M. J. King, and L. W. J. (2011), Radius of investigation and its generalization to unconventional reservoirs, *JPT*, 63(7).

[15] Dijkstra, E. W. (1959), A note on two problems in connection with graphs, *Numerische Mathematik*, 1:269-271.

[16] Fan, L., J. W. Thompson, and J. R. Robinson (2010), Understanding gas production mechanism and effectiveness of well stimulation in the haynesville shale through reservoir simulation, in *Canadian Unconventional Resources and International Petroleum Conference*, Society of Petroleum Engineers, Calgary, Alberta, Canada, doi:10.2118/136696-MS.

[17] Fathi, E., and I. Y Akkutlu (2013), Lattice boltzmann method for simulation of shale gas transport in kerogen, *SPE Journal*, 18(1), pp. 27-37, doi:10.2118/146821-PA.

[18] Fetkovich, M. (1980), Decline curve analysis using type curves, *Journal of Petroleum Technology*, 32(6), 1065-1077, doi:10.2118/4629-PA.

[19] Freeman, C., G. J. Moridis, D. Ilk, and T. Blasingame (2010), A numerical study of transport and storage effects for tight gas and shale gas reservoir systems, in *International Oil and Gas Conference and Exhibition in China*, Society of Petroleum Engineers, Beijing, China, doi:10.2118/131583-MS.

[20] Gupta, N. (2012), A novel approach for rapid estimation of drainage volume and prediction of pressure and rate behavior, Master's thesis, Texas A&M University.

[21] Holdich, S. A. (2010), Shale gas holds global opportunities, *The American Oil & Gas Reporter*, editor's choice.

[22] Ilk, D., S. M. Currie, and T. A. Blasingame (2010), Production analysis and well performance forecasting of tight gas and shale gas wells, in *SPE Eastern Regional Meeting*, Society of Petroleum Engineers, Morgantown, W. Va., USA, doi:10.2118/139118-MS.

[23] Javadpour, F. (2009), Nanopores and apparent permeability of gas flow in mudrocks (shales and siltstone), *Journal of Canadian Petroleum Technology*, 48(8), 16-21, doi:10.2118/09-08-16-DA.

[24] Javadpour, F., D. Fisher, and M. Unsworth (2007), Nanoscale gas flow in shale gas sediments, *Journal of Canadian Petroleum Technology*, 46(10), doi:10.2118/07-10-06.

[25] Kim, J., and G. J. Moridis (2012), Gas flow tightly coupled to elastoplastic geomechanics for tight and shale gas reservoirs: Material failure and enhanced permeability, in *SPE Americas Unconventional Resources Conference*, Society of Petroleum Engineers, Pittsburgh, Pa. USA, doi: 10.2118/155640-MS.

[26] Kim, J. U., A. Datta-Gupta, R. Brouwer, and B. Haynes (2009), Calibration of high-resolution reservoir models using transient pressure data, in *SPE Annual Technical Conference and Exhibition*, Society of Petroleum Engineers, New Orleans, La. doi:10.2118/124834-MS.

[27] King, M. J., P. R. Bailin, C. Bennis, D. E. Heath, A. D. Hiebert, W. McKenzie, J.-F. Rainaud, and J. Schey (2012), Reservoir modeling: From rescue to resqml, *SPE Reservoir Evaluation & Engineering*, 15(2), 127-138, doi: 10.2118/135280-PA.

[28] Klinkenberg, L. J. (1941), The permeability of porous media to liquids and gases, in *Drilling and Production Practice*, pp. 200-213, American Petroleum Institute.

[29] Konukoglu, E., M. Sermesant, O. Clatz, J.-M. Peyrat, H. Delingette, and N. Ayache (2007), A recursive anisotropic fast marching approach to reaction diffusion equation: application to tumor growth modeling, in *Proceedings of the 20th international conference on Information processing in medical imaging*, IPMI'07, pp. 687-699, Springer-Verlag, Berlin, Heidelberg.

[30] Kulkarni, K. N., A. Datta-Gupta, and D. Vasco (2000), A streamline approach for integrating transient pressure data into high resolution reservoir models, in *SPE European Petroleum Conference*, Society of Petroleum Engineers Inc., Paris, France, doi:10.2118/65120-MS.

[31] Langmuir, I. (1916), The constitution and fundamental properties of solids and liquids. part i. solids., *Journal of the American Chemical Society*, 38(11), 2221-2295, doi: 10.1021/ja02268a002.

[32] Lee, W. J. (1982), *Well Testing*, Society of Petroleum Engineers, Richardson, Tex.

[33] Lelièvre, P. G., C. G. Farquharson, and C. A. Hurich (2011), Computing first-arrival seismic traveltimes on unstructured 3-d tetrahedral grids using the fast marching method, *Geophysical Journal International*, 184(2), 885-896.

[34] Nordbotten, J. M., M. A. Celia, and S. Bachu (2004), Analytical solutions for leakage rates through abandoned wells, *Water Resour. Res.*, 40(4), W04, 204.

[35] Ponting, D. (1989), Corner point geometry in reservoir simulation, in 1*st European Conference on the Mathematics of Oil Recovery*, pp. 45-65, Oxford.

[36] Qian, J., Y.-T. Zhang, and H.-K. Zhao (2007), A fast sweeping method for static convex hamilton-jacobi equations, *Journal of Scientific Computing*, 31, 237-271, 10.1007/s10915-006-9124-6.

[37] Sethian, J. A. (1996), A fast marching level set method for monotonically advancing fronts, *Proceedings of the National Academy of Sciences*, 93(4), 1591-1595.

[38] Sethian, J. A. (1999a), Level Set Methods and Fast Marching Methods: Evolving Interfaces in *Computational Geometry, Fluid Mechanics, Computer Vision, and Materials Science*, Cambridge Monographs on Applied and Computational Mathematics, 2nd ed., Cambridge University Press.

[39] Sethian, J. A. (1999b), Fast marching methods, *SIAM Review*, 41(2), 199-235.

[40] Sethian, J. A., and A. Vladimirsky (2000), Fast methods for the eikonal and related hamilton-jacobi equations on unstructured meshes, *Proceedings of the National Academy of Sciences*, 97(11), 5699-5703, doi:10.1073/pnas.090060097.

[41] Sethian, J. A., and A. Vladimirsky (2001), Ordered upwind methods for static hamilton-jacobi equations, *Proceedings of the National Academy of Sciences*, 98(20), 11,069-11,074, doi:10.1073/pnas.201222998.

[42] Shabro, V., C. Torres-Verdin, and F. Javadpour (2011), Numerical simulation of shale-gas production: From pore-scale modeling of slip-flow, knudsen diffusion, and langmuir desorption to reservoir modeling of compressible fluid, in *North American Unconventional Gas Conference and Exhibition*, Society of Petroleum Engineers, The Woodlands, Tex., USA, doi:10.2118/144355-MS.

[43] Shabro, V., C. Torres-Verdin, and K. Sepehrnoori (2012), Forecasting gas production in organic shale with the combined numerical simulation of gas diffusion in kerogen, langmuir desorption from kerogen surfaces, and advection in nanopores, in *SPE Annual Technical Conference and Exhibition*, Society of Petroleum Engineers, San Antonio, Tex., USA, doi:10.2118/159250-MS.

[44] Song, B., and C. A. Ehlig-Economides (2011), Rate-normalized pressure analysis for determination of shale gas well performance, in *North American Unconventional Gas Conference and Exhibition*, Society of Petroleum Engineers, The Woodlands, Tex., USA, doi:10.2118/144031-MS.

[45] Sun, Y., and S. Fomel (1998), Fast-marching eikonal solver in the tetragonal coordinates, in *SEG Annual Meeting*, Society of Exploration Geophysicists, New Orleans, La.

[46] Swami, V., and A. Settari (2012), A pore scale gas flow model for shale gas reservoir, in *SPE Americas Unconventional Resources Conference*, Society of Petroleum Engineers, Pittsburgh, Pa. USA, doi: 10.2118/155756-MS.

[47] Valko, P. P., and W. J. Lee (2010), A better way to forecast production from unconventional gas wells, in *SPE Annual Technical Conference and Exhibition*, Society of Petroleum Engineers, Florence, Italy, doi:10.2118/134231-MS.

[48] Vasco, D. W., H. Keers, and K. Karasaki (2000), Estimation of reservoir properties using transient pressure data: An asymptotic approach, *Water Resour. Res.*, 36(12), 3447-3465.

[49] Virieux, J., C. Flores-Luna, and D. Gibert (1994), Asymptotic theory for diffusive electromagnetic imaging,

*Geophysical Journal International*, 119(3), 857-868, doi: 10.1111/j.1365-246X.1994.tb04022.x.

[50] Xie, J., N. Gupta, M. J. King, and A. D. Gupta (2012a), Depth of investigation and depletion behavior in unconventional reservoirs using fast marching methods, in SPE Europec/EAGE Annual Conference, Society of Petroleum Engineers, Copenhagen, Denmark, doi:10.2118/154532-MS.

[51] Xie, J., C. Yang, N. Gupta, M. J. King, and A. D. Gupta (2012b), Integration of shale gas production data and microseismic for fracture and reservoir properties using fast marching method, in *SPE Eastern Regional Meeting*, Society of Petroleum Engineers, Lexington, Ky., USA, doi: 10.2118/161357-MS.

What is claimed is:

1. A computerized method for determining a performance data for a hydrocarbon reservoir, comprising the steps of:
   providing a data storage, an output device and one or more processors communicably coupled to the data storage and the output device;
   obtaining a heterogeneous multi-dimensional model of at least a portion of the hydrocarbon reservoir divided into cells, each cell having a volume and one or more other attributes;
   calculating a diffusive time of flight based upon the heterogeneous multi-dimensional model using the processor;
   transforming the heterogeneous multi-dimensional model to an equivalent homogeneous one-dimensional model by defining the diffusive time of flight as a spatial variable using the processor;
   determining the performance data for the hydrocarbon reservoir based on the equivalent homogeneous one-dimensional model using the processor; and
   providing the performance data to the output device using the processor.

2. The method as recited in claim 1, the step of calculating the diffusive time of flight based upon the heterogeneous multi-dimensional model using the processor comprises the step of calculating the diffusive time of flight based upon the heterogeneous multi-dimensional model by solving an Eikonal equation.

3. The method as recited in claim 1, the step of calculating the diffusive time of flight based upon the heterogeneous multi-dimensional model using the processor includes a corner point grid geometry effect(s) and a permeability anisotropy effect(s).

4. The method as recited in claim 1, the step of calculating the diffusive time of flight based upon the heterogeneous multi-dimensional model using the processor comprises the steps of:
   interpolating a velocity field throughout the heterogeneous multi-dimensional model;
   constructing one or more streamline trajectories within the heterogeneous multi-dimensional model based on the velocity field; and
   calculating the diffusive time of flight along each streamline trajectory.

5. The method as recited in claim 1, the step of calculating the diffusive time of flight based upon the heterogeneous multi-dimensional model using the processor comprises the step of calculating the diffusive time of flight based upon the heterogeneous multi-dimensional model using a shortest path algorithm.

6. The method as recited in claim 5, the shortest path algorithm comprising a Dijkstra's algorithm.

7. The method as recited in claim 1, the step of calculating the diffusive time of flight based upon the heterogeneous multi-dimensional model using the processor comprises the step of calculating the diffusive time of flight based upon the heterogeneous multi-dimensional model using a Fast Marching Method.

8. The method as recited in claim 1, the step of calculating the diffusive time of flight based upon the heterogeneous multi-dimensional model using the processor comprises the steps of:
   the heterogeneous multi-dimensional model comprises a first heterogeneous multi-dimensional model for a first medium within the hydrocarbon reservoir, and one or more additional heterogeneous multi-dimensional models for one or more additional mediums within the hydrocarbon reservoir;
   calculating a first diffusive time of flight based upon the first heterogeneous multi-dimensional model by using a Fast Marching Method;
   calculating one or more additional diffusive time of flight(s) based upon the one or more additional heterogeneous multi-dimensional model(s) by using the Fast Marching Method; and
   coupling the first diffusive time of flight with the one or more additional diffusive time of flight(s) using a Dijkstra's algorithm.

9. The method as recited in claim 1, each cell comprising a polygon having five or more sides and further comprising the step of refining each polygon into a triangle or a quadrilateral using a sub-cell refinement method.

10. The method as recited in claim 1, the step of transforming the multi-dimensional model to the equivalent one-dimensional model by defining the diffusive time of flight as the spatial variable comprising the steps of:
    defining an Eikonal equation obtained from an asymptotic solution to a pressure diffusivity equation;
    solving the defined Eikonal equation; and
    transforming the pressure diffusivity equation into an equivalent one-dimensional form based on the diffusive time of flight as the spatial variable.

11. The method as recited in claim 10, the defined one dimensional diffusivity equation comprising:

$$\frac{\partial}{\partial \tau}\left(w(\tau)\frac{\partial P}{\partial \tau}\right) = w(\tau)\frac{\partial P}{\partial t}$$

where:

$$w(\tau) = \int\int \phi J(\tau, \psi, \chi) d\psi d\chi = \frac{dV_p(\tau)}{d\tau}$$

$\tau$ is the diffusive time of flight,
P is a pressure,
t is a time,
$\phi$ is a porosity of the hydrocarbon reservoir,
J is a Jacobian of a coordinate transformation, and
$\psi$ and $\chi$ are defined on the contour surfaces of $\tau$ and are orthogonal to each other and to $\tau$.
$V_p(\tau)$ Drainage pore volume obtained from the Eikonal solution.

12. The method as recited in claim 11, the hydrocarbon reservoir is slightly compressible and $$w(\tau) = \frac{dV_p(\tau)}{d\tau}$$

with a wellbore flow rate boundary condition of $$\left(w(\tau)\frac{\partial P}{\partial \tau}\right)_{\tau=\tau_w} = \frac{q_w}{c_t},$$

an outer flow rate boundary condition of $$\left(w(\tau)\frac{\partial P}{\partial \tau}\right)_{\tau=\tau_e} = \frac{q_e}{c_t},$$

a wellbore pressure boundary condition of $P|_{\tau=\tau_w}=P_{wf}$ and an outer pressure boundary condition of $P|_{\tau=\tau_e}=P_e$ where $\tau_w$ is a lower bound corresponding with a wellbore radius, $\tau_e$ is an upper bound corresponding with a boundary of the hydrocarbon reservoir, q is a down-hole flow rate, and $c_t$ is a total compressibility.

13. The method as recited in claim 10, the hydrocarbon reservoir is compressible and the defined one dimensional diffusivity equation comprises:

$$\frac{\partial}{\partial \tau}\left(w(\tau)\frac{P}{\tilde{\mu}(P)Z(P)}\frac{\partial P}{\partial \tau}\right) = w(\tau)\tilde{c}_t(P)\frac{P}{Z(P)}\frac{\partial P}{\partial t}$$

where:

$$w(\tau) = \int\int \phi J(\tau, \psi, \chi) d\psi d\chi = \frac{dV_p(\tau)}{d\tau}$$

$\tau$ is the diffusive time of flight,
P is a pressure, $$\tilde{\mu}(P) = \frac{\mu(P)}{\mu_i},$$

$\mu$ is a fluid viscosity, $$\tilde{c}(P) = \frac{c_t(P)}{c_{ti}},$$

c is a fluid compressibility,
Z is a compressibility factor,
t is a time,
$\phi$ is a porosity of the hydrocarbon reservoir,
J is a Jacobian of a coordinate transformation,
$\psi$ and $\chi$ are defined on the contour surfaces of $\tau$ and are orthogonal to each other and to $\tau$, and
$V_p(\tau)$ Drainage pore volume obtained from the Eikonal solution.

14. The method as recited in claim 1, the heterogeneous multi-dimensional model comprising any of a 2D model, a 2.5D model and a 3D model, and each cell comprises a triangle, a quadrilateral, or a polygon having five or more sides.

15. The method as recited in claim 1, the heterogeneous multi-dimensional model comprising a dual porosity model with any of a single permeability or a dual permeability.

16. The method as recited in claim 1, the homogeneous one-dimensional model further includes one or more additional physics relating to the hydrocarbon reservoir.

17. The method as recited in claim 16, the one or more additional physics comprising a slightly compressible flow, a compressible flow, a gas adsorption, a geomechanical or compaction effect, a dual porosity or permeability, a multi-phase flow, an adsorption/Knudsen diffusion, a non-Darcy effect, a compositional flows/anomalous phase behavior, or a combination thereof.

18. The method as recited in claim 1, the hydrocarbon reservoir is assumed to have Darcy flow, no gravity effects, isotropic properties, fluid has small consistent compressibility and no geomechanical effects.

19. The method as recited in claim 1, further comprising the step of characterizing a carbonate reservoir using the performance data.

20. The method as recited in claim 1, the performance data comprising one or more geomechanical effects.

21. The method as recited in claim 1, the performance data comprising a reservoir drainage volume, a reservoir pressure, a reservoir fluid flow rate, a well pressure, a well flow rate or a combination thereof.

22. The method as recited in claim 1, the performance data comprising a bottom hole flowing pressure for each well in the hydrocarbon reservoir during a draw-down, and a well rate as a function of the bottom hole flowing pressure during a routine production.

23. The method as recited in claim 1, further comprising the steps of:
  assessing, calibrating or optimizing a multi-stage fracture design of the hydrocarbon reservoir based on the performance data using the processor; and
  providing the assessed, calibrated or optimized multi-stage fracture design to the output device.

24. The method as recited in claim 1, further comprising the steps of:
  optimizing a spacing and a timing of two or more wells within the hydrocarbon reservoir based on the performance data using the processor; and
  providing the optimized spacing and the optimized timing of the two or more wells within the reservoir to the output device.

25. The method as recited in claim 1, further comprising the steps of:
  ranking, or calibrating, or uncertainty assessment of the models of the hydrocarbon reservoir against a field performance data of the hydrocarbon reservoir based the performance data using the processor; and
  providing the ranked or calibrated model of the hydrocarbon reservoir to the output device.

26. The method as recited in claim 1, wherein:
  the data storage comprises a memory, a fixed data storage device, a removable storage device, or a combination thereof; and
  the output device comprises a display, a printer, a communications interface, the data storage, a removable data storage device, or a combination thereof.

27. A non-transitory computer readable medium encoded with a computer program for determining a performance data for a hydrocarbon reservoir that when executed by one or more processors perform the steps comprising:

obtaining a heterogeneous multi-dimensional model of at least a portion of the hydrocarbon reservoir divided into cells, each cell having a volume and one or more other attributes;

calculating a diffusive time of flight based upon the heterogeneous multi-dimensional model;

transforming the heterogeneous multi-dimensional model to an equivalent homogeneous one-dimensional model by defining the diffusive time of flight as a spatial variable;

determining the performance data for the hydrocarbon reservoir based on the equivalent homogeneous one-dimensional model; and providing the performance data to an output device.

28. The non-transitory computer readable medium as recited in claim 27, the step of calculating the diffusive time of flight based upon the heterogeneous multi-dimensional model using the processor comprises the step of calculating the diffusive time of flight based upon the heterogeneous multi-dimensional model by solving an Eikonal equation.

29. The non-transitory computer readable medium as recited in claim 27, the step of calculating the diffusive time of flight based upon the heterogeneous multi-dimensional model using the processor includes a corner point grid geometry effect(s) and a permeability anisotropy effect(s).

30. The non-transitory computer readable medium as recited in claim 27, the step of calculating the diffusive time of flight based upon the heterogeneous multi-dimensional model using the processor comprises the steps of:

interpolating a velocity field throughout the heterogeneous multi-dimensional model;

constructing one or more streamline trajectories within the heterogeneous multi-dimensional model based on the velocity field; and calculating the diffusive time of flight along each streamline trajectory.

31. The non-transitory computer readable medium as recited in claim 27, the step of calculating the diffusive time of flight based upon the heterogeneous multi-dimensional model using the processor comprises the step of calculating the diffusive time of flight based upon the heterogeneous multi-dimensional model using a shortest path algorithm.

32. The non-transitory computer readable medium as recited in claim 31, the shortest path algorithm comprising a Dijkstra's algorithm.

33. The non-transitory computer readable medium as recited in claim 27, the step of calculating the diffusive time of flight based upon the heterogeneous multi-dimensional model using the processor comprises the step of calculating the diffusive time of flight based upon the heterogeneous multi-dimensional model using a Fast Marching Method.

34. The non-transitory computer readable medium as recited in claim 27, the step of calculating the diffusive time of flight based upon the heterogeneous multi-dimensional model using the processor comprises the steps of:

the heterogeneous multi-dimensional model comprises a first heterogeneous multi-dimensional model for a first medium within the hydrocarbon reservoir, and one or more additional heterogeneous multi-dimensional models for one or more additional mediums within the hydrocarbon reservoir;

calculating a first diffusive time of flight based upon the first heterogeneous multi-dimensional model by using a Fast Marching Method;

calculating one or more additional diffusive time of flight(s) based upon the one or more additional heterogeneous multi-dimensional model(s) by using the Fast Marching Method; and coupling the first diffusive time of flight with the one or more additional diffusive time of flight(s) using a Dijkstra's algorithm.

35. The non-transitory computer readable medium as recited in claim 27, each cell comprising a polygon having five or more sides and further comprising the step of refining each polygon into a triangle or a quadrilateral using a sub-cell refinement method.

36. The non-transitory computer readable medium as recited in claim 27, the step of transforming the multi-dimensional model to the equivalent one-dimensional model by defining the diffusive time of flight as the spatial variable comprising the steps of:

defining an Eikonal equation obtained from an asymptotic solution to a pressure diffusivity equation;

solving the defined Eikonal equation; and transforming the pressure diffusivity equation into an equivalent one-dimensional form based on the diffusive time of flight as the spatial variable.

37. The non-transitory computer readable medium as recited in claim 36, the defined one dimensional diffusivity equation comprising:

$$\frac{\partial}{\partial t}\left(w(\tau)\frac{\partial P}{\partial \tau}\right) = w(\tau)\frac{\partial P}{\partial t}$$

where: $w(\tau) = \iint \phi J(\tau, \psi, \chi) d\psi P\chi$ $\tau$ is the diffusive time of flight, P is a pressure, t is a time, $\phi$ is a porosity of the hydrocarbon reservoir, J is a Jacobian of a coordinate transformation, and $\psi$ and $\chi$ are defined on the contour surfaces of $\tau$ and are orthogonal to each other and to $\tau$.

38. The non-transitory computer readable medium as recited in claim 37, the hydrocarbon reservoir is slightly compressible and $$w(\tau) = \frac{dV_p(\tau)}{d\tau}$$

with a wellbore flow rate boundary condition of $$\left(w(\tau)\frac{\partial P}{\partial \tau}\right)_{\tau=\tau_w} = \frac{q_w}{c_t},$$

and outer flow rate boundary condition of $$\left(w(\tau)\frac{\partial P}{\partial \tau}\right)_{\tau=\tau_e} = \frac{q_e}{c_t},$$

a wellbore pressure boundary condition of $P|_{\tau=\tau_w} = P_{wf}$ and an outer pressure boundary condition of $P|_{\tau=\tau_e} = P_e$ where $\tau_w$ is a lower bound corresponding with a wellbore radius, $\tau_e$ is an upper bound corresponding with a boundary of the hydrocarbon reservoir, q is a down-hole flow rate, and $c_t$ is a total compressibility.

39. The non-transitory computer readable medium as recited in claim 36, the hydrocarbon reservoir is compressible and the defined one dimensional diffusivity equation comprises:

$$\frac{\partial}{\partial \tau}\left(w(\tau)\frac{P}{\tilde{\mu}(P)Z(P)}\frac{\partial P}{\partial \tau}\right) = w(\tau)\tilde{c}(P)\frac{P}{Z(P)}\frac{\partial P}{\partial t}$$

where: $w(\tau) = \iint \phi J(\tau, \psi, \chi) d\psi d\chi$ $\tau$ is the diffusive time of flight, P is a pressure, $$\tilde{\mu}(P) = \frac{\mu(P)}{\mu_i},$$

$\mu$ is a fluid viscosity, $$\tilde{c}(P) = \frac{c_t(P)}{c_{ti}},$$

c is a fluid compressibility,

Z is a compressibility factor, t is a time, $\phi$ is a porosity of the hydrocarbon reservoir, J is a Jacobian of a coordinate transformation, and $\psi$ and $\chi$ are defined on the contour surfaces of $\tau$ and are orthogonal to each other and to $\tau$.

40. The non-transitory computer readable medium as recited in claim 27, the heterogeneous multi-dimensional model comprising a 2D model, a 2.5D model or a 3D model, and each cell comprises a triangle, a quadrilateral, or a polygon having five or more sides.

41. The non-transitory computer readable medium as recited in claim 27, the heterogeneous multi-dimensional model comprising a dual porosity model with either single permeability or dual permeability.

42. The non-transitory computer readable medium as recited in claim 27, the homogeneous one-dimensional model further includes one or more additional physics relating to the hydrocarbon reservoir.

43. The non-transitory computer readable medium as recited in claim 42, the one or more additional physics comprising a slightly compressible flow, a compressible flow, a gas adsorption, a geomechanical or compaction effect, a dual porosity or permeability, a multi-phase flow, an adsorption/Knudsen diffusion, a non-Darcy effect, a compositional flows/anomalous phase behavior, or a combination thereof.

44. The non-transitory computer readable medium as recited in claim 27, the hydrocarbon reservoir is assumed to have Darcy flow, no gravity effects, isotropic properties, fluid has small consistent compressibility and no geomechanical effects.

45. The non-transitory computer readable medium as recited in claim 27, further comprising the step of characterizing a carbonate reservoir using the performance data.

46. The non-transitory computer readable medium as recited in claim 27, the performance data comprising one or more geomechanical effects.

47. The non-transitory computer readable medium as recited in claim 27, the performance data comprising a reservoir drainage volume, a reservoir pressure, a reservoir fluid flow rate, a well pressure, a well flow rate or a combination thereof.

48. The non-transitory computer readable medium as recited in claim 27, the performance data comprising a bottom hole flowing pressure for each well in the hydrocarbon reservoir during a draw-down, and a well rate as a function of the bottom hole flowing pressure during a routine production.

49. The non-transitory computer readable medium as recited in claim 27, further comprising the steps of:

assessing, calibrating or optimizing a multi-stage fracture design of the hydrocarbon reservoir based the performance data using the processor; and providing the assessed, calibrated or optimized multi-stage fracture design to the output device.

50. The non-transitory computer readable medium as recited in claim 27, further comprising the steps of:

optimizing a spacing and a timing of two or more wells within the hydrocarbon reservoir based on the performance data using the processor; and providing the optimized spacing and the optimized timing of the two or more wells within the reservoir to the output device.

51. The non-transitory computer readable medium as recited in claim 27, further comprising the steps of:

ranking, or calibrating, or uncertainty assessment the models of the hydrocarbon reservoir against a field performance data of the hydrocarbon reservoir based the performance data using the processor; and providing the ranked or calibrated model of the hydrocarbon reservoir to the output device.

52. An apparatus for determining a performance data for a hydrocarbon reservoir comprising:

a data storage;

an output device; and one or more processors communicably coupled to the data storage and the output device, the one or more processors:

obtain a heterogeneous multi-dimensional model of at least a portion of the hydrocarbon reservoir divided into cells, each cell having a volume and one or more other attributes;

calculate a diffusive time of flight based upon the heterogeneous multi-dimensional model;

transform the heterogeneous multi-dimensional model to an equivalent homogeneous one-dimensional model by defining the diffusive time of flight as a spatial variable;

determine the performance data for the hydrocarbon reservoir based on the equivalent homogeneous one-dimensional model; and provide the performance data to the output device.

53. The apparatus as recited in claim 52, the processor calculates the diffusive time of flight based upon the heterogeneous multi-dimensional model by solving an Eikonal equation.

54. The apparatus as recited in claim 52, the processor calculates the diffusive time of flight based upon the heterogeneous multi-dimensional model including a corner point grid geometry effect(s) and a permeability anisotropy effect(s).

55. The apparatus as recited in claim 52, the processor calculates the diffusive time of flight based upon the heterogeneous multi-dimensional model using the steps comprising:
    interpolating a velocity field throughout the heterogeneous multi-dimensional model;
    constructing one or more streamline trajectories within the heterogeneous multi-dimensional model based on the velocity field; and
    calculating the diffusive time of flight along each streamline trajectory.

56. The apparatus as recited in claim 52, the processor calculates the diffusive time of flight based upon the heterogeneous multi-dimensional model using a shortest path algorithm.

57. The apparatus as recited in claim 56, the shortest path algorithm comprising a Dijkstra's algorithm.

58. The apparatus as recited in claim 52, the processor calculates the diffusive time of flight based upon the heterogeneous multi-dimensional model using a Fast Marching Method.

59. The apparatus as recited in claim 52, the processor calculates the diffusive time of flight based upon the heterogeneous multi-dimensional model using the steps comprising:
    the heterogeneous multi-dimensional model comprises a first heterogeneous multi-dimensional model for a first medium within the hydrocarbon reservoir, and one or more additional heterogeneous multi-dimensional models for one or more additional mediums within the hydrocarbon reservoir;
    calculating a first diffusive time of flight based upon the first heterogeneous multi-dimensional model by using a Fast Marching Method;
    calculating one or more additional diffusive time of flight(s) based upon the one or more additional heterogeneous multi-dimensional model(s) by using the Fast Marching Method; and
    coupling the first diffusive time of flight with the one or more additional diffusive time of flight(s) using a Dijkstra's algorithm.

60. The apparatus as recited in claim 52, each cell comprising a polygon having five or more sides and further comprising the step of refining each polygon into a triangle or a quadrilateral using a sub-cell refinement method.

61. The apparatus as recited in claim 52, the processor transforms the multi-dimensional model to the equivalent one-dimensional model by defining the diffusive time of flight as the spatial variable using the steps comprising:
    defining an Eikonal equation obtained from an asymptotic solution to a pressure diffusivity equation;
    solving the defined Eikonal equation; and
    transforming the pressure diffusivity equation into an equivalent one-dimensional form based on the diffusive time of flight as the spatial variable.

62. The apparatus as recited in claim 61, the defined one dimensional diffusivity equation comprising:

$$\frac{\partial}{\partial \tau}\left(w(\tau)\frac{\partial P}{\partial \tau}\right) = w(\tau)\frac{\partial P}{\partial t}$$

where: $w(\tau) = \iint \phi J(\tau, \psi, \chi) d\psi d\chi$
    $\tau$ is the diffusive time of flight,
    P is a pressure,
    t is a time,
    $\phi$ is a porosity of the hydrocarbon reservoir,
    J is a Jacobian of a coordinate transformation, and
    $\psi$ and $\chi$ are defined on the contour surfaces of $\tau$ and are orthogonal to each other and to $\tau$.

63. The apparatus as recited in claim 62, the hydrocarbon reservoir is slightly compressible and $$w(\tau) = \frac{dV_p(\tau)}{d\tau}$$

with a wellbore flow rate boundary condition of $$\left(w(\tau)\frac{\partial P}{\partial \tau}\right)_{\tau=\tau_w} = \frac{q_w}{c_t},$$

an outer flow rate bouondary condition of $$\left(w(\tau)\frac{\partial P}{\partial \tau}\right)_{\tau=\tau_e} = \frac{q_e}{c_t},$$

a wellbore pressure boundary condition of $P|_{\tau=\tau_w}=P_{wf}$ and an outer pressure boundary condition of $P|_{\tau=\tau_e}=P_e$ where $\tau_w$ is a lower bound corresponding with a wellbore radius, $\tau_e$ is an upper bound corresponding with a boundary of the hydrocarbon reservoir, q is a down-hole flow rate, and $c_t$ is a total compressibility.

64. The apparatus as recited in claim 61, the hydrocarbon reservoir is compressible and the defined one dimensional diffusivity equation comprises:

$$\frac{\partial}{\partial \tau}\left(w(\tau)\frac{P}{\tilde{\mu}(P)Z(P)}\frac{\partial P}{\partial \tau}\right) = w(\tau)\tilde{c}_t(P)\frac{P}{Z(P)}\frac{\partial P}{\partial t}$$

where: $w(\tau) = \iint \phi J(\tau, \psi, \chi) d\psi d\chi$
    $\tau$ is the diffusive time of flight,
    P is a pressure, $$\tilde{\mu}(P) = \frac{\mu(P)}{\mu_i},$$

$\mu$ is a fluid viscosity, $$\tilde{c}(P) = \frac{c_t(P)}{c_{ti}},$$

c is a fluid compressibility,
Z is a compressibility factor,
t is a time,
$\phi$ is a porosity of the hydrocarbon reservoir,
J is a Jacobian of a coordinate transformation, and
$\psi$ and $\chi$ are defined on the contour surfaces of $\tau$ and are orthogonal to each other and to $\tau$.

65. The apparatus as recited in claim 52, the heterogeneous multi-dimensional model comprising a 2D model, a 2.5D model or a 3D model, and each cell comprises a triangle, a quadrilateral, or a polygon having five or more sides.

66. The apparatus as recited in claim 52, the heterogeneous multi-dimensional model comprising a dual porosity model with either single permeability or dual permeability.

67. The apparatus as recited in claim 52, the homogeneous one-dimensional model further includes one or more additional physics relating to the hydrocarbon reservoir.

68. The apparatus as recited in claim 67, the one or more additional physics comprising a slightly compressible flow, a compressible flow, a gas adsorption, a geomechanical or compaction effect, a dual porosity or permeability, a multi-phase flow, an adsorption/Knudsen diffusion, a non-Darcy effect, a compositional flows/anomalous phase behavior, or a combination thereof.

69. The apparatus as recited in claim 52, the hydrocarbon reservoir is assumed to have Darcy flow, no gravity effects, isotropic properties, fluid has small consistent compressibility and no geomechanical effects.

70. The apparatus as recited in claim 52, the processor further characterizes a carbonate reservoir using the performance data.

71. The apparatus as recited in claim 52, the performance data comprises one or more geomechanical effects.

72. The apparatus as recited in claim 52, the performance data comprises a reservoir drainage volume, a reservoir pressure, a reservoir fluid flow rate, a well pressure, a well flow rate or a combination thereof.

73. The apparatus as recited in claim 52, the performance data comprises a bottom hole flowing pressure for each well in the hydrocarbon reservoir during a draw-down, and a well rate as a function of the bottom hole flowing pressure during a routine production.

74. The apparatus as recited in claim 52, the processor further:
assesses, calibrates or optimizes a multi-stage fracture design of the hydrocarbon reservoir based the performance data using the processor; and
provides the assessed, calibrated or optimized multi-stage fracture design to the output device.

75. The apparatus as recited in claim 52, the processor further:
optimizes a spacing and a timing of two or more wells within the hydrocarbon reservoir based on the performance data using the processor; and
provides the optimized spacing and the optimized timing of the two or more wells within the reservoir to the output device.

76. The apparatus as recited in claim 52, the processor further:
assesses an uncertainty, ranks or calibrates the models of the hydrocarbon reservoir against a field performance data of the hydrocarbon reservoir based the performance data using the processor; and
provides the assessed uncertainty, ranked or calibrated model of the hydrocarbon reservoir to the output device.

77. The apparatus as recited in claim 52, wherein:
the data storage comprises a memory, a fixed data storage device, a removable storage device, or a combination thereof and
the output device comprises a display, a printer, a communications interface, the data storage, a removable data storage device, or a combination thereof.

\* \* \* \* \*